United States Patent
Yamamoto

(10) Patent No.: US 6,437,441 B1
(45) Date of Patent: Aug. 20, 2002

(54) WIRING STRUCTURE OF A SEMICONDUCTOR INTEGRATED CIRCUIT AND A METHOD OF FORMING THE WIRING STRUCTURE

(75) Inventor: Hiroshi Yamamoto, Tokyo (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 09/113,279

(22) Filed: Jul. 10, 1998

(30) Foreign Application Priority Data

Jul. 10, 1997 (JP) .............................. 9-184888

(51) Int. Cl.[7] .............................. H01L 23/48

(52) U.S. Cl. .................. 257/758; 257/262; 257/365; 438/622; 438/687

(58) Field of Search ................ 257/758, 762, 257/765; 438/622, 687, 688

(56) References Cited

U.S. PATENT DOCUMENTS

| | | | |
|---|---|---|---|
| 4,511,914 A | | 4/1985 | Remedi et al. |
| 5,040,144 A | | 8/1991 | Pelley et al. |
| 5,091,339 A | * | 2/1992 | Carey .......................... 216/18 |
| 5,391,921 A | * | 2/1995 | Kudoh et al. ................ 257/758 |
| 5,429,995 A | * | 7/1995 | Nishiyama et al. ........... 438/788 |
| 5,461,003 A | * | 10/1995 | Havemann et al. .......... 438/666 |
| 5,476,817 A | * | 12/1995 | Numata ....................... 438/619 |
| 5,488,015 A | | 1/1996 | Havemann et al. |
| 5,510,293 A | * | 4/1996 | Numata ....................... 438/622 |
| 5,523,615 A | * | 6/1996 | Cho et al. .................... 257/632 |

(List continued on next page.)

FOREIGN PATENT DOCUMENTS

EP 0872887 * 10/1998 ........... H01L/23/48

OTHER PUBLICATIONS

P. Singer, Senior Editor, "New Interconnect Materials: Chasing the Promise of Faster Chips," Semiconductor International, Nov. 1994, pp. 52–56.

K. Endo et al., "Effect of Bias Addition on the Gap–Filling Properties of Fluorinated Amorphous Carbon Thin Films Grown by Helicon Wave Plasma–Enhanced Chemical Vapor Deposition," Jpn. J. Appl. Phys. vol. 35 (1996), pp. L1348–L1350.

"Process engineers worry about existence of fluorine," Semiconductor World 1996, pp. 82–85.

G.A. Dixit et al., "Ion Metal Plasma (IMP) Deposited Titanium Liners for 0.25/0.18 $\mu$m Multilevel Interconnections," IEDM, 1996, pp. 357–360.

K. Banerjee et al., "The Effect of Interconnect Scaling and Low–k Dielectric on the Thermal Characteristics of the IC Metal," IEDM, 1996, pp. 65–68.

G.A. Sai–Halasz, "Performance Trends in High–End Processors," Proceedings of the IEEE, vol. 83, No. 1, Jan. 1995, pp. 20–36.

(List continued on next page.)

*Primary Examiner*—Olik Chaudhuri
*Assistant Examiner*—Nathan W. Ha
(74) *Attorney, Agent, or Firm*—Oliff & Berridge, PLC

(57) ABSTRACT

A wiring structure for effectively reducing wiring capacitance, and a method of forming the wiring structure is disclosed. An underlying film having a dielectric constant lower than that of silicon oxide is formed on at least side surfaces of the wires of a wiring layer and a low dielectric constant film having an even lower dielectric constant is formed between the wires. Further, the surfaces of the underlying film are positively sloped. Because the low dielectric constants of the underlying film and the low dielectric constant film, wiring capacitance is effectively reduced. Further, the positively sloped surfaces facilitate the filling of narrow spaces between the wires by the low dielectric constant film.

12 Claims, 28 Drawing Sheets

U.S. PATENT DOCUMENTS

| | | | | |
|---|---|---|---|---|
| 5,559,055 A | * | 9/1996 | Chang et al. | 438/586 |
| 5,646,440 A | | 7/1997 | Hasegawa | |
| 5,668,398 A | * | 9/1997 | Havemann et al. | 257/522 |
| 5,675,187 A | * | 10/1997 | Numata et al. | 257/758 |
| 5,708,303 A | * | 1/1998 | Jeng | 257/758 |
| 5,750,415 A | * | 5/1998 | Gnade et al. | 438/618 |
| 5,753,967 A | * | 5/1998 | Lin | 257/635 |
| 5,807,607 A | * | 9/1998 | Smith et al. | 427/96 |
| 5,814,888 A | * | 9/1998 | Nishioka et al. | 257/758 |
| 5,858,869 A | * | 1/1999 | Chen et al. | 438/597 |
| 5,950,102 A | * | 9/1999 | Lee | 438/619 |
| 5,968,333 A | * | 10/1999 | Nogami et al. | 205/184 |
| 5,969,422 A | * | 10/1999 | Ting et al. | 257/762 |
| 6,005,291 A | * | 12/1999 | Koyanagi et al. | 257/751 |
| 6,022,802 A | * | 2/2000 | Jang | 438/656 |
| 6,034,420 A | * | 3/2000 | Tran | 257/644 |
| 6,048,802 A | * | 4/2000 | Avanzino et al. | 438/763 |
| 6,051,491 A | * | 4/2000 | Ito | 438/619 |
| 6,096,648 A | * | 8/2000 | Lopatin et al. | 438/687 |
| 6,097,096 A | * | 8/2000 | Gardner et al. | 257/777 |

OTHER PUBLICATIONS

N. Shoda et al., "Water Absorption Study of High Density Plasma CVD Oxide Films," $2^{nd}$ International Dielectrics for ULSI Multilevel Interconnection Conference (1996) pp. 13–20.

Y. Hayashi et al., "A new Two–step Metal–CMP Technique for a High Performance Multilevel Interconnects Featured by Al–and 'Cu in Low ϵ, Oraganic Film'–Metallizations," 1996 Symposium on VLSI Technology Digest of Technical Papers, pp. 88–89.

M. Miyamoto et al., "High–Speed and Low–Power Interconnect Technology for Sub–Quarter–Micron ASIC's," IEEE Transactions on Electron Devices, vol. 44, No. 2, Feb. 1997, pp. 250–256.

L. Gwennap, "IC Makers Confront RC Limitations," Microprocessor Report, Aug. 4, 1997, pp. 14–18.

M. T. Bohr, Interconnect Scaling—The Real Limiter to High Performance ULSI, IEEE International Electrons Devices Meeting Digest of Technical Papers (1995) p. 241.

J. Paraszczak et al., High Performance dielectrics and processes for ULSI interconnection technologies, IEEE International Electrons Devices Meeting Digest of Technical Papers (1993) p. 261.

H. Miyajima et al., Formation Mechanism of F–added $SiO_2$ Films using Plasma CVD, Proceedings of Symposium on Dry Process, (1994), p. 133.

R. Katsumata et al., Improvement in Hygroscopicity of PE–CVD F–doped $SiO_2$, Proceedings of Symposium on Dry Process, (1995), p. 269.

B. T. Ahlburn et al., Hydrogen Silsesquioxane–Based Flowable Oxide as an Element In The Interlevel Dielectric For Sub 0.5 Micron USLI Circuits, Proceedings of the $1^{st}$ International Dielectrics for ULSI Multi–level Interconnection Conference (1995) p. 36.

K. Numata et al., Material Characterization of Methyl Siloxane Sogs: Materials Research Society Symposium Proceedings, vol. 381 (1995) p. 255.

C. H. Ting et al., Methods and Needs for Low K Material Research, Materials Research Society Proceedings, vol. 381 (1995) p. 3 C.

Lang et al., Vapor Deposition of Very Low K Polymer Films, Poly(Naphthalene), Poly(Fluorinated Naphthalene), Materials Research Society Proceedings, vol. 381 (1995) p. 45.

M. Mills et al., Benzocyclobutene (BCB) Polymer as an Interlayer Dielectric (ILD) Material, $1^{st}$ International Dielectrics for ULSI Multilevel Interconnection Conference (1995) p. 269.

S. P. Jeng et al., Process Integration of Low–Dielectric–Constant Materials, Materials Research Society Symposium Proceedings, vol. 381 (1995) p. 197.

B. C. Auman, Fluorinated Polyimides With Low Dielectric Constant, Low Moisture Absorption, and Low Coefficient of Thermal Expansion for Use as Interlayer Dielectrics, $1^{st}$ International Dielectrics for ULSI Multilevel Interconnection Conference (1995) p. 297.

N. H. Hendricks et al., Fluorinated Poly(Arylethers): Low Dielectric Constant, Thermally Stable Polymers for Sub–Half Micron IMD Applications, $1^{st}$ International Dielectrics for ULSI Multilevel Interconnection Conference (1995) p. 283.

K. R. Carter et al., Polyimide Nanofoams for Low Dielectric Applications, Materials Research Society Symposium Proceedings, vol. 1.381 (1995) p. 79.

M. B. Anand et al., NURA: A Feasible, Gas–Dielectric Interconnect Process, Symposium on VLSI Technology Digest of Technical Papers (1996) p. 82.

J. T. Wetzel et al., Integration of BDPA–PDA Polyimide With Two Levels of Al (Cu) Interconnects, Materials Research Society Symposium Proceedings vol. 381 (1995) p. 217.

Y. Homma et al., Using Selective CMP with Low Permittivity Organic SOG to Achieve Low Capacitance Multilevel Interconnection, Proceedings of the $12^{th}$ International Conference (1995) p. 457.

S. P. Jeng et al., Process Integration and Manufacturability Issues for High Performance Multilevel Interconnect, Materials Research Society Symposium Proceedings, vol. 337 (1994) p. 25.

J. M. Neirynck et al., Investigations of the Chemical–Mechanical Polishing of Polymer Films for ILD Applications, Materials Research Society Symposium Proceedings, vol. 381 (1995) p. 229.

Ito et al., Application of Surface Reformed Thick Spin–on–Glass to MOS Device Planarization, Journal of the Electrochemical Society, vol. 137 (1990) p. 1212.

K. Ueno et al., A Half–Micron Pitch Cu Interconnection Technology, Symposium on VLSI Technology Digest of Technical Papers (1995) p. 27.

T. Uehara et al., A Novel Local Interconnect Technology (MSD) for High–Performance Logic LSIs with Embedded SRAM, Symposium n VLSI Technology Digest of Technical Papers (1996) p. 142.

K. Furumochi et al., A 500MHz 288kb CMOS SRAM Macro for On–Chip Cache, International Solid State Circuits Conference Digest of Technical Papers (1996) p. 156.

* cited by examiner

WIRING STRUCTURE OF A SEMICONDUCTOR INTEGRATED CIRCUIT AND A METHOD OF FORMING THE WIRING STRUCTURE

BACKGROUND OF THE INVENTION

1. Field of Invention

This invention relates to a wiring structure for use in a semiconductor integrated circuit in which wiring capacitance is effectively reduced and operational speed is improved and a method of forming the wiring structure. This invention also relates to a semiconductor integrated circuit in which the advantages of a low resistance wiring are fully utilized while production and development costs are minimized.

2. Description of Related Art

Historically, in a semiconductor integrated circuit, as the design parameters or minimum feature sizes have been reduced by improved fabrication technologies, both the number of elements which can be integrated in a semiconductor chip and the operational speed have been improved. The main reason for improved operational speed is that the switching speed of transistors has been improved as the dimensions i.e., the gate length in the case of a MOS transistor, have been reduced.

However, if the design rule, usually expressed by the minimum gate length of a transistor, becomes less than about 0.5 $\mu$m, the size reduction of this feature does not always ensure improved operational speed. The main reason for this is that signal propagation time over long distance wiring between circuit blocks within an integrated circuit chip tends to increase as the feature size decreases.

In other words, the resistance per unit length increases as the feature size decreases because of the decrease in the cross-sectional area of the wiring. In addition, the capacitance per unit length also increases as the feature size decreases because the space between wires is reduced while the height of the wires is kept almost constant. Also, the dimensions of the chip tends to increase as the design rule decreases because the number of transistors integrated onto the chip increases more rapidly compared to the decrease in the size of the transistor. Therefore, the average wiring length between the circuit blocks tends to increase as the design rule decreases. Accordingly, as feature size decreases the resistance of the wire and the capacitance between the wires increases, and the signal propagation time over the wiring between circuit blocks, which is roughly determined by the product of the resistance and the capacitance, tends to increase. Therefore, in order to improve the operational speed of a semiconductor integrated circuit, in particular, in a semiconductor integrated circuit with a design size of 0.5 $\mu$m or less, the resistance of the wire and the capacitance between the wires needs to be reduced.

Conventionally, wiring mainly formed of aluminum or aluminum alloys (hereafter "aluminum-based wiring") was used for metal wiring in semiconductor integrated circuits. Silicon oxide formed by chemical vapor deposition (CVD) is generally used as a dielectric layer for the insulation between wires in the same wiring layer and for the insulation between upper and lower wiring layers. Pure silicon oxide has a dielectric constant of 3.9, while silicon oxide formed by CVD generally has a dielectric constant of approximately 4.0–4.4. The dielectric layer for the insulation between wiring layers is referred to as the "interlayer dielectric layer", while the dielectric layer for the insulation between wires in the same wiring layer is referred to as the "intralayer dielectric layer", when it is necessary to distinguish between these two dielectric layers. However, these dielectric layers are usually formed integrally, and are usually collectively referred to as the "interlayer dielectric layer".

In order to reduce wiring capacitance, use of insulating materials having lower dielectric constants than that of silicon oxide has been considered. At the same time, in order to reduce the wiring resistance, use of wiring mainly formed of metals having resistivities lower than that of aluminum, such as silver, copper and gold has been considered. Among them, wiring mainly formed of copper or copper alloy (hereafter "copper-based wiring") has been widely investigated.

Aluminum-based wiring is usually formed by depositing a metal film on the entire surface of an insulating layer followed by selectively etching unnecessary portions of the metal film (hereafter "etching method"). In contrast, formation of copper-based wiring by forming grooves in a dielectric layer, followed by forming a copper or copper alloy film within the grooves, (hereafter "damascene method") has been examined. (M. T. Bohr, IEEE International Electrons Devices Meeting Digest of Technical Papers (1995) p. 241, J. Paraszczak et al., IEEE International Electrons Devices Meeting Digest of Technical Papers (1993) p. 261).

The materials described below have been examined because they have lower dielectric constants than silicon oxide.

1) Fluorinated Silicon Oxide

A technology has been developed in which a fluorinated silicon oxide film is formed by CVD using an atmosphere in which a fluorine compound gas is added to a conventional silicon oxide CVD atmosphere. The dielectric constant of the fluorinated silicon oxide film is about 3.0–3.7, and it can be decreased by increasing the amount of added fluorine. In practice, however, the dielectric constant can be lowered only to about 3.3, since the film becomes hygroscopic if the amount of added fluorine is increased too much (H. Miyajima et al., Proceedings of Symposium on Dry Process, (1994), p. 133, R. Katsumata et al., Proceedings of Symposium on Dry Process, (1995), p. 269).

2) Siloxane SOG

For lower dielectric constant materials, various siloxane SOG (spin-on-glass) materials have been examined. In this technology, a coating solution which includes siloxane oligomers is coated on a substrate and cured to form a SOG film. The siloxane oligomer includes Si—O and Si—R (R=H, $CH_3$, $C_6H_5$ etc.) bonds. The dielectric constant of the SOG film is about 2.8–3.3. For example, hydrogen silsesquioxane SOG (B. T. Ahlbum et al., Proceedings of the $1^{st}$ International Dielectrics for ULSI Multi-level Interconnection Conference (1995) p. 36) and methyl-siloxane SOG (K. Numata et al., Materials Research Society Symposium Proceedings, Vol. 381 (1995) p. 255) have been widely examined.

3) Organic Material

Organic materials, such as: polyimides, including BPDA-PDA, fluorinated polyimide, polyimide siloxane, fluorinated resin/siloxane copolymer, benzocyclobutene, parylene-F, poly(fluorinated naphthalane), amorphous Teflon™, fluorinated poly(arylethers), cyclo-perfluorocarbon polymer, and fluorinated amorphous carbon have been examined as low dielectric constant materials. Many of these materials are formed by a coating method, such as spin coating. However, some of these materials, e.g., fluorinated amorphous carbon, are formed by CVD. See, for example, C. H. Ting et al., Materials Research Society Proceedings, Val. 381 (1995) p. 3 C.-1, Lang et al., Materials Research Society Proceedings, Val. 381 (1995) p. 45, M. Mills et al., 1$^{st}$ International Dielectrics for ULSI Multilevel Interconnection Conference (1995) p. 269, S.-P. Jeng et al., Materials Research Society Symposium proceedings, Val. 381 (1995) p. 197, B. C. Auman, 1$^{st}$ International Dielectrics for ULSI Multilevel Interconnection Conference (1995) p. 297, N. H. Hendricks et al., 1$^{st}$ International Dielectrics for ULSI Multilevel Interconnection Conference (1995) p. 283, K. Endo et al., Japanese Journal of Applied Physics, Vol. 35 (1996) p. 1348.

4) Porous Material

It is possible to decrease the dielectric constant by decreasing the density of the dielectric film. As an extreme example, a dielectric constant of 1 can be obtained by providing a vacuum or an inert gas between wires. One method of decreasing the density is to form pores in the dielectric film. For example, an organic porous material (K. R. Carter et al., Materials Research Society Symposium Proceedings. Vol 1. 381 (1995) p. 79) or an inorganic porous material, such as a gel type silica (U.S. Pat. No. 5,488,015), have been investigated. The later material is often referred to as Xerogel™ or nano-porous silica. A dielectric constant of about 2.0 or below is reported. Another method is to remove a dielectric material which has been filled between the wires, after the wires and the dielectric material are formed. For example, a method in which a carbon material formed between wires is removed by heating in oxygen is reported in M. B. Anand et al. Symposium on VLSI Technology Digest of Technical Papers (1996) p. 82.

Among the above-mentioned materials described in the categories 1)–4), the fluorine silicone oxide of category 1) has a lower limit dielectric constant of about 3.3. Therefore, there is a limit in the ability to reduce the wiring capacitance. Accordingly, in order to reduce the capacitance more effectively, further investigation of the materials categorized above as 2), 3) and 4) are being pursued. Hereafter, when a material is simply called a "low dielectric constant material," it means abovedescribed materials except for the material of 1) category, and also means other materials developed in the future having a dielectric constant of around 3.0 or below.

Although the materials mentioned above which have low dielectric constants have been extensively investigated, these materials are difficult to utilize in semiconductor integrated circuits. First, these materials generally have a lower heat resistance than silicon oxide, and are susceptible to deformation or decomposition by heat processing during the manufacturing process. Second, films of these materials generally do not adhere onto the underlying metal film, or vise versa. Third, some of these materials contain relatively large amount of water. Even if the material does not initially contain a significant amount of water, the material may deform during heat processing and become hygroscopic, thus adsorbing water during the subsequent processing steps. This contained or adsorbed water may be desorbed during the subsequent heat processing, and the desorbed water may cause various problems such as degradation of adhesion and metal corrosion. Fourth, the above-mentioned materials generally have lower mechanical strengths compared to silicon oxide. Therefore, formation of hillocks on the surface of the underlying metal film cannot be prevented.

Fifth, it is generally difficult to form via holes through which the lower wiring layer and the upper wiring layer are connected to each other in films of these materials. In the case of the conventional silicon oxide film, via holes can be formed by aisotropical plasma etching in a fluorine-based gas atmosphere using a resist as a mask followed by removing the resist mask by ashing, i.e., oxidation by active oxygen or oxygen containing species created by plasma excitation or other methods. This method cannot generally be utilized for films formed of the materials described above because the etching characteristics of many of these materials is similar to that of the resist. Therefore, a mask made of silicon oxide, silicon nitride or another inorganic material film, instead of a resist mask, is often used to form via holes in the film of a low dielectric constant material. A mask made of an inorganic material film is often referred to as a hard mask.

Even when a hard mask is utilized, a resist mask is used to form apertures in the hard mask. During removal of the resist mask used to form apertures in the hard mask, portions of the film at the apertures are exposed to the ashing atmosphere. Many of the materials with low dielectric constants tend to be easily oxidized by active oxygen in the ashing atmosphere. The oxidation makes the material hygroscopic. Therefore, conditions for removal of the resist mask should be carefully chosen to suppress oxidation of the material. Some of the materials with low dielectric constants can be etched using the resist mask. Even in these cases, the conditions for removal of the resist mask should be carefully chosen to suppress oxidation of the surface of the material exposed at the side walls of the via holes.

And sixth, the materials described above generally have low thermal conductivity compared to silicon oxide. Due to the low thermal conductivity, the joule heat produced in the wiring cannot be effectively dissipated and the wiring may thermally breakdown under high pulsed current stress.

Furthermore, even if the materials described above having lower dielectric constants are used, the wiring capacitance is not always reduced effectively. That is, an effective dielectric constant, i.e., a dielectric constant calculated from an actual capacitance value and dimensions of the wiring, does not always result in a reduced dielectric constant for the material. For example, FIG. 1 shows wires 218$a$, 218$b$ and 218$c$ of a wiring layer 218 which are disposed on the surface of an underlying dielectric layer 212 which is formed with a silicon oxide film deposited on a semiconductor substrate 210. In this case, even though an interlayer dielectric layer 220 of a material having a lower dielectric constant is formed between and on the wires, the electric field between the wires is not confined within the interlayer dielectric layer 220. Rather, the electric field spreads into the underlying dielectric layer 212, which is disposed immediately under the wiring layer. Therefore, since the underlying dielectric layer 212 is formed with a conventional silicon oxide film, the effective dielectric constant between the wires is not reduced to the dielectric constant of the material used to form the interlayer dielectric layer 220. This phenomenon is described in U.S. Pat. No. 5,646,440.

In order to overcome at least some of the difficulties described above for materials having low dielectric constants, these materials are often used in combination with other insulating films, such as silicon oxide, silicon oxynitride, silicon nitride, or the like. For example, to improve adhesion with an underlying wiring layer and to suppress hillock formation on the surface of the underlying metal film, an underlying silicon oxide film is first formed by CVD on the underlying wiring layer and then a low dielectric constant film is formed (J. T. Wetzel et al., Materials Research Society Symposium proceedings Val. 381 (1995) P. 217,Y. Homma et al., Proceedings of the 12$^{st}$ International Conference on VLSI Multilevel Interconnection Conference (1995) p. 457). This underlying film is also referred to as a liner film. Also, to improve adhesion of an upper wiring layer formed on an interlayer dielectric layer and to prevent corrosion of the upper wiring layer by water contained in the low dielectric constant film, an overlying film is formed on the low dielectric constant film. This overlying film is also referred to as a cap film. The cap film may also used as the hard mask to form via holes in the interlayer dielectric layer.

However, the silicon oxide film deposited by CVD has a dielectric constant of about 4.0 to 4.4. The silicon oxynitride or silicon nitride film has an even higher dielectric constant. Therefore, used of the underlying and/or overlying film has an adverse effect on the ability to reduce wiring capacitance.

In addition, if the underlying film or the overlying film is deposited on a vertical surface by a conventional method such as plasma CVD, the surface of the deposited film tends to overhang. For example, as shown in FIG. 2, if an underlying film 216 is deposited by a plasma CVD on a substrate having a wiring layer 218 including wires 218a, 218b and 218c with vertical side surfaces, the surfaces of the deposited underlying film 216 overhang on the side surfaces of the wires. The overhang of the underlying film 216 makes the following processes difficult. For example, if a low dielectric constant film 228 is formed on the substrate with this underlying film, voids 229 are formed between the wires. The voids 229 cause cracks in the interlayer dielectric layer 220. Further, the capacitance between the wires varies due to variation of the shape of the voids.

To overcome the difficulty of forming via holes in a low dielectric constant film, a structure has been proposed in which a conventional CVD dielectric film is used for the insulation between adjacent wiring layers, and the low dielectric constant material is used only for the insulation between wires in the same wiring layer (S. P. Jeng et al., Materials Research Society Symposium Proceedings, Vol. 337 (1994) p. 25). However, in this case, the electric field between the wires spreads into the conventional CVD dielectric film having a relatively high dielectric constant formed on the wiring layer. Therefore, the capacitance between the wires is even higher than the example shown in FIG. 1.

Forming a thermoconductive insulating layer, for example, a silicon nitride layer or an aluminum nitride layer, directly contacting the wires of a wiring layer to facilitate heat dissipation has been described in U.S. Pat. No. 5,476,817. However, silicon nitride and aluminum nitride have even higher dielectric constant than silicon oxide. Therefore, in this case, since the electric field between the wiring significantly spreads into the thermoconductive insulating layer having a higher dielectric constant, the capacitance between the wiring becomes even higher.

The previously mentioned U.S. Pat. No. 5,646,440 proposes a structure to effectively reduce the capacitance between the wires by making the thickness of a low dielectric constant film between the wires greater than the height of the wires. However, the proposed structure also uses an underlying film of silicon oxide, silicon oxynitride or silicon nitride. Therefore, the problems described above related to the underlying film are not overcome.

With respect to the wiring, it has been suggested that aluminum-based wiring be completely replaced by copper-based wiring. However, various problems related to the copper-based wiring must be resolved in order to cost effectively produce semiconductor integrated circuits which utilize copper-based wiring. A practical and economically feasible way to implement copper-based wiring in various semiconductor integrated circuit products has not been proposed.

SUMMARY OF THE INVENTION

In view of the aforementioned problems in the conventional systems, an object of the invention is to provide a wiring structure which effectively reduces the capacitance between wiring as well as a method of forming the wiring structure.

Another object of the invention is to provide a practical way to implement low resistance wiring, such as copper-based wiring, in semiconductor integrated circuit products so that the advantages of the low resistance wiring are fully utilized while the difficulties related to low resistance wiring are effectively overcome.

According to one aspect of the invention, a wiring structure for use in a semiconductor integrated circuit is provided which includes a wiring layer with at least two adjacent wires formed on an underlying dielectric layer over a semiconductor substrate, whereby the adjacent wires are disposed from each other with a space s1; and a dielectric layer is formed on the wiring layer which includes a low dielectric constant film having a dielectric constant lower than that of silicon oxide formed at least between opposing side surfaces of the adjacent wires such that the low dielectric constant film contacts the opposing side surfaces and wherein a bottom level of the low dielectric constant film between the adjacent wires is lower than a bottom level of the adjacent wires by at least about 20% of s1.

The invention also provides a method of forming a wiring structure for use in a semiconductor integrated circuit which includes forming a wiring layer, including at least two adjacent wires on an underlying dielectric layer, over a semiconductor substrate, the adjacent wires are disposed with a space of s1; and forming a dielectric layer on the wiring layer including forming a low dielectric constant film having a dielectric constant lower than that of silicon oxide formed at least between opposing side surfaces of the adjacent wires such that the low dielectric constant film contacts the opposing side surfaces, and such that a bottom level of the low dielectric constant film between the adjacent wires is lower than a bottom level of the adjacent wires by at least about 20% of s1.

According to another aspect of the invention, a wiring structure is provided for use in a semiconductor integrated circuit which includes a wiring layer including at least two adjacent wires formed on an underlying dielectric layer formed over a semiconductor substrate; and a dielectric layer including an underlying film having a dielectric constant lower than that of silicon oxide formed at least on opposing side surfaces of the adjacent wires, and a low dielectric constant film having a dielectric constant lower than that of the underlying film formed at least between the opposing side surfaces of the adjacent wires.

The underlying film is preferably formed of fluorinated silicon oxide. The fluorinated silicon oxide may also contain substantially no Si(—F)$_2$ bonds.

In addition, a bottom level of the low dielectric constant film between the adjacent wires is lower than a bottom level of the adjacent wires.

A method of forming a wiring structure for use in a semiconductor integrated circuit is provided which includes the steps of forming a wiring layer, including at least two adjacent wires on an underlying dielectric layer, over a semiconductor substrate; and forming a dielectric layer including forming an underlying film having a dielectric constant lower than that of silicon oxide at least on opposing side surfaces of the adjacent wires, and forming a low dielectric constant film having a dielectric constant lower than that of the underlying film at least between the opposing side surfaces of the adjacent wires.

Preferably, forming the underlying film is performed by depositing a fluorinated silicon oxide film by high density plasma CVD. The high density plasma CVD may be performed so that the fluorinated silicon oxide film contains substantially no Si(—F)$_2$ bonds.

According to another aspect of the invention, a wiring structure is provided for use in a semiconductor integrated circuit which includes a wiring layer including at least two adjacent wires formed on an underlying dielectric layer formed over a semiconductor substrate; and a dielectric layer including an underlying film formed at least on opposing side surfaces of the adjacent wires and a low dielectric constant film having a dielectric constant lower than that of silicon oxide formed at least between the opposing side surfaces of the adjacent wires, wherein the opposing side surfaces of the adjacent wires are substantially vertical to a main surface of the semiconductor substrate and surfaces of the underlying film on the opposing side surfaces are positively sloped.

Preferably, substantial portions of the surfaces of the underlying film on the opposing side surfaces are positively sloped.

In addition, the underlying film is preferably formed of fluorinated silicon oxide having a dielectric constant lower than that of silicon oxide. The dielectric constant of the low dielectric constant film is lower than that of the underlying film. The fluorinated silicon oxide may include substantially no Si(—F)$_2$ bonds.

Preferably, the bottom level of the low dielectric constant film is lower than that of the adjacent wires.

The invention also provides a method of forming a wiring structure for use in a semiconductor integrated circuit which includes the steps of forming a wiring layer, including at least two adjacent wires on an underlying dielectric layer, over a semiconductor substrate; and forming a dielectric layer including forming an underlying film at least on opposing side surfaces of the adjacent wires, and forming a low dielectric constant film having a dielectric constant lower than that of silicon oxide at least between the opposing side surfaces of the adjacent wires, wherein the opposing side surfaces of the adjacent wires are substantially vertical to a main surface of the semiconductor substrate, and surfaces of the underlying film on the opposing side surfaces are positively sloped.

The forming of an underlying film is preferably performed so that substantial portions of the surfaces of the underlying film on the opposing side surfaces are positively sloped.

Also preferably, the forming an underlying film is performed by a high density plasma CVD with a substrate bias. In addition, the dielectric constant of the low dielectric constant film is preferably lower than that of the underlying film, and the forming a low dielectric constant film is performed by a second high density plasma CVD with a substrate bias.

According to another aspect of the invention, a wiring structure is provided for use in a semiconductor integrated circuit which includes a wiring layer which includes at least two adjacent wires formed on an underlying dielectric layer over a semiconductor substrate; and a dielectric layer including an underlying film formed at least on opposing side surfaces of the adjacent wires and a low dielectric constant film having a dielectric constant lower than that of silicon oxide formed at least between the adjacent wires, wherein a thickness of the underlying film on upper portions of the opposing side surfaces of the adjacent wires is smaller than that on lower portions of the opposing side surfaces.

The underlying film is preferably formed of fluorinated silicon oxide having a dielectric constant lower than that of silicon oxide, and the dielectric constant of the low dielectric constant film is lower than that of the underlying film.

A method of forming a wiring structure for use in a semiconductor integrated circuit is provided which includes the steps of forming a wiring layer, including at least two adjacent wires on an underlying dielectric layer, formed over a semiconductor substrate; and forming a dielectric layer including forming an underlying film at least on opposing side surfaces of the adjacent wires, and forming a low dielectric constant film having a dielectric constant lower than that of silicon oxide at least between the adjacent wires, wherein a thickness of the underlying film on upper portions of the opposing side surfaces of the adjacent wires is smaller than that on lower portions of the opposing side surfaces.

The forming of an underlying film is preferably performed by a high density plasma CVD with a substrate bias.

Another aspect of the invention provides a wiring structure for use in a semiconductor integrated circuit which includes an intra-layer dielectric layer, including a low dielectric constant film having a dielectric constant lower than that of silicon oxide, formed over a semiconductor substrate, the intra-layer dielectric layer having a groove formed in the low dielectric constant film; side wall films having a second dielectric constant lower than that of silicon oxide formed on side walls of the groove; and a wiring layer including a wire formed in the groove.

The dielectric constant of the low dielectric constant film is preferably lower than that of the side wall films.

Also preferably, the side walls films are formed of fluorinated silicon oxide. The fluorinated silicon oxide may include substantially no Si(—F)$_2$ bonds.

A method of forming a wiring structure for use in a semiconductor integrated circuit is also provided which includes the steps of forming an intra-layer dielectric layer including a low dielectric constant film having a dielectric constant lower than that of silicon oxide over a semiconductor substrate, the intra-layer dielectric layer having a groove formed in the low dielectric constant film; forming side wall films having a second dielectric constant lower than that of silicon oxide on side walls of the groove; and forming a wiring layer including a wire formed in the groove.

Preferably, the dielectric constant of the low dielectric constant film is lower than that of the side wall films.

Also preferably, the forming of side wall films includes depositing a fluorinated silicon oxide film by high density plasma CVD. The high density plasma CVD deposition step may be performed such that the fluorinated silicon oxide film contains substantially no Si(—F)$_2$ bonds.

According to another aspect of the invention, a wiring structure is provided for use in a semiconductor integrated circuit which includes an intra-layer dielectric layer including a low dielectric constant film having a dielectric constant lower than that of silicon oxide formed over a semiconductor substrate, the intra-layer dielectric layer having a groove formed in the low dielectric constant film; side wall films formed on side walls of the groove; and a wiring layer including a wire formed in the groove, wherein the side walls of the groove are substantially vertical with respect to a main surface of the semiconductor substrate, and surfaces of the side wall films are positively sloped.

Substantial portions of the surfaces of the side wall films are preferably positively sloped.

Also preferably, the dielectric constant of the side wall films is lower than that of silicon oxide.

In addition, the side walls films are preferably formed of fluorinated silicon oxide. The fluorinated silicon oxide may include substantially no Si(—F)$_2$ bonds.

A method of forming a wiring structure for use in a semiconductor integrated circuit is also provided which includes the steps of forming an intra-layer dielectric layer comprising a low dielectric constant film having a dielectric constant lower than that of silicon oxide over a surface of a semiconductor substrate, the intra-layer dielectric layer having a groove formed in the low dielectric constant film; forming side wall films on side walls of the groove; and forming a wiring layer including a wire in the groove, wherein the side walls of the groove are substantially vertical with respect to a main surface of the semiconductor substrate, and surfaces of the side wall films are positively sloped.

Substantial portions of the surfaces of the side wall films are preferably positively sloped.

The step of forming side wall films also preferably includes performing high density plasma CVD with a substrate bias. The step of forming a wiring layer includes forming at least one of a barrier layer and a seed layer by ionized sputtering.

The dielectric constant of the side wall films is preferably lower than that of silicon oxide.

According to another aspect of the invention, a wiring structure is provided for use in a semiconductor integrated circuit which includes an intra-layer dielectric layer including a low dielectric constant film having a dielectric constant lower than that of silicon oxide formed over a semiconductor substrate, the intra-layer dielectric layer having a groove formed in the low dielectric constant film; side wall films formed on side walls of the groove; and a wiring layer including a wire formed in the groove, wherein a thickness of the side wall films on upper portions of the side walls of the groove is smaller than that on lower portions of the side walls.

A dielectric constant of the side wall films is preferably lower than that of silicon oxide.

The side walls films are preferably formed of fluorinated silicon oxide.

A method of forming a wiring structure for use in a semiconductor integrated circuit is also provided which includes forming an intra-layer dielectric layer including a low dielectric constant film having a dielectric constant lower than that of silicon oxide over a semiconductor substrate, the intra-layer dielectric layer having a groove formed in the low dielectric constant film; forming side wall films on side walls of the groove; and forming a wiring layer including a wire in the groove, wherein a thickness of the side wall films on upper portions of the side walls of the groove is smaller than that on lower portions of the side walls.

The forming step includes the step of forming side wall films by high density plasma CVD with a substrate bias.

The dielectric constant of the side wall films is preferably lower than that of silicon oxide.

According to another aspect of the invention, a semiconductor integrated circuit is provided which includes at least one aluminum-based wiring layer disposed over a semiconductor substrate; at least one low resistance wiring layer disposed over the at least one aluminum-based wiring layer; and at least one circuit block including a plurality of transistors disposed on the semiconductor substrate connected with each other by wires in the at least one aluminum-based wiring layer, wherein wires of a selected type of wiring are formed on the at least one low resistance wiring layer.

The selected type of wiring includes a long distance signal wiring connecting the circuit block to an I/O cell or to a second circuit block.

Also, the selected type of wiring preferably includes a portion of power bus wiring commonly provided for supplying electric power to substantial portion of the integrated circuit.

In addition, the selected type of wiring may include a portion of power bus wiring provided for improving current conduction capability of a corresponding portion of the power bus wiring formed on the at least one aluminum-based wiring layer.

The at least one circuit block also preferably includes a plurality of circuit blocks, and the selected type of wiring includes a portion of clock wiring commonly provided for delivering a clock signal to the plurality of circuit blocks.

The circuit block may preferably include at least one macro cell selected from a macro cell library. Further, the macro cell library may be developed without using a low resistance wiring.

The circuit block may include at least one macro cell which has been designed and verified without using a low resistance wiring.

The low resistance wiring layer may preferably be a copper-based wiring layer.

The at least one low resistance wiring layer preferably includes at least one pair of low resistance wiring layers that are provided for forming wires in mutually orthogonal directions.

A method of forming a semiconductor integrated circuit is also provided which includes the steps of forming at least one circuit block including a plurality of transistors disposed on a semiconductor substrate connected with each other by wires on at least one aluminum-based wiring layer disposed over the semiconductor substrate; and forming wires of a selected type of wiring on at least one low resistance wiring layer disposed over the at least one aluminum-based wiring layer.

According to another aspect of the invention, a semiconductor integrated circuit is provided which includes at least one aluminum-based wiring disposed over a semiconductor substrate; at least one low resistance wiring layer disposed over the at least one aluminum-based wiring layer; and at least one macro cell which has been designed and verified without using a low resistance wiring.

The macro cell can preferably be placed into the system described above without a substantial re-design.

The connections within the macro cell are mainly made by wires on the at least one aluminum-based wiring layer, and connections outside of the macro cell are mainly made by wires on the at least one low resistance wiring layer.

The connections within the macro cell are preferably mainly made by wires on the at least one aluminum-based wiring layer, and wires of a selected type of wiring are formed on the at least one low resistance wiring layer.

A method of designing a semiconductor integrated circuit is provided which includes the steps of placing at least one macro cell which has been designed and verified without using a low resistance wiring; and making connections outside of the macro cell mainly by wires on at least one low resistance wiring layer.

The macro cell can preferably be placed without a substantial re-design.

The step of making connections preferably includes making wires of a selected type of wiring on the at least one low resistance wiring layer.

The step of making connections further includes making connections within the macro cell mainly by wires on at least one aluminum-based wiring layer.

According to another aspect of the invention, an application specific semiconductor integrated circuit of one of a first and a second grade, is provided which includes at least one macro cell selected from a macro cell library commonly provided for the first and the second grade; and at least one aluminum-based wiring layer, wherein the semiconductor integrated circuit further includes at least one low resistance wiring layer only when the grade is a preselected one.

The macro cell library is preferably developed without using a low resistance wiring.

The semiconductor integrated circuit also includes, if the grade is the preselected one, at least one second macro cell selected from a second macro cell library provide only for the preselected one of the grades.

The invention further provides a method of designing an application specific semiconductor integrated circuit of one of a first and a second grade, which includes the steps of selecting at least one macro cell from a macro cell library commonly provide for the first and the second grade; and placing the selected macro cell on the semiconductor integrated circuit, wherein the method further comprises making connections outside of the macro cell by using wires on at least one low resistance wiring layer only when the grade is a preselected one.

BRIEF DESCRIPTION OF THE DRAWINGS

The preferred embodiments of the invention will be described in detail, with reference to the following figures in which.

DETAILED DESCRIPTION OF PREFERRED EMBODIMENTS

This invention was first described in a Japanese application No. 9-184888, hereby incorporated by reference.

Hereafter, based on the embodiments that are shown in the attached drawings, the wiring structure according to the invention, and a method of forming the wiring structure according to the invention are described. Further, a semiconductor integrated circuit according to the invention is explained.

FIGS. 3A, 3B and 3C, and FIGS. 4D and 4F are cross sectional views showing formation processes for a wiring structure according to the first embodiment of the invention.

Figure 3A:
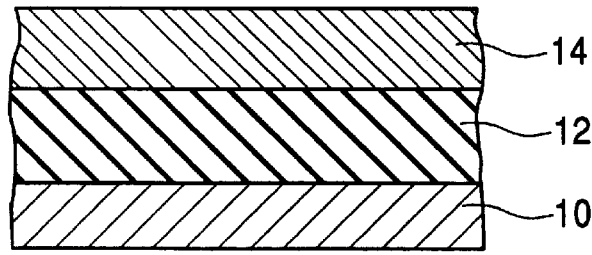
FIGS. 3A, 3B, 3C, 4D, and 4E are cross-sectional views showing the formation processes for the wiring structure according to the first embodiment of the invention.

In FIG. 3A, necessary structures for a semiconductor device, such as transistors and field oxides (not shown), are formed on the surface of a semiconductor substrate 10. An underlying dielectric layer 12 is first formed by using, for example, a silicone oxide or BPSG (borophospho silicate glass) film deposited by CVD, a silicon nitride film deposited by CVD, a SOG film, or a combination of these compounds over the surface of the semiconductor substrate 10.

The silicon oxide film and the BPSG film have dielectric constants of about 4.0–4.4. It is preferable to planarize the surface of the underlying dielectric layer by a CMP (chemical mechanical polishing) method or the like.

Next, contact holes (not shown) for connecting transistors, which are disposed on the surface of the semiconductor substrate, to wires of the first wiring layer are formed at necessary positions over the underlying dielectric layer 12. Plugs of tungsten, for example, may be formed in the contact holes, and a metal film 14 for forming wires of the first wiring layer is deposited on the surface of the resulting substrate (hereafter, the term "substrate", generally refers to a semiconductor substrate including a semiconductor substrate on which various layers and structures are formed). The metal film 14 has a laminated structure and may be formed by depositing, for example, a 10–50 nm thick titanium film, a 30–150 nm thick titanium nitride film, a 300–1000 nm thick aluminum—0.5 wt % copper alloy film, a 5–20 nm titanium film, and a 20–100 nm thick titanium nitride film, in this order. Various aluminum-containing films, including pure aluminum film and various aluminum alloy films, other than Al—0.5 wt % Cu film can be also employed.

Figure 3B:
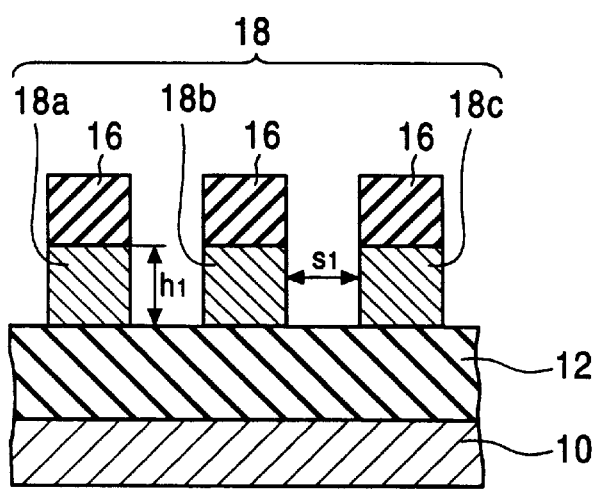

Next, as shown in FIG. 3B, a resist pattern 16 is formed using conventional photolithography technology, and the metal film 14 is patterned by an anisotropic plasma etching using a chlorine-based gas atmosphere (including, BCl$_3$, Cl$_2$ or the like), and a first wiring layer 18 including wires 18a, 18b and 18c is formed.

Various etching devices, such as for example, an ECR (electro-cyclotron resonance) plasma etching apparatus, a TCP (transformer coupled plasma) etching apparatus, or an ICP (inductive coupled plasma) etching apparatus can be utilized. It is preferable to etch under conditions such that side surfaces of the wires 18a, 18b and 18c are substantially perpendicular to a main surface of the semiconductor substrate. FIG. 3B shows a portion in which the wires of the first wiring layer 18 are densely formed with a spacing of s1 between adjacent wires. The height of the wires of this portion is h1.

Figure 3C:
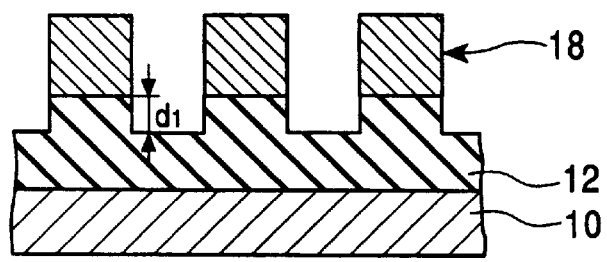

Next, as shown in FIG. 3C, the resist pattern 16 is removed by conventional etching technology. Further, surface portions of the underlying dielectric layer 12 between the wires of the first wiring layer 18 are etched to a depth of d1 by an anisotropic plasma etching using a fluorine-based gas atmosphere. It is preferable to etch under conditions such that the top titanium nitride film of the wires is not substantially etched. For the etching apparatus, a parallel-plate RIE (reactive ion etching) or an ICP etching apparatus, for example, can be preferably utilized. Further, if necessary, an additional cleaning procedure using a method such as ashing or wet cleaning is conducted.

Figure 4D:
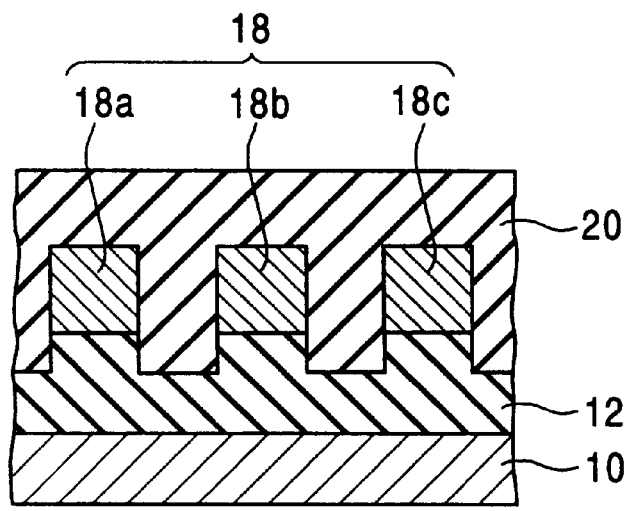

Next, as shown in FIG. 4D, a fluorinated silicon oxide film is deposited by, for example, high density plasma CVD, and the surface of the deposited film is then planarized by, for example, CMP to form a interlayer dielectric layer 20. As an example, high density plasma CVD can be performed using a helicon plasma CVD apparatus using a gas atmosphere including SiH$_4$, SiF$_4$, O$_2$ and Ar under the following conditions where (Murota et al., Monthly Semiconductor World 1996. 2, p.82):

SiF$_4$:SiH$_4$=1:1
O$_2$/(SiF$_4$+SiH$_4$)=1–2
Ar/(SiF$_4$+SiH$_4$)=1
Substrate temperature=400° C.
Helicon plasma power (13.56 MHz)=2.5 Kw
Bias power (400 kHz)=2 kW The dielectric constant of the fluorinated silicon oxide film is lower than that of pure silicon oxide. For example, it has a dielectric constant of about 3.5. Moreover, under above-mentioned conditions, the fluorinated silicon oxide film can fill narrow spaces between wires because deposition by CVD and etching by Ar sputtering proceed simultaneously.

In the wiring structure according to this embodiment, the interlayer dielectric layer 20 is formed of a fluorinated silicon oxide having a dielectric constant lower than that of silicon oxide. In addition, portions of the underlying dielectric layer 12 between the wires of the wiring layer 18 are etched to the depth of d1. Therefore, the depth of the interlayer dielectric layer 20 is lower than the depth of the wires of the wiring layer 18. Further, the fluorinated silicon oxide film fills the entire space between the wires with no underlying film. As a result, the electric field between the wires is effectively confined within the fluorinated silicon oxide film which has a low dielectric constant. Therefore, the effective dielectric constant between the wires is lowered to a value close to the dielectric constant of the fluorinated silicon oxide film itself, and the capacitance between the wires can be effectively reduced.

The capacitance can be effectively reduced especially when the depth d1 is more than about 20% larger than the space s1. For example, when the spaces s1 are 0.50, 0.35, 0.25 and 0.18 μm, the respective depths d1 are about 0.1, 0.07, 0.05 and 0.036 μm. The capacitance can be further reduced when the depth d1 is more than about 50% larger than the distance of s1. For example, when the spaces s1 are 0.50, 0.35, 0.25, 0.18 μm, the respective depths d1 are about 0.25, 0.18, 0.12 and 0.09 μm.

When the fluorinated silicon oxide film is deposited by high density plasma CVD under appropriate conditions, the film is of sufficiently high quality to allow direct contact with the wires. Specifically, Si—F bonds in the fluorinated silicon oxide film make the film hydrophobic. As a result, the water content in the fluorinated silicon oxide film is sufficiently low. However, when the fluorine content in the fluorinated silicon oxide film becomes too large, the content of Si(—F)$_2$ bonds increases and the film becomes hygroscopic. Therefore, the fluorine content in the fluorinated silicon oxide film should be limited to the rage in which the amount of Si(—F)$_2$ bonds in the film is sufficiently low. That is, intensity of an FTIR (Fourier transformed infrared absorption spectroscopy) absorption peak by Si(—F)$_2$ bonds (appears around 980 cm$^{-2}$) should negligibly small, or integrated intensity of the absorption peak by Si(—F)$_2$ bonds is less than about 0.2%, or preferably less than about 0.1% of integrated intensity of an absorption peak by Si—O bonds (appears around 1080 cm$^{-2}$). This limitation in the fluorine content limits the dielectric constant of the fluorinated silicon oxide film. Using currently available high density plasma CVD technology, the lower limit of the dielectric constant is about 3.3. However, future advancement in the film formation technology may allow further reduction of the dielectric constant without substantially increasing the content of Si(—F)$_2$ bonds.

If it is necessary, the same process is repeated, and second and subsequent wiring layers and interlayer dielectric layers are formed.

Figure 4E:
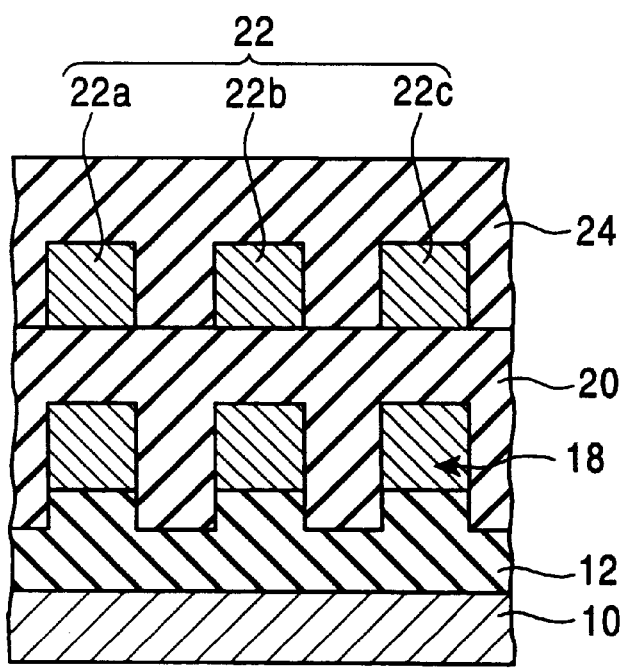

FIG. 4E shows a cross sectional view whereby a second wiring layer 22, which includes wires 22a, 22b and 22c, and a second interlayer dielectric layer 24 are formed. In the wiring structure shown in FIG. 4E, the first interlayer dielectric layer 20 mutually insulates the wires of the first wiring layer 18, and also insulates the first wiring layer 18 and the second wiring layer 22. The thickness of the interlayer dielectric layer 20 between the wiring layer 18 and 22 is approximately 0.6–1.5 μm. Although not shown in the drawings, via holes for connecting the wires of the first wiring layer 18 and the wires of the second wiring layer 22 are formed at necessary positions over the interlayer dielectric layer 20. Plugs which fill the via holes are formed by, for example, CVD and etch back of a tungsten film. According to this embodiment, via holes can be formed by a conventional method, in the interlayer dielectric layer 20 formed by a fluorinated silicon oxide film which is deposited by using a high density plasma CVD method, as long as the fluorine content of the film is limited within an appropriate range.

Finally, a passivation layer and bonding pads are formed and the wafer manufacturing process for the semiconductor integrated circuit is completed. When the second wiring layer 22 is the top wiring layer, the passivation layer is directly formed thereon.

In FIG. 3 and FIG. 4, portions of the underlying dielectric layer 20 between the wires of the first wiring layer 18 are completely etched to the depth of d1 in a rectangular shape. In practice, it is difficult to etch in a completely rectangular shape, and it is not necessary for device operation. For example, it is appropriate to etch the peripheral portions in a curved or rounded shape. In this case, the depth d1 is measured at the central portion between the wires. It is also acceptable to use isotropic etching to etch the surface portions of the underlying dielectric layer. In this case, the etching also proceeds in the horizontal direction under the wires and the surface portions of the underlying dielectric layer 12 are etched in a concave shape. By doing this, there is the advantage that the effect of confining the electric field between the wires of the first wiring layer 18 in the fluorinated silicon oxide becomes higher, and the effect of reducing the capacitance between the wires becomes even higher.

Moreover, depending on the flatness of the surface of the underlying dielectric layer 12, there are cases when the bottom levels of the adjacent wires are not matched. In this case, the difference in depth between the bottom level of the fluorine silicon oxide film and the bottom level of the wire can be determined from the difference between the bottom level of the fluorine silicon oxide film at the central portion between the wires and the average depth of the lower levels of the adjacent wires.

According to this embodiment, after etching of the metal film 14, etching of the surface portions of the underlying dielectric layer 12 is performed after removing the resist pattern 16 by a plasma etching which is separate from the etching of the metal film 14. However, the invention is not limited to this technique. For example, by increasing the over-etching period of the etching of the metal layer 14, it is possible to also etch the surface portions of the underlying dielectric layer 12. This over-etching is effective for removing etching residues which are caused, for example, by silicon precipitation in the metal film 14.

According to this embodiment, the interlayer dielectric layer 20 is formed by a fluorinated silicone oxide film deposited by using a helicon plasma CVD method. However, the invention is not limited to this method. It is also possible to use other high density plasma CVD methods such as ICP-CVD, ECR-CVD or the like. Further, the example of using a CVD gas atmosphere including $SiH_4$, $SiF_4$, $O_2$ and Ar is illustrative. However, it is possible to use a CVD atmosphere including $Si_2F_5$, $SiH_3F$, $SiH_2F_2$, $SiHF_3$ or the like. It is also possible to use a fluorine compound gas such as $CF_4$, $C_2F_6$, $NF_3$ or the like as the fluorine compound gas. In this case, as a silicon raw material, it is also possible to use non-fluorinated silicon compound gas only. Conversely, it is also possible to use a fluorinated silicon compound gas as a Si raw material without mixing it with a non-fluorinated silicon compound gas. It is also possible to use an organic silicon compound gas such as $Si(OC_2H_5)_4$ or the like as a silicon raw material. It is also possible to use a fluorinated organic silicon compound gas such as FSi $(OC_2H_5)_3$, $F_2Si(OC_2H_5)_2$ or the like.

The fluorinated silicon oxide film may also be formed by a conventional plasma CVD method instead of the high density plasma CVD method. However, in this case, the lower limit of the dielectric constant which can preserve low hygroscopicity is higher than the case when a high density plasma CVD method is used.

Moreover, it is possible to form the interlayer dielectric layer 20 by using materials other than fluorinated silicon oxide. Other materials which have lower dielectric constants than that of silicon oxide, for example, SIBON and the like which can be formed by plasma CVD, can be used. Further, if problems, such as poor adhesion and water absorption are solved, it is obviously possible to use various kinds of low dielectric constant materials such as siloxane SOG, organic materials, porous materials and the like.

According to this embodiment, an aluminum-based wiring which mainly formed of an aluminum containing film is used to form the first and second wiring layers 18 and 22. However, the invention is not limited to this method. Wiring of different materials can be used to form one or both of the wiring layers. For example, a copper-based wiring or a wiring which mainly formed of tungsten film (tungsten-based wiring) can be used. Moreover, it is possible to form the first wiring layer 18 and the interlayer dielectric layer 20 by the above-mentioned method after other wiring layers are formed below the first wiring layer 18.

According to this embodiment, the dielectric layer 12 below the first wiring layer 18 is called an "underlying dielectric layer," and the dielectric layer 20 between the first wiring layer 18 and the second wiring layer 22 is called an "interlayer dielectric layer." However, these terms should not be interpreted narrowly. The dielectric layer 12 below the first wiring layer 18 not only functions as an "underlying dielectric layer" for the first wiring layer 18, but also finctions as an "interlayer dielectric layer" between the transistors, which are formed on the semiconductor substrate 10, and between the transistors and the first wiring layer 18. Also, when other wiring layers are formed beneath the first wiring layer 18, the dielectric layer 12 may function as an "interlayer dielectric layer" between wires of these lower wiring layers and between these lower layers and the first wiring layer. Similarly, the interlayer dielectric layer 20 also functions as an "underlying dielectric layer" for the second wiring layer 22.

FIGS. 5A, 5B and 5C and FIGS. 6D, 6E and 6F are cross sectional views showing the formation processes for a wiring structure according to the second embodiment of the invention.

Figure 5A:
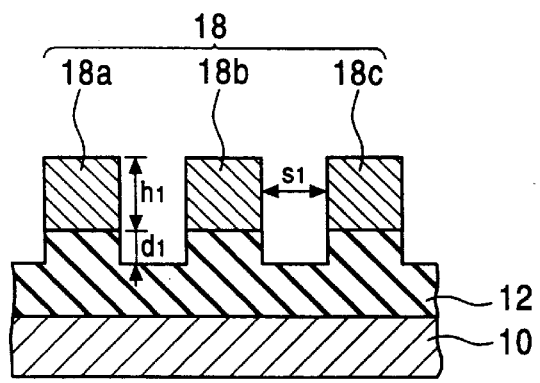
FIGS. 5A, 5B, 5C, 6D, 6E, and 6F are cross-sectional views showing the formation processes for the wiring structure according to the second embodiment of the invention.

FIG. 5A shows an underlying dielectric layer 12 formed on a semiconductor substrate 10 and a first wiring layer 18, which includes wires 18a, 18b and 18c formed on that underlying dielectric layer 12, as described in connection with the first embodiment. Similarly, the height of the wires of the first wiring layer 18 is represented by h1, and the space between the wires is represented by s1. After this, surface portions of underlying dielectric layer 12 between the wires of the first wiring layer 18 are etched to a depth of d1.

Figure 5B:
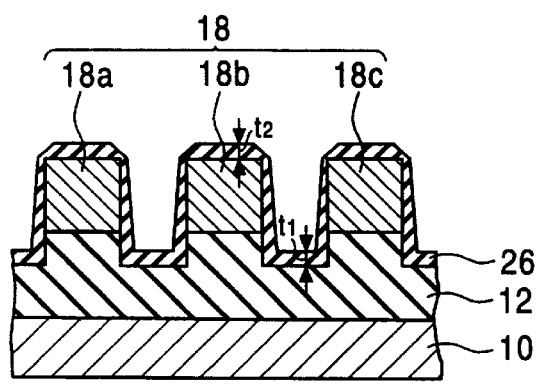

Next, as shown in FIG. 5B, a fluorinated silicon oxide film is deposited by, for example, high density plasma CVD. In this embodiment, the deposition time is set shorter than that of the first embodiment, and the deposition is terminated when the top and side surfaces of the wires are covered, before reaching a point at which the film fills the spaces between the wires of the first wiring layer 18. At this point, the thickness of the fluorinated silicon oxide film formed on the surface of the underlying dielectric layer 12 between the wires of the first wiring layer 18 is t1, and the thickness on the top surfaces of the wires is t2. When the deposition time is set so as not to fill the spaces between the wires, both t1 and t2 are approximately the same as the thickness of the film deposited on a bare substrate i.e., a substrate without any structure formed thereon. By applying a radio frequency power to the substrate holder and generating a bias potential, deposition by CVD and etching by Ar sputter proceed simultaneously during the formation of the fluorinated silicon oxide film by the high density plasma CVD. As a result, even when side surfaces of the wires of the first wiring layer 18 are formed substantially vertical, substantial portions of surfaces of the fluorinated silicon oxide film on the side surfaces of the wires are uniformly positively tapered, except for portions around top edges of the wires. In other words, the thickness on upper portions of the side surfaces is thinner than that on lower portions of the side walls. Moreover, facets are formed on the top edges of the wires. The facets have a certain angle, normally 45° to 60° with respect to the horizontal surface which is determined by the angle dependency of the sputter etching rate.

This fluorinated silicon oxide film 13 becomes part of the interlayer dielectric layer, and becomes an underlying film 26 with respect to a low dielectric constant film which is formed in the next step.

Figure 5C:
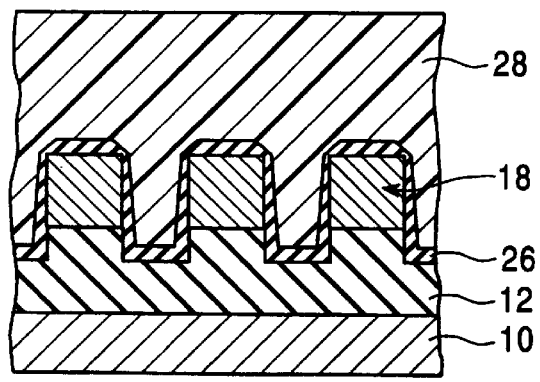

Next, as shown in FIG. 5C, a coating solution which contains, for example, siloxane oligomers is applied to the surface of substrate by a spin coating method and cured to form a low dielectric constant film 28. At this time, since the underlying film 26, which was formed by the high density plasma CVD, has tapered side surfaces and facetted top corners, remaining portions between the wires can be filled with the siloxane SOG even when the spaces become very narrow. The cure can be accomplished by, for example, a poly-condensation reaction which occurs by heating to about 400° C., after the solvent which is contained in the coating solution is evaporated by heating to the temperatures of 80° C. and 200° C. The low dielectric constant film 28 formed by this method has a dielectric constant of approximately 3.0.

The surface of the low dielectric constant film 28 at this stage has a relatively planarized shape compared to the surface of the underlying film 26. For example, on areas in which wires are densely formed, as shown in the cross sectional view of FIG. 5C, the surface has a nearly flattened shape. However, the surface of the low dielectric constant film is not globally planarized. That is, for example, the surface of the low dielectric constant film 28, which is deposited on areas in which wires are densely formed, is higher than the surface of the low dielectric constant film 28 which is formed on areas in which wire is not formed. To accomplish the global planarization, it is favorable to further planarize the surface by, for example, a CMP method.

As previously mentioned, the sloped side surfaces, facilitate the filling of the low dielectric constant film between the wires, especially when the sloped side surfaces are combined with the faceted top corners. The slope is preferably about 2° or more, more preferably about 4° or more, or most preferably about 6° or more with respect to the normal of the main surface of the semiconductor substrate to sufficiently facilitate the filling. However, it is not preferable to increase the slope too large, for example., more than about 8°. The small slope ensures that substantial portions between the wires remain to be filled with the low dielectric constant film, and that the capacitance between the wires is effectively reduced. The degree of the slope can be controlled by adjusting the deposition condition, especially, the substrate bias conditions of the high density plasma CVD.

The sloped side surface is particularly effective to facilitate the filling when particular methods are utilized to deposit the low dielectric constant film. For example, low dielectric constant materials such as fluorinated amorphous carbon or the like can be preferably deposited by high density plasma CVD with a substrate bias. Because of the similarity of the deposition methods of the underlying film and the low dielectric constant film, the filling of narrow spaces between wires by the low dielectric constant film can be effectively facilitated. In this case, it is also possible to deposit the underlying film and the low dielectric constant film in the same deposition apparatus, i.e., deposit the films in the same deposition chamber by changing the CVD gas atmosphere or deposit the films in separate deposition chambers of the same apparatus.

Figure 6D:
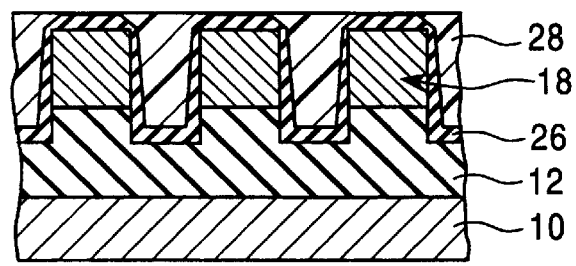

FIG. 6D shows a cross sectional view in which CMP is performed until a low dielectric constant film 28 above the top surface of the first wiring layer 18 is removed, while the film between the wires of the first wiring layer 18 remains. When the low dielectric constant film 28 before the CMP process is sufficiently thick, the surface can be globally planarized by the CMP. Specifically, when the thickness of the low dielectric constant film 28 before the CMP process at portions in which no wire is formed is made to be approximately the same as or greater than the total of the height h1 of the wiring and the etched depth d1 of the underlying dielectric layer 12 between the wires, or preferably 1.5 times or more, or even more preferably 2.0 times or more thicker, sufficient global planarization can be achieved. For example, by using a slurry including $MnO_2$ abrasive, the low dielectric constant film 28 can be polished with a higher speed compared to the underlying insulating film 26 (Y. Homma et al., Proceedings of the 12$^{th}$ International Conference on VLSI Multilevel Interconnection Conference (1995) p. 457). As a result, the fluorinated silicon oxide film which is the underlying film 26 on top of the wires can be used as an etching stopper, and CMP can be terminated at the point when the low dielectric constant film 28 on the wiring is removed, with a high controllability.

Figure 6E:
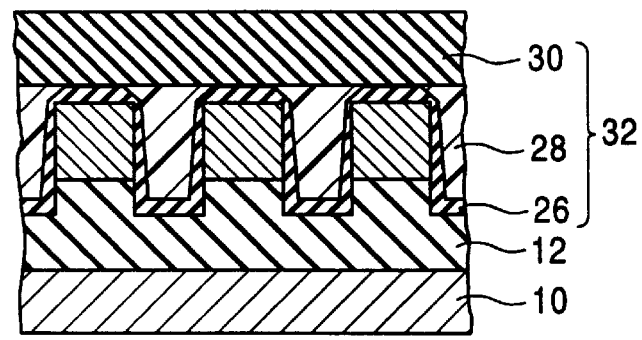

Then, as shown in FIG. 6E, another fluorinated silicon oxide film is deposited by high density plasma CVD, and a cap film 30 is formed. By performing the above-mentioned processes, an interlayer dielectric layer 32, comprising the underlying film 26, the low dielectric constant material film 28 which fills in between the wires and the cap film 30, is formed.

In the wiring structure according to this embodiment, a low dielectric constant film 28 made of siloxane SOG, which is a low dielectric constant material, is filled in between the wires of the first wiring layer 18. The level of the bottom surface of this low dielectric constant film 28 is lower than the level of the bottom surface of the wiring by an amount of (d1–t1), and the level of the top surface of the low dielectric constant film is higher than the level of the top surface of the wiring by an amount of t2. Moreover, the underlying film 26 on the side surfaces of the wires of the first wiring layer 18 and the cap film 30 are formed by fluorinated silicon oxide film which has a lower dielectric constant than silicon oxide. As a result, the capacitance between wires is effectively reduced.

The capacitance between the wires is determined by the dimensions of s1, h1, t1, t2 and the like and the dielectric constants of the fluorinated silicon oxide film and the siloxane SOG. Generally, the thinner the film thickness of the underlying film 26, the more the capacitance between the wires is reduced.

The underlying film 26 improves adhesion of the low dielectric constant film 28. It also has the function of preventing water contained in the low dielectric constant film 28 from diffusing to the wires or to the transistors which are disposed on the surface of the semiconductor substrate 10. With respect to the adhesion improvement, a sufficient effect can be obtained as long as the underlying film 26 is continuously formed. On the other hand, in order to prevent water diffusion, a certain thickness of the underlying film 26 is necessary. A silicon oxide film which is deposited by a high density plasma CVD method, such as disclosed in the U.S. Pat. No. 5,512,513, has a high water diffusion prevention effect. Because of this, a high water diffusion prevention effect can be obtained even with a thin film thickness, compared to the case in which the underlying film is deposited by other methods, such as conventional plasma CVD.

In conventional wiring structures, a film of silicon oxide, silicon oxynitride, silicon nitride or the like is used as the underlying film. In contrast, according to this embodiment, a fluorinated silicon oxide film is used as the underlying film 26 for the low dielectric constant film 28. As a result, the wiring capacitance can be further effectively reduced. It was not obvious that a fluorinated silicon oxide film could be used as an underlying film. It was also not clear that a fluorinated silicon oxide film has sufficient adhesion improvement effects and water diffusion prevention effects. In addition, is was not clear that the amount of water contained in the fluorinated silicon oxide film itself is sufficiently low so that wires on which the fluorinated silicon oxide film is formed are not corroded. In practice, the addition of fluorine does not materially degrade the adhesion improvement effect. Also, the addition of fluorine does not substantially degrade the water diffusion prevention effects nor does it increase the amount of water in the film. Further, Si—F bonds in the fluorinated silicon oxide film make the film hydrophobic, and the water diffusion prevention effects are actually improved and the amount of water in the film is actually decreased. As a result, by using a fluorinated silicon oxide film rather than a silicon oxide film the thickness of the underlying film can be reduce. For example, t1 can be thinned to less than 25 nm, and can be thinned to around 10 nm, depending on various conditions. Accordingly, it is possible to use this method even when the space between the wires is further decreased due to the progress of miniaturization.

Note that, however, the fluorine content in the fluorinated silicon oxide film should not be increased too much so that the film does not substantially contain $Si(-F)_2$ bonds. Because of this, the dielectric constant of the underlying film 26 cannot be decreased below a certain value. However, the wiring capacitance can be effectively reduced by combining the low dielectric constant film with a material having a dielectric constant lower than that of the fluorinated silicon oxide. Because the wires are covered with the underlying film having a high water diffusion prevention ability, various low dielectric constant materials can be used to form the low dielectric constant film 28.

According to this embodiment, it is preferable to make the etching depth d1 of the underlying dielectric layer 12 larger in comparison to the layer described in connection with the first embodiment by the amount of t1 so that the bottom level of the low dielectric constant film 28 is sufficiently lower than the bottom level of the wires. However, even when the depth d1 is not sufficiently large, or even when the surface portions of the underlying dielectric layer 12 is not etched, wiring capacitance can be reduced to some extent because both the underlying film 26 and the low dielectric film is formed with materials having lower dielectric constants.

Figure 6F:
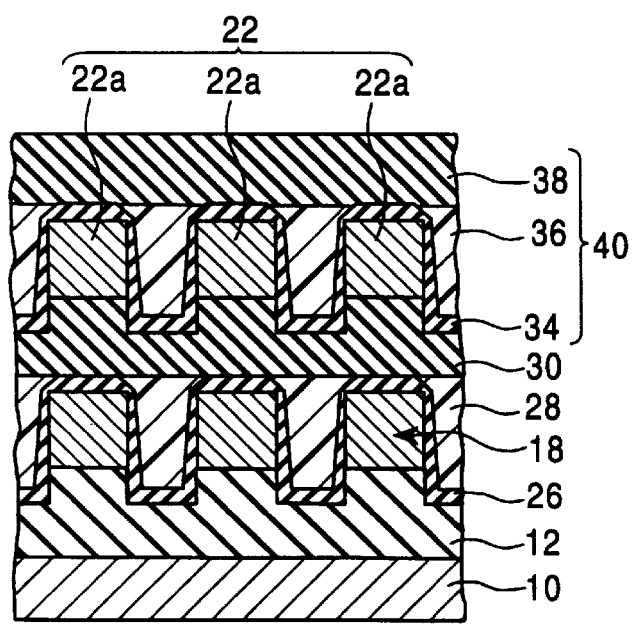

After this, the same process is repeated as necessary, to form the second and subsequent wiring layers and interlayer dielectric layers. A cross-sectional view of FIG. 6F shows a structure including a second wiring layer 22 containing wires 22a, 22b and 22c, and a second interlayer dielectric layer 40 which includes an underlying film 34, a low dielectric constant film 36 which fills in between the wires of the second wiring layer 22, and a cap film 38 formed over the low dielectric constant film 36.

Then, a passivation layer and bonding pads are formed, and the wafer manufacturing process of the semiconductor integrated circuit is completed.

According to this embodiment, the cap film 30 is made of a fluorinated silicon oxide film and is used for the insulation between the wiring layers 18 and 22. Via holes which connect between the wiring layers 18 and 22 are formed in the cap film 30. Therefore, it is possible to form via holes by the same method as when the interlayer dielectric layer is formed by using a conventional silicon oxide film. Moreover, adhesion of the wires of the second wiring layer 22, which is formed on the. surface of the cap film 30, is comparable to the case when the wires are formed on a conventional silicon oxide film. Additionally, since the fluorinated silicon oxide film has a lower dielectric constant than that of conventional silicon oxide film, the capacitance between the wiring layers 18 and 22 can be effectively reduced. Accordingly, the wiring structure of the present embodiment can effectively reduce the capacitance between wires within a wiring layer and between different wiring layers, and at the same time, can preserve compatibility with conventional manufacturing technology.

In the present embodiment, siloxane SOG is used to form the low dielectric constant film 28. However, the present invention is not limited to this, and other kinds of low dielectric constant materials can also be used. For example, it is appropriate to use a low dielectric constant material which has a dielectric constant of, for example, about 3.2 or less, more preferably about 3.0 to 2.5 or less, and most preferably about 2.0 or less. Moreover, it is possible to form the low dielectric constant film 28 by using a fluorinated silicon oxide film by a high density plasma CVD method. In this case, the deposition conditions are adjusted, and the dielectric constant is reduced to about 3.2 or less, and preferably to about 3.0 or less by increasing the fluorine content compared to the case of forming the underlying film 26 and the cap film 30. The film quality of the fluorinated silicon oxide film degrades when the fluorine content is increased. However, according to this embodiment, a fluorinated silicon oxide film with a high fluorine content can be used as the low dielectric constant film 12, because the low dielectric constant film does not directly contact the wires.

In this embodiment, a fluorinated silicon oxide film which is deposited by a high plasma CVD method is used for the cap film 30, and is used for the insulation between the wiring layers 18 and 22. However, the invention is not limited to this method. It is also possible to use a silicon oxide film. It is also possible to use a fluorine silicon oxide film which is deposited by a conventional plasma CVD method. However, in order to decrease the wiring capacitance, it is preferable for the cap film 30 to have a lower dielectric constant. To obtain this, it is preferable to use a fluorinated silicon oxide film which is deposited by using a high density plasma CVD method with which a dielectric constant of approximately 3.5 or less can be obtained while maintaining high quality.

In this embodiment, a fluorinated silicon oxide film, which is deposited by a high density plasma CVD method with a substrate bias, is used for the underlying film 26. However, the invention is not limited to this method. In order to improve the filling ability of the low dielectric constant film 28 in narrow spaces between wires, it is preferable that the surface of the underlying film is positively sloped. It is further preferable that top corners of the underlying film are facetted. However, to improve the filling ability, the underlying film is not necessarily made of a fluorinated silicon oxide film. For example, it is also possible to use silicon oxide formed by, for example, high density plasma CVD with a substrate bias. Also, deposition methods other than high density plasma CVD can be used, as long as sloped side surfaces and/or facetted corners are deposited. Further, a film without positively sloped side surfaces can be deposited by a conventional plasma CVD or by a high density plasma CVD without substantial substrate bias, and then the deposited film can be subject to a plasma etching using a non-reactive gas, such as Ar, or a reactive gas, such as $C_2F_6$, to form positively slopes side surfaces.

However, in order to effectively reduce the capacitance between the wiring, is preferable use a film having a dielectric constant lower than that of silicon oxide as the underlying film. In order to do so, it is preferable to use a fluorinated silicon oxide film which is deposited by using a high density plasma CVD, through which a film having a dielectric constant of about 3.5 or less can be deposited while maintaining high film quality.

In this embodiment, it is also possible to form a cap film with a low dielectric constant material. Forming the cap film with a low dielectric constant material can further reduce the capacitance between the wiring layers 18 and 22 and between the wires. In this case, it is possible to use the same low dielectric constant material as used for the low dielectric constant film 28, or to use a different material. In order to form the low dielectric constant film 28 between the wires, it is necessary to choose a material which can fill in narrow spaces and can effectively planarize the surface. On the contrary, since the cap film is formed after the surface is planarized by CMP of the low dielectric constant film 28, a high filling ability and planarizing ability are not necessary for the material to form the cap film 30. For example, materials having a lower dielectric constant and which are compatible with the via hole forming process are preferably used.

FIGS. 7A, 7B and 7C, FIGS. 8D, 8E and 8F and FIG. 9E are cross sectional views showing the formation processes for forming a wiring structure according to an embodiment of the invention.

Figure 7A:
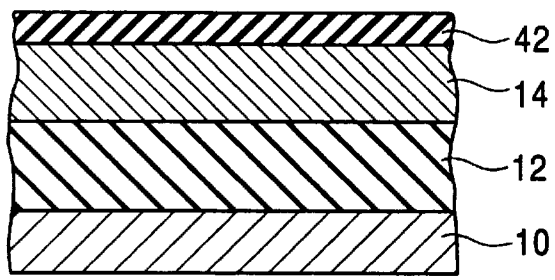
FIGS. 7A, 7B, 7C, 8D, 8E, 8F, 9G are cross-sectional views showing the formation processes for the wiring structure according to the third embodiment of the invention.

As shown in FIG. 7A, an underlying dielectric layer 12 is formed by using a BPSG film or the like on a semiconductor substrate 10, and a metal film 14 for forming the first wiring layer is deposited on this substrate similar to the method described in connection with the second embodiment. Next, according to this embodiment, a silicon oxide film 42 is formed on the metal film 14 by a plasma CVD method.

Figure 7B:
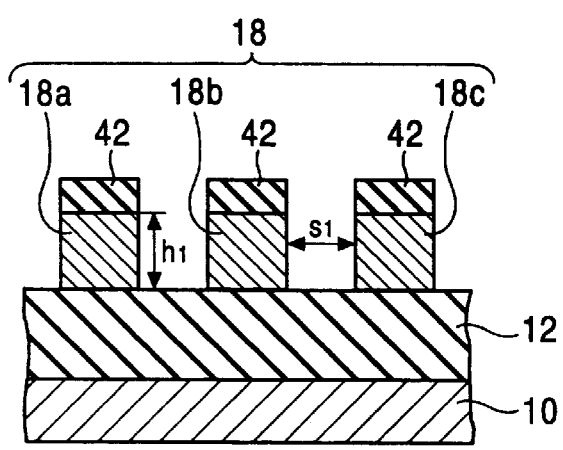

Then, as shown FIG. 7B, a resist pattern (not shown) is formed, and after patterning the silicon oxide layer 42 by anisotropic plasma etching using a fluorine-based gas atmosphere, the resist pattern is removed by ashing. Next, the metal film 14 is patterned by an anisotropic plasma etching using a chlorine-based gas atmosphere, using the patterned silicon oxide film 42 as a mask. Then, the first wiring layer 18 having wires 18a, 18b, 18c is formed. Here, the height of the wires of the first wiring layer 18 is h1, and the space between the wires is s1.

Figure 7C:
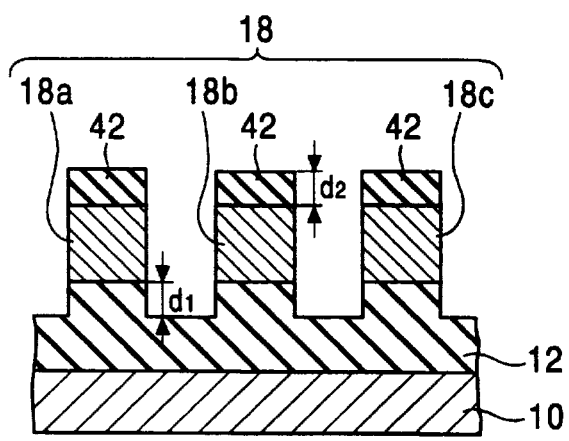

Next, as shown in FIG. 7C, anisotropic plasma etching using a fluorine-based gas atmosphere is performed to etch surface portions of the underlying dielectric layer 12 between the wires to a depth of d1. If necessary, substances on side walls of the wires which were deposited during the metal etching are removed, for example, by ashing, before performing the etching of the surface portions of the underlying dielectric layer. The thickness of the silicon oxide film 42 on the top of the wires after this process is d2. Since the silicon oxide film 42 on the wires is also partially etched during the etching of the surface portions of the underlying dielectric layer, deposition thickness of the silicon oxide film 42 is set so that the necessary film thickness will remain.

Figure 8D:
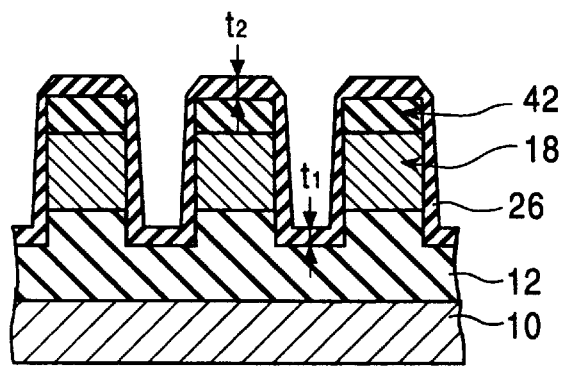

Next, as shown in FIG. 8D, a fluorinated silicon oxide film is deposited by high density plasma CVD, and an underlying film 26 is formed. Similar to the second embodiment, the thickness of the underlying film 26 on the underlying dielectric layer between the wires is t1, and the thickness on the silicon oxide film 42 on the top of the wires is t2.

Figure 8E:
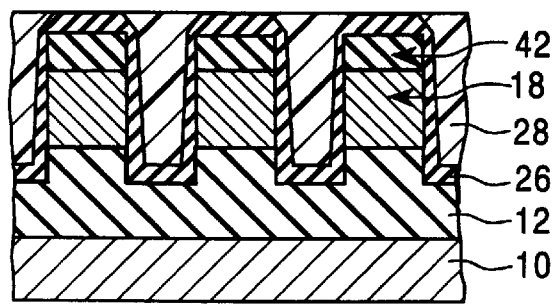

Next, as shown in FIG. 8E, a low dielectric constant film formed of a siloxane SOG is formed over the entire substrate surface, and CMP is performed until the low dielectric constant film above the wires of the first wiring layer 18 is removed, thus forming a low dielectric constant film 28 which fills in between the wires. In order to obtain sufficiently planarized surface, it is preferable to make the low dielectric constant film 28 before the CMP thicker than in the case of the second embodiment by an amount d2.

Figure 8F:
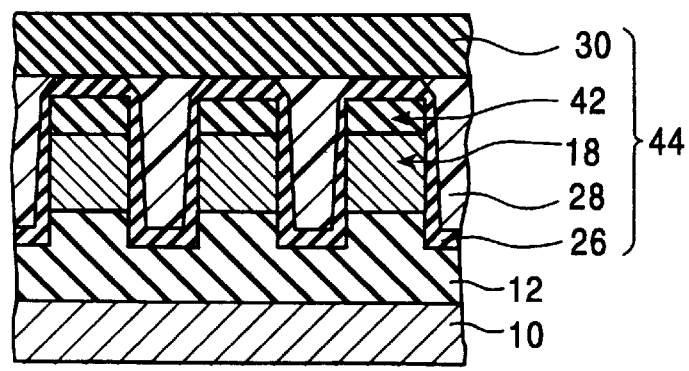

Next, as shown in FIG. 8F, a fluorinated silicon oxide film is formed by using a high density plasma CVD, and a cap film 30 is formed. Through the above-mentioned processes, an interlayer dielectric layer 44 is formed, which includes the underlying film 26, the low dielectric constant film 28 which fills in between the wires of the first wiring layer 18, and the cap film 30.

In the wiring structure according to this embodiment, the lower level of the low dielectric constant film 28 which fills in between the wires of the first wiring layer 18 is bottom than the bottom level of the wiring by an amount (d1−t1), and additionally, the top level of the low dielectric constant film 28 which fills in between the wires of the first wiring layer 18 is higher than the top level of the wires by an amount (t2+d2). Accordingly, the capacitance between the wires can be further reduced compared to the structure of the second embodiment. In order to effectively reduce the capacitance between the wires, the value of (t2+d2) should be about 20% or more, or preferably, about 50% or more of the space s1.

Figure 9G:
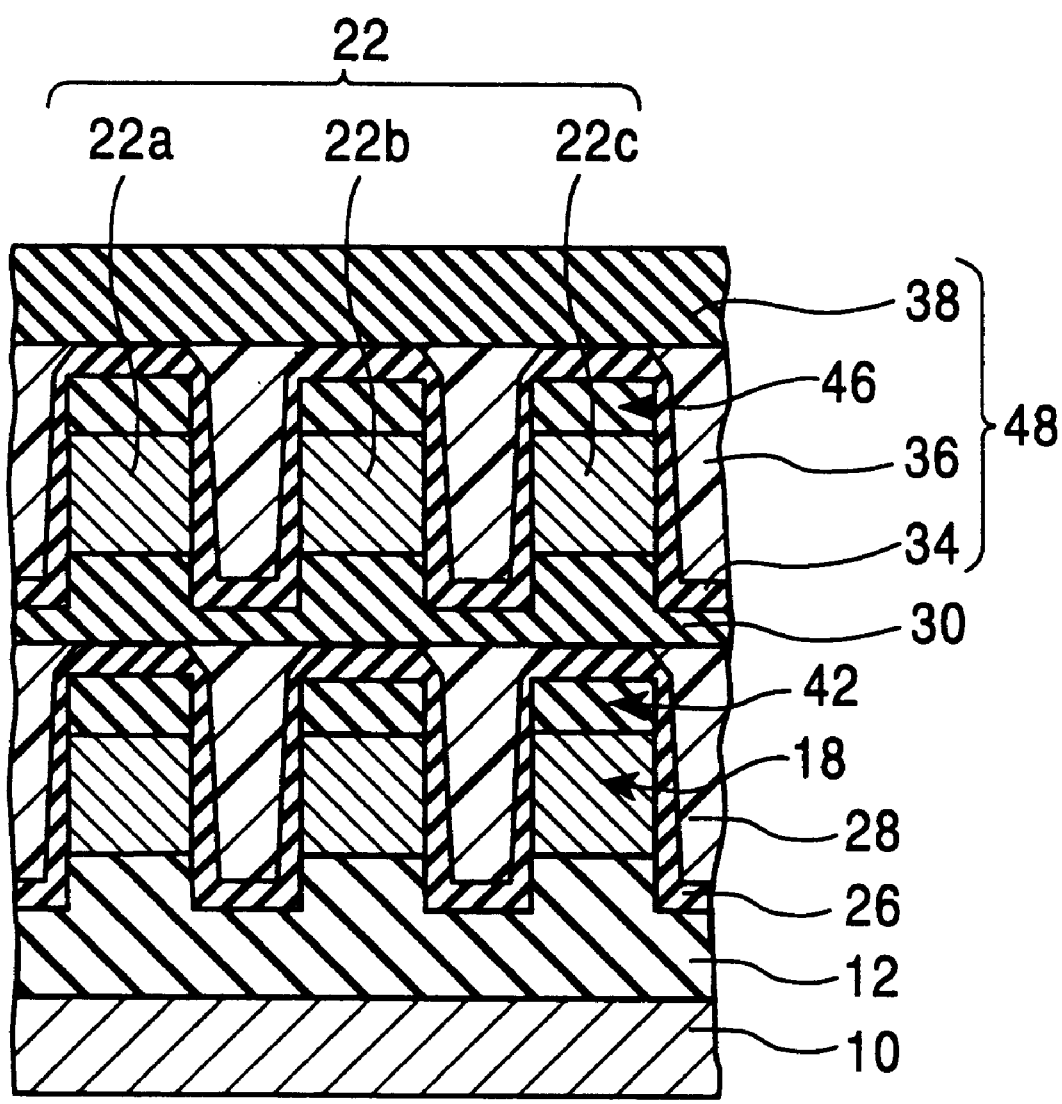

After this process, the same process is repeated as necessary, and the second and subsequent wiring layers and interlayer dielectric layers are formed. In FIG. 9G, a second wiring layer 22 having wires 22a, 22b and 22c and the second interlayer dielectric layer 48, which includes an underlying film 34, a low dielectric constant film 36 which fills in between the wires of the second wiring layer 22, and a cap film 38, are shown. A silicon oxide film 46 is also formed on the top of the wires of the second wiring layer 22, and the upper level of the low dielectric constant film 46 which fills in between the wires of the second wiring layer 22 is higher than the top level of the wires. Because of this, the capacitance between the wires of the second wiring layer 22 is reduced more compared with the structure disclosed in connection with the second embodiment.

After this, a passivation layer and bonding pads are formed, and the wafer manufacturing process for the semiconductor integrated circuit is completed.

In this embodiment, a silicon oxide film is formed on the top of the wires, in order to make the top level of the low dielectric constant film 28 which fills in between the wires higher than the top level of the wires. However, the invention is not limited to this structure. For example, the capacitance between the wiring layers 18 and 22 can be further reduced by forming a fluorinated silicon oxide film, which has a lower dielectric constant than the silicon oxide film, on the top of the wires. Moreover, it is also possible to use other materials having an even lower dielectric constant to form the film on the top of the wires. Furthermore, in this present embodiment, the resist pattern is removed after the patterning of the silicon oxide film on the wiring. However, it is also possible to remove the resist pattern after forming the wires, or after performing the etching of the surface portions of the underlying dielectric layer.

At least in this embodiment, it is possible to etch-back the underlying film 26 so that portions of the underlying film on the surface of the underlying dielectric layer 12 between the wires and on the silicon oxide film 42 on the top of the wires are removed before forming the low dielectric constant film 28. As a result, the lower level of the low dielectric constant film can be made lower than the upper level of the wires by the distance of d1.

FIGS. 10A, 10B and 10C and FIG. 11D are cross-sectional views showing the formation processes of a wiring structure according to the fourth embodiment of the invention.

Figure 10A:
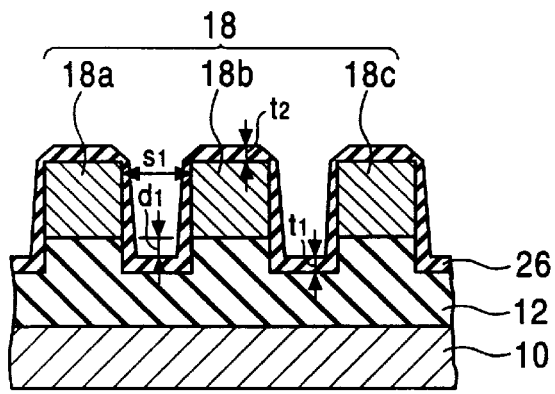
FIGS. 10, 10B, 10C, and 11D are cross-sectional views showing the formation processes for the wiring structure according to the fourth embodiment of the invention.

As shown in the FIG. 10A, and as also shown in connection with the second embodiment, surface portions of an underlying dielectric layer 12 between wires of a first wiring layer 18 are etched to a depth of d1 after the underlying dielectric layer 12 and the first wiring layer 18, which includes wires 18a, 18b and 18c, are formed over a semiconductor substrate 10. Next, a fluorinated silicon oxide film is deposited by using high density plasma CVD to form an underlying film 26.

Figure 10B:
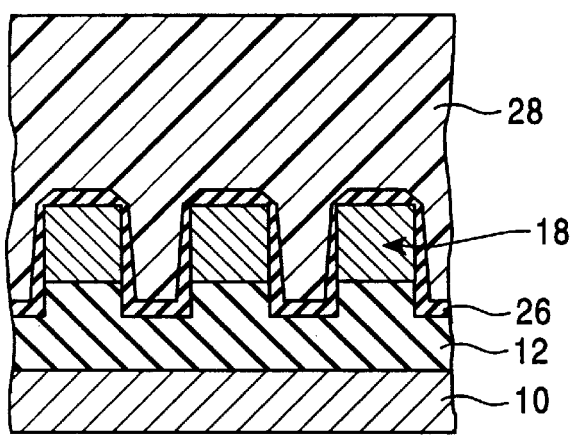

Next, as shown in FIG. 10B, a low dielectric constant film 28 formed of fluorinated polyimide is formed by applying a coating solution which contains fluorinated polyimide precursors, and curing.

Figure 10C:
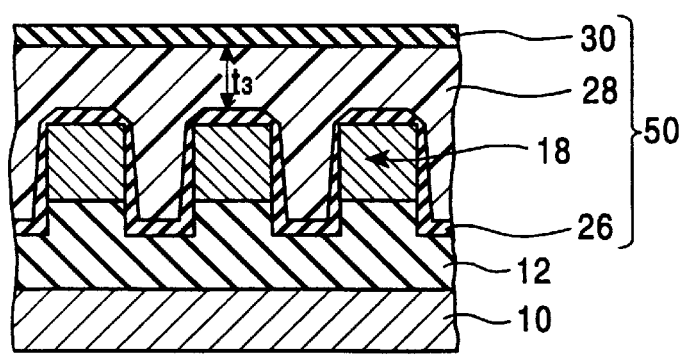

Next, as shown in FIG. 10C, the surface of the low dielectric constant film 28 is planarized by CMP. In this embodiment, unlike the second embodiment, the CMP is terminated at a point at which the surface is planarized, instead of continuing the CMP until all the low dielectric constant film 28 above the wires of the first wiring layer 18 is removed. The film thickness of the low dielectric constant film 28 above the wiring at this point is t3. Finally, a fluorinated silicon oxide film is deposited, by high density plasma CVD, and a cap film 30 is formed. By the above-mentioned process, the interlayer dielectric layer 50, including the underlying film 26, the low dielectric constant film 28 which fills in spaces between the wires of the first wiring layer 18 and has a specific thickness over the top of the wires, and the cap film 30 are formed. Unlike the second embodiment, the low dielectric constant film 28 is formed not only between the wires but also above the wires. Because of this, the capacitance between the wires and between the wiring layers is further reduced compared to the structure disclosed in connection with the second embodiment.

When the thickness t3 of the low dielectric constant film 28 above the wiring after the CMP is not sufficient, it is possible to increase the thickness of the cap film 30. It is also possible to form another low dielectric constant film on the low dielectric constant film 28.

In this embodiment, unlike the second embodiment, since the underlying film 26 on the wires of the first wiring layer 18 is not used as an etching stopper when performing the CMP of the low dielectric constant film 28, it is necessary to perform the CMP with a high degree of controllability and uniformity. It is possible to improve the degree of controllability of the CMP through the selection of a forming method of the low dielectric constant film 28. For example, a low dielectric constant film 28 of amorphous fluorinated carbon can be deposited by a high density plasma CVD method in which a substrate bias is applied such that the surface of the deposited film is virtually flat except for the protrusions on wide wires. In this case, as disclosed in the U.S. Pat. No. 5,036,015, it is possible to detect a point at which the protrusions on wide wires are removed and the entire surface of the low dielectric constant film 28 becomes flat by the change of the motor current of the CMP apparatus. Moreover, as disclosed in J. M. Neirynck et al., Materials Research Society Symposium Proceedings, Vol. 381 (1995) P. 229, CMP characteristics of a low dielectric constant film can be adjusted by the curing condition. Depending on the kind of the material of the low dielectric constant film, CMP is performed after performing heat processing for removing the solvents i.e., at a temperature of about 150° C. or less, after performing a heat processing for performing a partial curing i.e., at a temperature of about 200–300° C., or after performing a complete curing i.e., at a temperature of about 350–450° C.

Next, via holes are formed in the interlayer dielectric layer 50 and plugs are formed (not shown). At this time, the cap film 30 can be used as a mask for forming the via holes in the low dielectric constant film 28. That is, a resist pattern corresponding to the via holes is formed on the cap film 30, and after apertures corresponding to the via holes in the cap film 30 are formed, the via holes are formed in the low dielectric constant film 28 by anisotropic plasma etching using an oxygen-based gas atmosphere. By using this method, it is possible to form via holes in the low dielectric constant film 28 made of a material which has poor ashing resistance. Many of the organic materials that are categorized as low dielectric constant materials, as described in the above-mentioned category 3, have poor ashing resistance. Moreover, organic porous materials or the like have poor ashing resistance.

For the anisotropic etching of the low dielectric constant film, a parallel-plate RIE apparatus, an ICP plasma etching apparatus, an ECR plasma etching apparatus, a helicon plasma etching apparatus or the like can be appropriately used. These apparatuses, except for the parallel-plate RIE apparatus, should employ a substrate bias to accelerate oxygen ions perpendicular to the substrate with an appropriate energy. An etching atmosphere including oxygen can be used. Other gasses such as $N_2O$, $H_2O$, CO or the like can be added. In order to ensure the anisotropic etching, the substrate temperature during etching is preferably kept low i.e., about 100° C. or less; preferably, about 50° C. or less; even more preferably, about 20° C. or less; and most preferably, about 0° C. or less. Moreover, in order to increase the directionality of the ions, thereby ensuring proper anisotropic etching, the pressure of the etching atmosphere is preferably kept low i.e., about 100 mtorr or less; preferably, about 20 mtorr or less; even more preferably, about 10 mtorr or less; and most preferably, about 5 mtorr or less. In order to obtain an acceptable etching speed under these low temperature and low pressure conditions, it is preferable to use high density plasma etching such as ICP, ECR, helicon plasma etching or the like. Depending on the material of the low dielectric constant film 28, adding fluorine-based gas such as $CF_4$, $C_2F_6$, $C_4F_8$ or the like can make the etching speed higher.

The resist pattern can be removed after the apertures corresponding to the via holes are formed in the cap film 30, and the low dielectric constant film can be etched using the cap film as the mask. Alternatively, since the resist is also etched by anisotropic plasma etching using an oxygen-based gas atmosphere, it is possible to remove the resist pattern simultaneously when forming the via holes in the low dielectric constant film 28 without performing a separate resist removal process. In this case, it is preferable to set the etching conditions so that the resist pattern removal is completed before the completion of the via hole etching.

For the purpose of being used as a mask, the material for the cap film is not limited to fluorinated silicon oxide. Various types of inorganic materials can be used as the cap film. For example, silicon oxide, silicon nitride, silicon oxynitride or the like can be used. Moreover, the deposition method for the cap film is not limited to the high density plasma CVD. For example, conventional plasma CVD, SOG or the like can be used. However, in order to decrease the wiring capacitance, it is preferable to use a fluorinated silicon oxide film which has a low dielectric constant.

It is possible to remove the resist by ashing, and then the via holes are formed in the low dielectric constant film 28 by an anisotropic etching using an oxygen-based gas atmosphere. However, adjustment of the ashing conditions is necessary since low dielectric constant materials having poor ashing resistance tend to be etched isotropically by the ashing. It is also possible to remove the resist pattern by using a solvent which dissolves the resist but does not dissolve the low dielectric constant film 28.

On the other hand, methylsiloxane SOG, hydrogen silsesquioxane SOG, inorganic porous materials and the like have relatively high ashing resistances. When these materials are used for the low dielectric constant film 28, it is possible to form the via holes by anisotropic plasma etching using an fluorine-based gas atmosphere, using a resist mask. However, even when these kind of materials are used, the surfaces of the low dielectric constant film, which are exposed on the side walls of the via holes, may deteriorate by the ashing process to remove the resist pattern. For example, the side walls of the low dielectric constant film may become hygroscopic. Because of this, it is necessary to adjust the ashing conditions. Alternatively, as disclosed in Ito et al., Journal of the Electrochemical Society, Vol. 137 (1990) p. 1212, it is preferable to perform a stabilizing process which uses a plasma that contains directional oxygen ions at low temperatures i.e., about 100° C. or below; preferably about 50° C. or below; more preferably about 20° C. or below and low pressures i.e., about 100 mtorr or below; preferably about 20 mtorr or below; more preferably about 10 mtorr or below. After the stabilizing process, it is possible to perform ashing to remove the resist pattern. Alternatively, the stabilizing plasma treatment can be continued until the resist pattern is removed. Moreover, it is also possible to omit the plasma ashing process, or to shorten the ashing time, by using a solvent to remove the resist pattern.

Figure 11D:
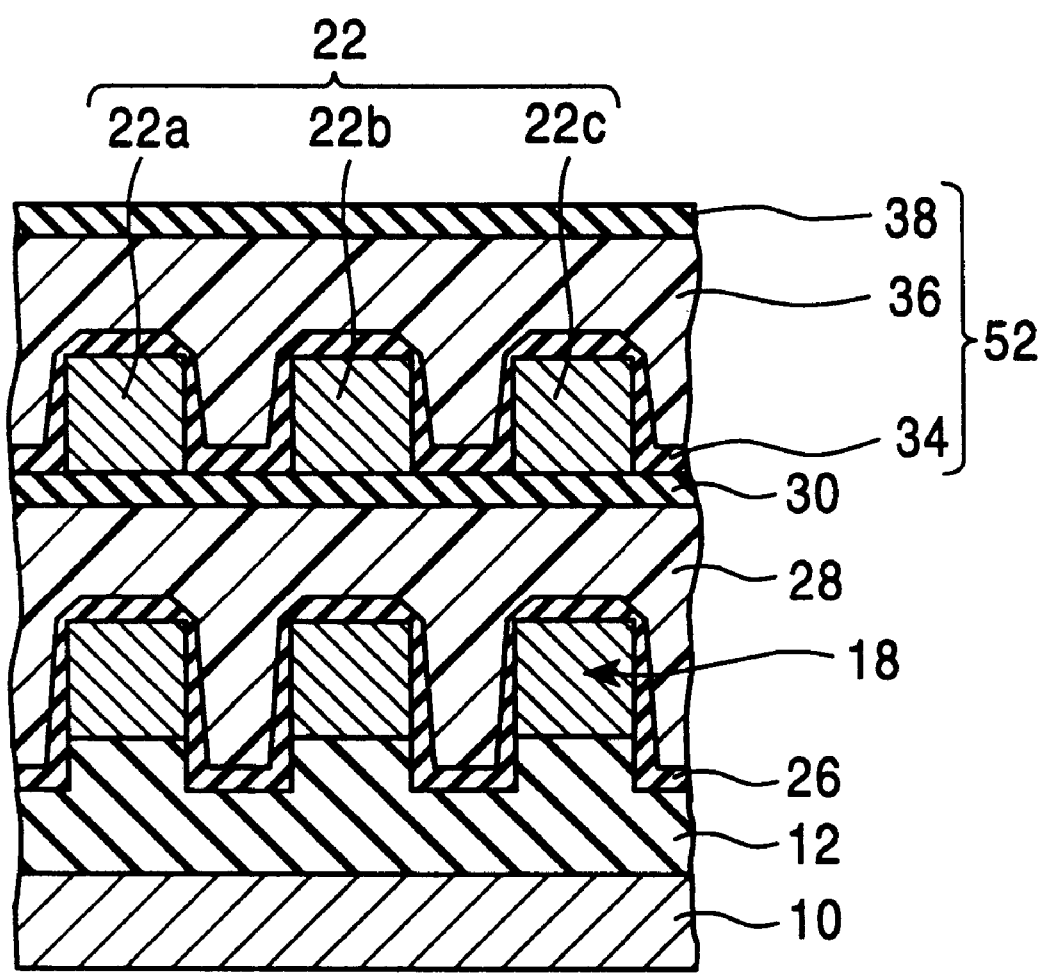

The same process is repeated as necessary, and the second and following wiring layers and the second and following interlayer dielectric layers are formed. FIG. 11D shows a cross sectional view in which a second wiring layer 22, which contains wires 22a, 22b and 22c, and a second interlayer dielectric layer 52 comprising an underlying film 34, a low dielectric constant film 36 which is formed between and on top of the wires of the second wiring layer 22, and a cap film 38, are formed.

The cap film 30 also functions as an adhesion film for the second wiring layer 22 with respect to the interlayer dielectric layer 50. Moreover, the cap film 30 functions to prevent diffusion of the water from the low dielectric constant film 28 to the second wiring layer 22. Fluorinated silicon oxide film which is deposited by high density plasma CVD has a high water diffusion prevention effect, and since the film thickness needed to obtain necessary diffusion prevention effect is small, the film thickness of the cap film 30 can be decreased. As a result, the capacitance between the wires of the second wiring layer 22 and between the first and the second wiring layer can be reduced. Specifically, the film thickness of fluorinated silicon oxide film which is deposited by high density plasma CVD can be made as thin as about 25 nm or less, or it can be as thin as 10 nm, depending on the conditions. Of course, when there are no adhesion and water diffusion problems, and the low dielectric constant film 28 is formed using a material with which the via holes can be formed using a resist mask, it is possible to omit the cap film 30. Moreover, it is possible to use a silicon oxide film, a silicon nitride film, a silicon oxynitride film or the like, as the cap film 30 in order to improve adhesion and to prevent water diffusion.

After this, a passivation layer and bonding pads are formed, and the wafer manufacturing process of the semiconductor integrated circuit is completed.

FIGS. 12A, 12B, 12C and FIG. 13D are cross sectional views showing the formation processes for a wiring structure according to the fifth embodiment of the invention.

Figure 12A:
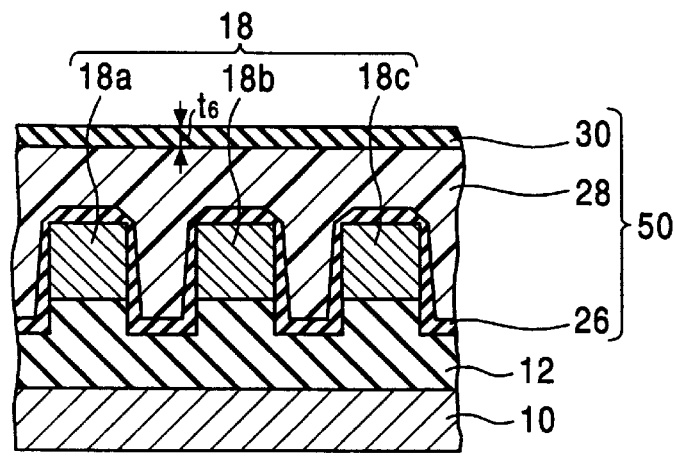
FIGS. 12A, 12B, 12C, and 13D are cross-sectional views showing the formation processes for the wiring structure according to the fifth embodiment of the invention.

As shown in FIG. 12A, a first wiring layer 18 which includes wires 18a, 18b and 18c is formed, and a interlayer dielectric layer 50, which comprises an underlying film 26, a low dielectric constant film 28, which is formed between and on top of the wires of the first wiring layer 18, and a cap film 30 are formed, similar to the process described in connection with the fourth embodiment. Here, the film thickness of the cap film 30 is t6.

Figure 12B:
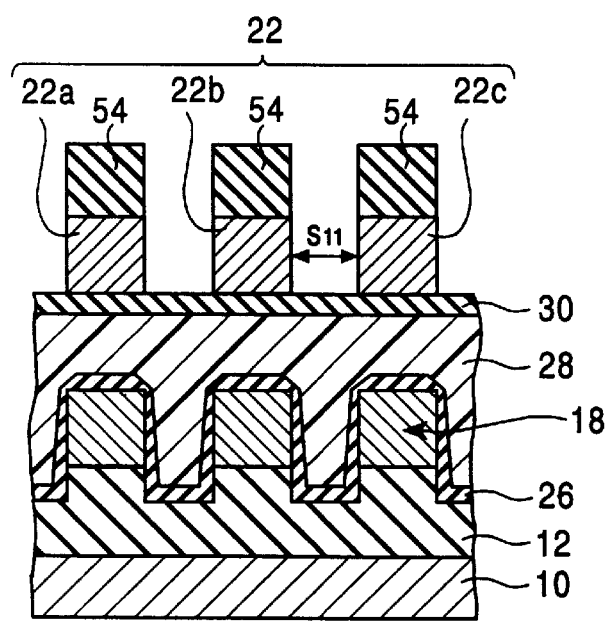

Next, as shown in FIG. 12B, via holes are formed in the interlayer dielectric layer 50, and plugs are formed (not shown in the Figure). Next, a metal film for forming the second wiring layer is formed on the cap film 30. A resist pattern 54 is formed on this metal film, and the second wiring layer 22, which includes wires 22a, 22b and 22c, is formed by an anisotropic plasma etching in which a chlorine-based gas atmosphere is used. Here, the space between the wires of the second wiring layer 22 is s11. This etching is completed without removing the cap film 30 between the wires of the second wiring layer 22.

Figure 12C:
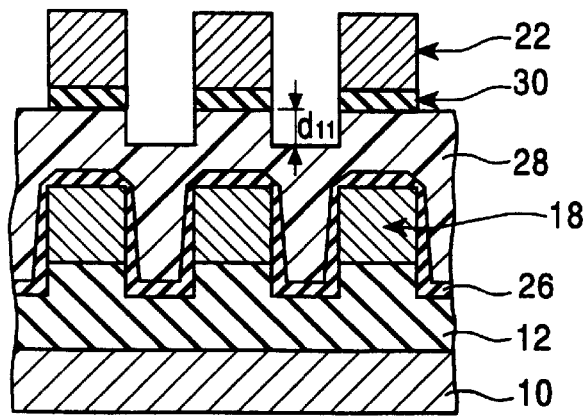

Next, as shown in FIG. 12C, after removing the resist pattern 54, and after removing the cap film 30 between the wires of the second wiring layer by an anisotropic etching which uses a fluorine-based gas atmosphere, surface portions of the low dielectric constant film 28 between the wires of the second wiring layer 22 are etched to a thickness of d11 by an anisotropic plasma etching which uses an oxygen-based gas atmosphere.

Figure 13D:
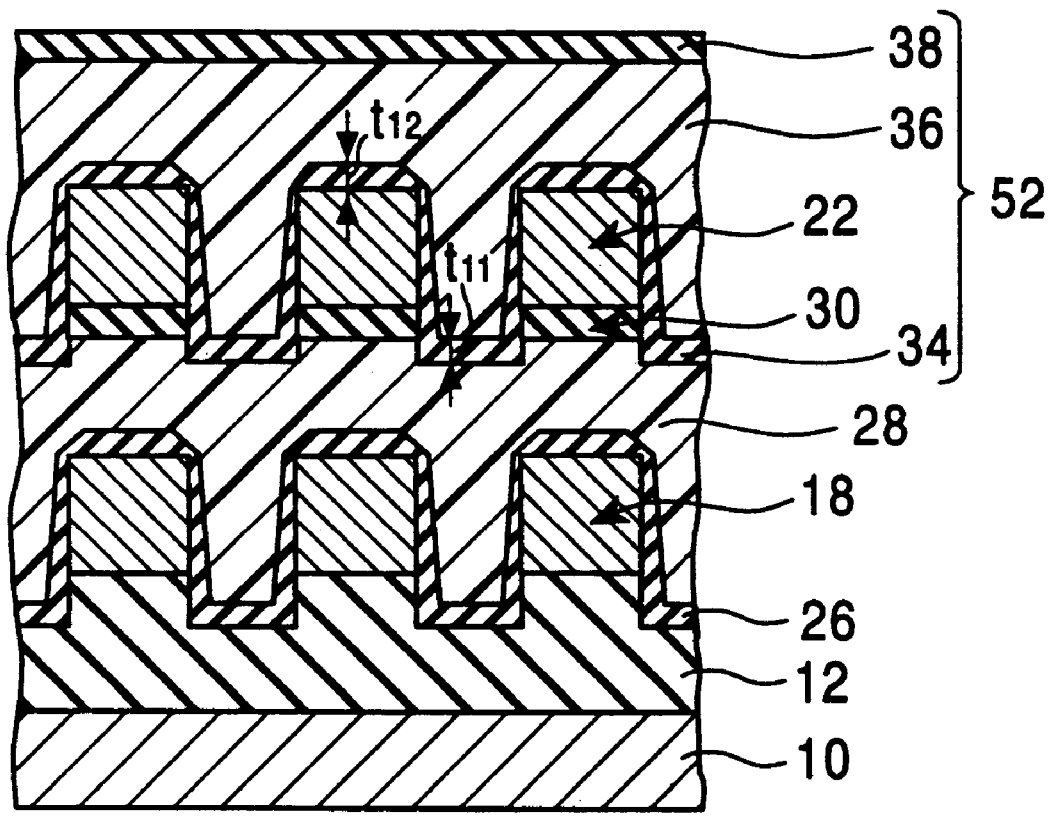

Next, as shown in FIG. 13D, a second interlayer dielectric layer 56, including an underlying film 34, a low dielectric constant film 36, which is formed between and on top of the wires of the second wiring layer 22, and a cap film 38, is formed by repeating the same formation process. Here, the thickness of the underlying film 34 of the second interlayer dielectric layer 22 between the wires of the second wiring layer is t11, and the thickness of the underlying film 34 on the top of the wires of the second wiring layer is t12.

In the wiring structure of this embodiment, unlike the fourth embodiment, portions of the cap film 30 of the first interlayer dielectric layer 50 are removed, and surface portions of the low dielectric constant film between the wires of the second wiring layer 22 are etched to the depth of d11. Because of this, the bottom level of the low dielectric constant film 36 of the second interlayer dielectric layer 56 is lower than the bottom level of the wires of the second wiring layer 22. Accordingly, since the electric field between the wires of the second wiring layer 22 is effectively confined within the low dielectric constant film 36, the capacitance between the wires of the second wiring layer 22 is further reduced compared to the structure disclosed in connection with the fourth embodiment. It is preferable to make the value of (d11+t6−t11) to be about 20% or more, and more preferably, about 50% or more of the space s11 between the wires of the second wiring layer, in order to effectively reduce the capacitance between the wires of the second wiring layer 22.

Then, the third and following wiring layers and interlayer dielectric layers are formed as needed, and a passivation layer and bonding pads are formed, and the wafer process is completed.

In this embodiment, after the wires of the second wiring layer 22 are formed by anisotropic plasma etching, which uses a chlorine-based gas atmosphere, and the resist is removed, portions of the cap film 30 between the wiring of the second wiring layer 22 are removed by an anisotropic plasma etching which uses a fluorine-based gas atmosphere. Further, the surface portions of the low dielectric constant film 28 are etched by anisotropic plasma etching, which uses an oxygen-based gas atmosphere. However, the invention is not limited to this. For example, depending on the material of the low dielectric constant film 28, it is possible to etch the surface portions of the low dielectric constant film 28 using anisotropic plasma etching using a fluorine-based gas atmosphere.

In this embodiment, both the cap film 30 and the surface portions of the low dielectric constant film 28 between the wires of the second wiring layer 22 are etched. However, the capacitance between the wires of the second wiring layer 22 can be reduced compared to the structure disclosed in connection with the fourth embodiment by simply removing the cap film 30 between the wires of the second wiring layer 22.

In the first to fourth embodiments described above, both the first wiring layer 18 and the second wiring layer 22 are formed by an etching method, but the invention is not limited to this method. For example, it is possible to form the second wiring layer 22 by the damascene method.

FIGS. 14A, 14B, 14C, FIGS. 13D, 13E, 13F and FIG. 14G are cross-sectional views which show the formation processes of a wiring structure according to a sixth embodiment of the invention.

Figure 14A:
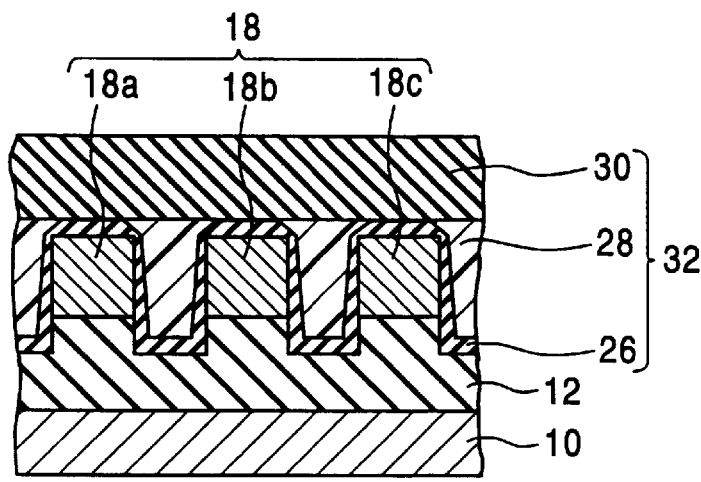
FIGS. 14A, 14B, 14C, 15D, 15E, 15F, and 16G are cross-sectional views showing the formation processes for the wiring structure according to the sixth embodiment of the invention.

First, as shown in FIG. 14A, a first wiring layer 18, including wires 18a, 18b, 18c, an interlayer dielectric layer 32, including an underlying film 26, a low dielectric constant film 28, which fills in the spaces between the wires of the first wiring layers, and a cap film 30 are formed by the same processes as described in connection with the second embodiment.

Figure 14B:
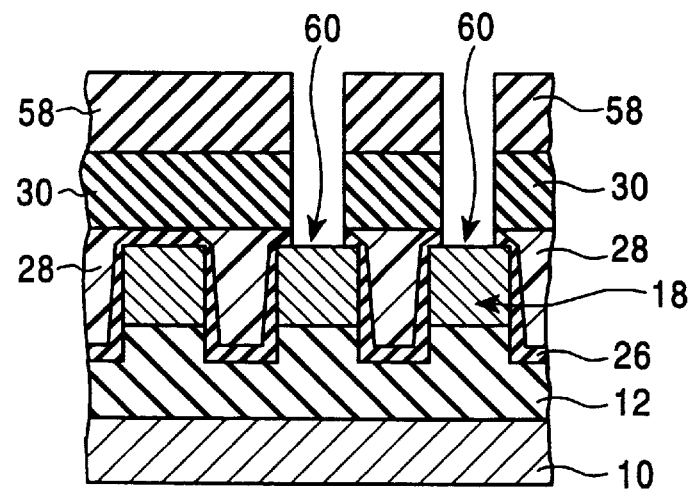

Next, as shown in FIG. 14B, a resist pattern 58 which corresponds to the via holes and which connects wires of the first wiring layer 18 and wires of the second wiring layer are formed in the interlayer dielectric layer 32. An anisotropic plasma etching, which uses a fluorine-based gas atmosphere, is performed using this resist pattern 58 as a mask, and via holes 60 are formed in the interlayer dielectric layer 32. The dimensions of the via holes 60 are set such that the low dielectric film 28 of the interlayer dielectric layer 32 is not exposed on side walls of the via holes. In particular, when a low dielectric constant material which has poor ashing resistance is used as the material for the low dielectric constant film 28, it is preferable to set the relationship between the dimensions of the wires of the first wiring layer 18 and the dimensions of the via holes 60 to be such that the low dielectric constant material is not exposed on the side walls of the via holes 60 even if, for example, mask misalignment occurs during the photolithography process.

Figure 14C:
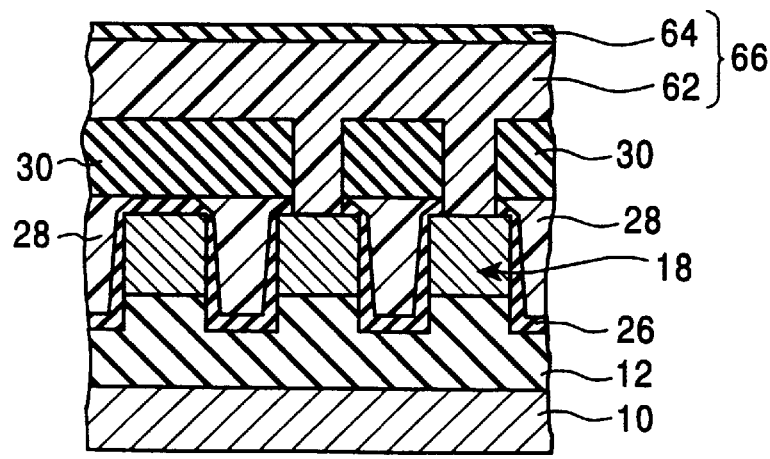

As shown in FIG. 14C, after the resist pattern 58 is removed, a low dielectric constant film 62, which is made of, for example, a fluorinated polyimide, is formed by coating and curing a solution which contains fluorinated polyimide precursors on the first interlayer dielectric layer 50. At this time, via holes 60 are also filled in by the fluorinated polyimide. Since the surface of the interlayer dielectric layer 50 is flattened, the surface of the low dielectric constant film 62 also becomes virtually flat when the film thickness of the low dielectric constant film 62 is thicker than the dimension of the via holes 60. It is possible to further increase the flatness by performing CMP after the coating and curing. Here, the low dielectric constant film 62 is formed using a low dielectric constant material which has poor ashing resistance. Furthermore, a fluorinated silicon oxide film, for example, is deposited on the low dielectric constant film 62, forming a cap film 64. This low dielectric constant film 62 and cap film 64 form a intra-layer dielectric layer 66 between wires of the second wiring layer.

Figure 15D:
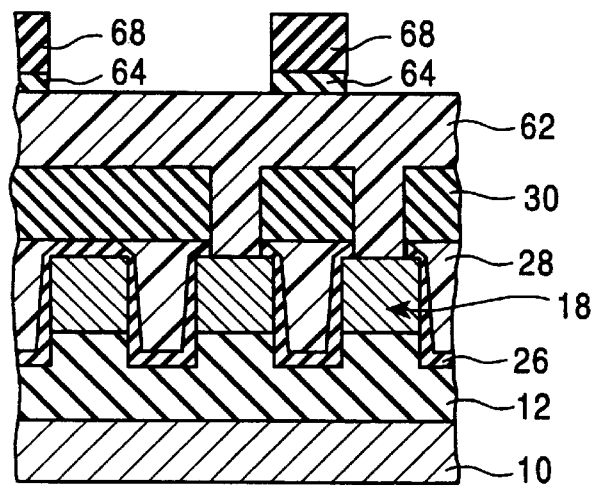

Next, as shown in FIG. 15D, resist pattern 68, corresponding to grooves in which wires of the second wiring layer are to be formed, is formed on the cap film 64, and apertures are formed in the cap film 64 by anisotropic plasma etching, which uses a fluorine-based gas atmosphere.

Figure 15E:
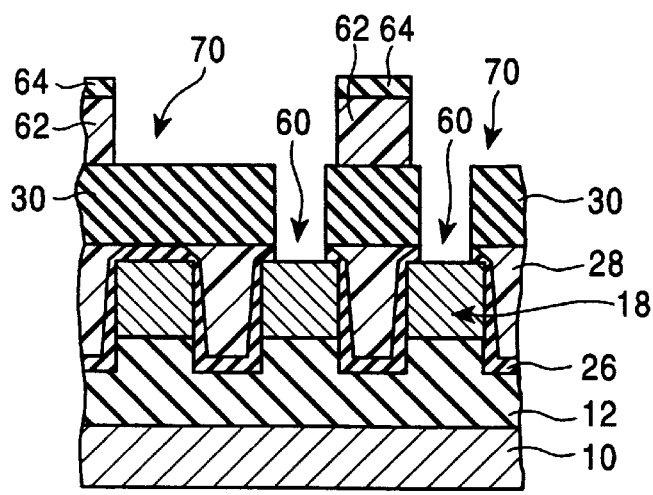

Next, as shown in FIG. 15E, grooves 70 are formed in the low dielectric constant film 62 by an anisotropic etching, which uses an oxygen-based gas atmosphere. At that time, the over-etching amount is set so that the low dielectric constant film 62 within the via holes 60 is removed. As described in connection with the fourth embodiment, whereby via holes are formed in the low dielectric constant film 28, it is possible to remove the resist pattern 68 in advance, or to simultaneously remove the resist pattern 68 during the etching of the low dielectric constant film 62.

Figure 15F:
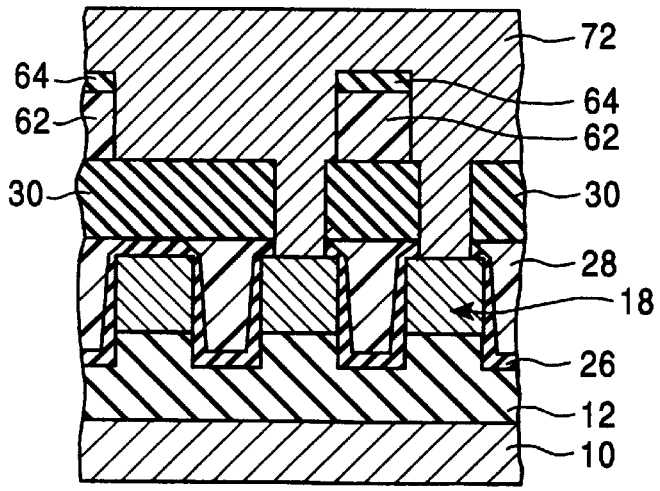

Next, as shown in FIG. 15F, a metal film 72 is formed over the entire substrate surface in order to form plugs which connect wires of the first wiring layer 18 with wires of the second wiring layer, and to form wires of the second wiring layer. For example, a titanium film which has a thickness of about 10–100 $\mu$m, a titanium nitride film which has a thickness of about 20–200 $\mu$m, and a copper film which has a thickness of about 0.5–2 $\mu$m are formed in the order. For the deposition of the titanium film and titanium nitride film, for example, an ionized sputtering method (G. Dixit et al., International Electron Devices Meeting Digest of Technical Papers (1996) p. 357) is used, and for the deposition of the copper film, a CVD method is used. At this time, deposition conditions with high coverage are selected so that the via holes 60 and the grooves 70 are filled.

Figure 16G:
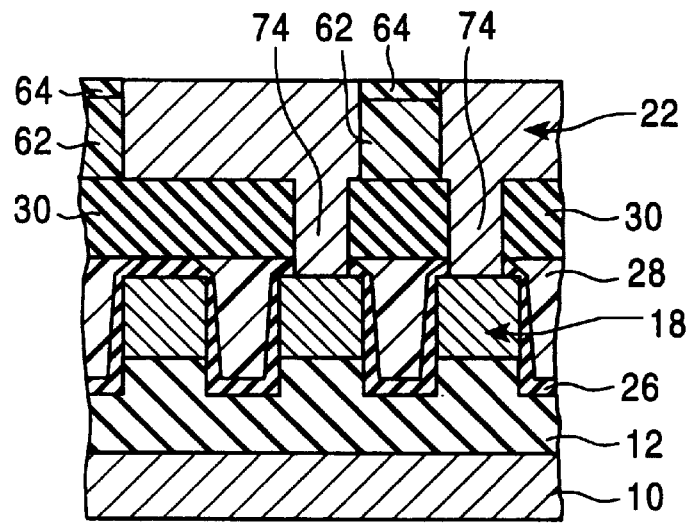

As shown in FIG. 16G, the metal film 72, which is formed on the cap film 64 is removed, for example, by a CMP method. By so doing, the plugs 74 embedded within the via holes 60, which connect the wires of the first wiring layer 18 with the wires of the second wiring layer, and the wires of the second wiring layer 22 which are embedded within the grooves 70 are formed. Furthermore, as needed, an oxidation prevention film is formed on the surface of the wires of the second wiring layer 22, as disclosed in, for example, K. Ueno et al., Symposium on VLSI Technology Digest of Technical Papers (1995) p. 27.

In this embodiment, a copper-based wiring formed mainly of a copper film is formed as the wires of the second wiring layer 22. In this embodiment, pure copper film is used, but it is also possible to use various copper-containing films such as Cu—Ti, Cu—Zr or the like. Meanwhile, the titanium film functions to improve the adhesion of the second wiring layer 22 and reduce the contact resistance between the wire of the first wiring layer 18 and the wire of the second wiring layer 22. The titanium nitride film has a function of preventing diffusion of copper. Furthermore, instead of a titanium film, various films of refractory metals such as zirconium, hafnium, tantalum, tungsten or the like can be used. Also, if there is no problem of adhesion or contact resistance, it is possible to omit this film. Instead of a titanium nitride film, various films of refractory metal compounds, such as zirconium nitride, hafnium nitride, tantalum nitride, tungsten nitride, TiSiN, TaSiN, WSiN, or the like can be used. These refractory metal compounds are not limited to substances with stoichiometric ratios. Among the refractory metals, at least Ta, W, or the like can be used in a monolayer film to improve adhesion and to prevent the diffusion of copper.

After that, the third and subsequent wiring layers are formed as needed, and a passivation layer and bonding pads are formed, and the wafer manufacturing process for the semiconductor integrated circuit is completed.

Figure 1:
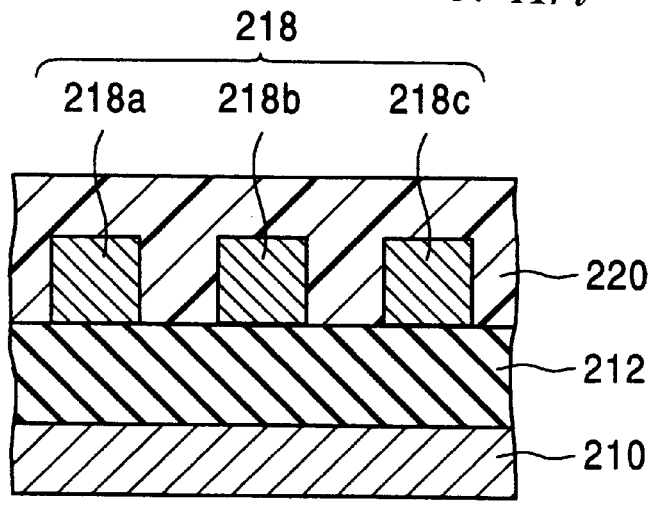
FIG. 1 is a cross-sectional view of a conventional wiring structure with a low dielectric constant film.
Figure 2:
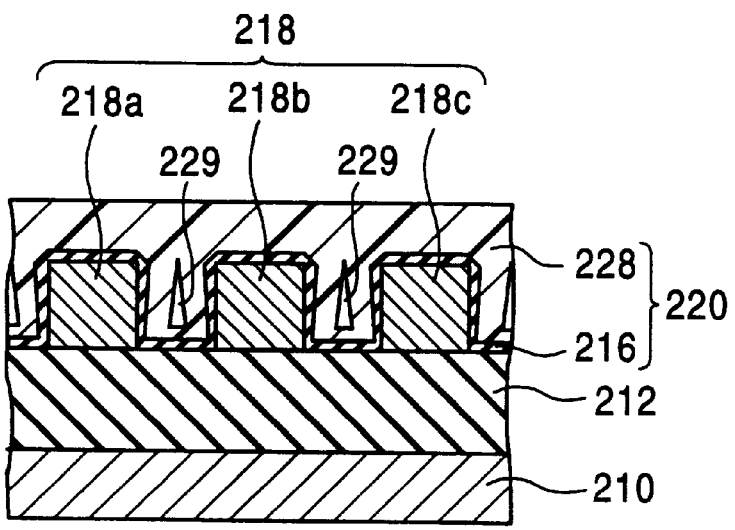
FIG. 2 is a cross-sectional view of a conventional wiring structure with an underlying film.
Figure 17:
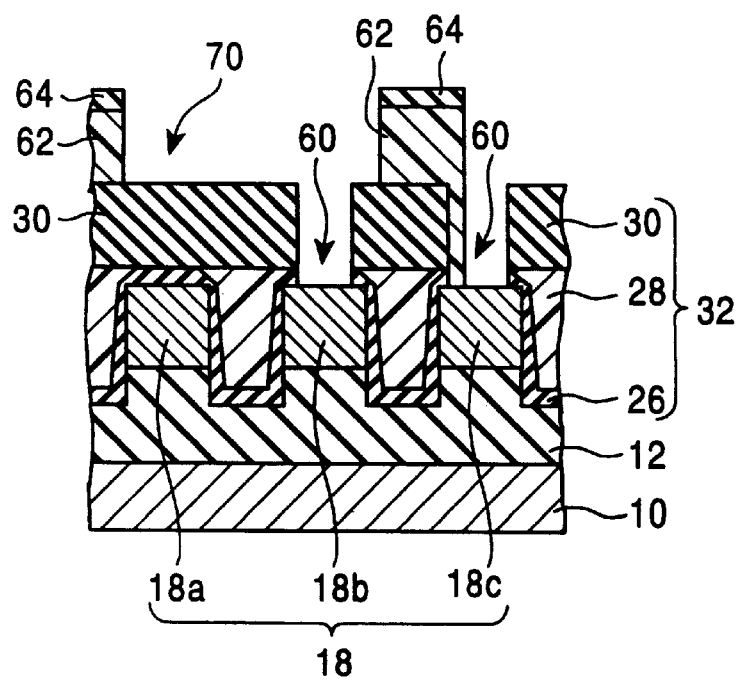
FIG. 17 is a cross-sectional view showing the formation process for the wiring structure according to an embodiment of the invention.

In this embodiment, when forming the grooves 70, apertures are formed in the cap film 64 by anisotropic plasma etching, which uses a fluorine-based gas atmosphere. After that, etching is performed on the low dielectric constant film 62 by an anisotropic plasma etching which uses an oxygen-based gas atmosphere. In the anisotropic plasma etching process, which uses an oxygen-based gas atmosphere, the etching speed of the fluorinated silicon oxide film is very slow so the cap film 30 includes a fluorinated silicon oxide film which is exposed at the bottom of the groove 70 and is barely etched. Therefore, the depth of the grooves 70 is automatically determined by the film thickness of the low dielectric constant film 62. Furthermore, as shown in FIG. 1SE, even though the mask of the grooves 70 is made to be larger than the mask of the via holes 60, the via holes 60 are not enlarged when the grooves 70 are formed. Furthermore, as shown in FIG. 17, even if the mask of grooves 70 is shifted with respect to the via holes 60, the dimensions of the via holes 60 are not enlarged. Thus, the method according to this embodiment has an advantage in that the tolerance for mask misalignment is large.

In this embodiment, the metal film 72 is formed and CMP is performed after the via hole 60 and the groove 70 are formed. Therefore, the plugs 74 and wires of the second wiring layer 22 are simultaneously formed. However, the invention is not limited to this structure. It is also possible to form the metal film and to perform CMP to form plugs 74 in the via holes 60, and to thereafter form the grooves 70 and wires of the second wiring layer 22.

In this embodiment, the cap film 64 is left as part of the intra-layer dielectric layer 66 between the wires of the second wiring layer 22, but the invention is not limited to this structure. For example, by properly setting the conditions of the CMP, it is possible to remove the cap film 64 during the CMP to form the wires of the second wiring layer 22.

In the first interlayer dielectric layer 32 of the structure shown in FIGS. 14A–14C, FIGS. 15D–15F, and FIG. 16G, the low dielectric constant film 28 is formed only in the sections to fill in the spaces between the wires of the first wiring layer 18, and the second wiring layer 22 is formed with the damascene method. Meanwhile, it is also possible to form the wires of the second wiring layer 22 by the damascene process when the low dielectric constant film is formed not only between the wires but also on the top of the wires of the first wiring layer 18.

FIGS. 18A, 18B, and 18C, FIGS. 19D, 19E, and 19F, FIGS. 20G, 20H, and 20I, and FIG. 21J are cross-sectional views showing the formation processes of a wiring structure according to the seventh embodiment of the invention.

Figure 18A:
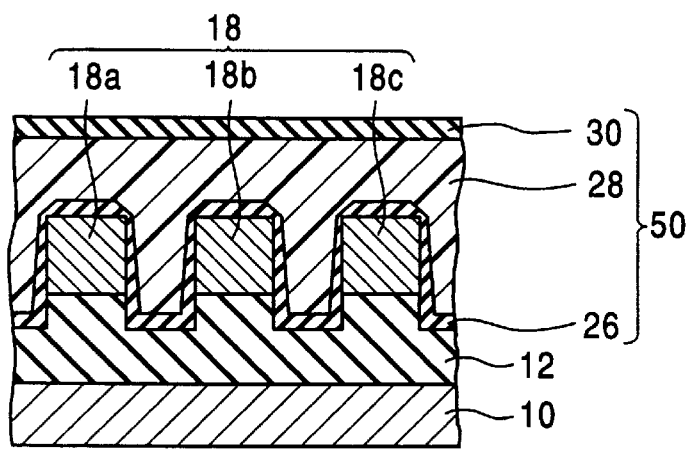
FIGS. 18A, 18B, 18C, 19D, 19E, 19F, 20G, 20H, 20I, and 21 are cross-sectional views showing the formation processes for the wiring structure according to the seventh embodiment of the invention.

As shown in FIG. 18A, and as described in connection with the fourth embodiment, a first wiring layer 18 is formed, and a first interlayer dielectric layer 50, including an underlying film 26, a low dielectric constant film 28, which is formed between and on the wires of the first wiring layer 18, and a cap film 30, are formed. The surface of the low dielectric constant film 28 is planarized. The low dielectric constant film 28 is formed by a material which has poor ashing resistance.

Figure 18B:
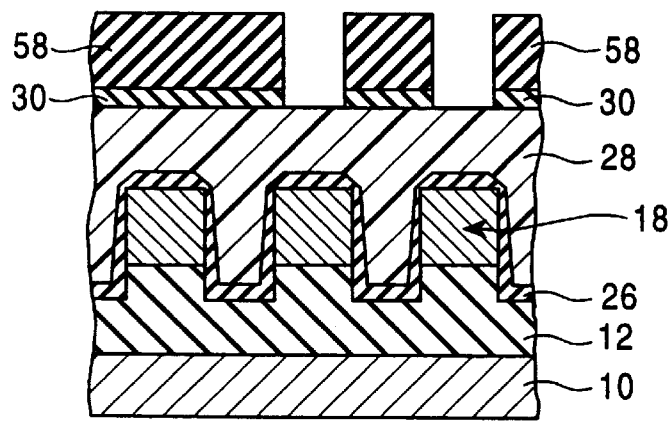
Figure 18C:
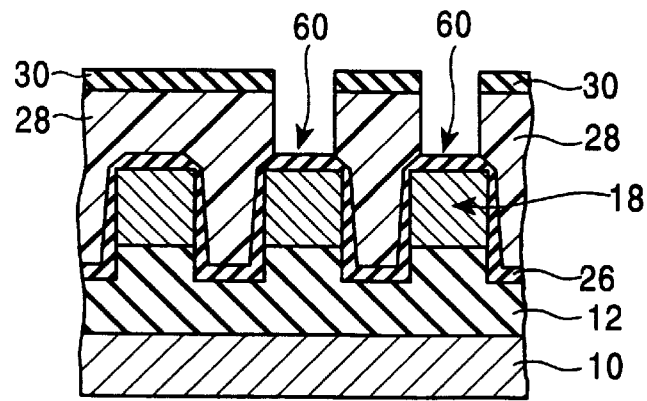

Next, as shown in FIG. 18B, a resist pattern 58 corresponding to via holes is formed and the cap film 30 is removed at portions corresponding to the via holes by anisotropic plasma etching using a fluorine-based gas atmosphere. Then, as shown in FIG. 18C, the via holes 60 are formed in the low dielectric constant film 28 by anisotropic plasma etching using an oxygen-based gas atmosphere. At this time, the cap film 30 functions as a mask.

Figure 19D:
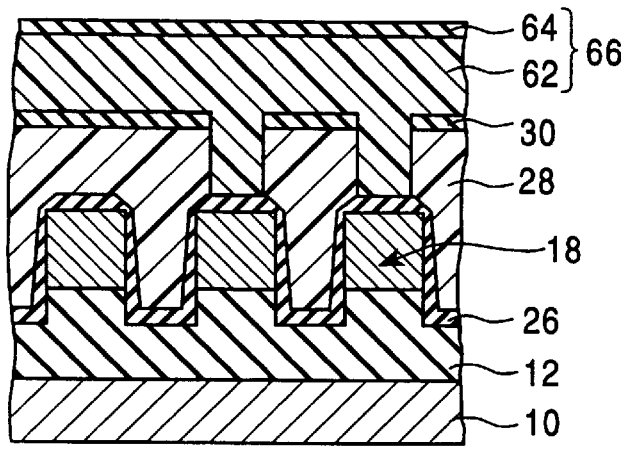

Next, as shown in FIG. 19D, in order to form an intra-layer dielectric layer 66 which insulates between wires of the second wiring layer, a low dielectric constant film 62 and a cap film 64 are formed, in order, over the entire surface of the substrate. For the formation of the low dielectric constant film 62, for example, a coating method is used. The low dielectric constant film 62 is also formed within the via holes 60. Since the surface of the first interlayer dielectric layer 50 is flat, the surface of the low dielectric constant film 62 is also virtually flat.

Figure 19E:
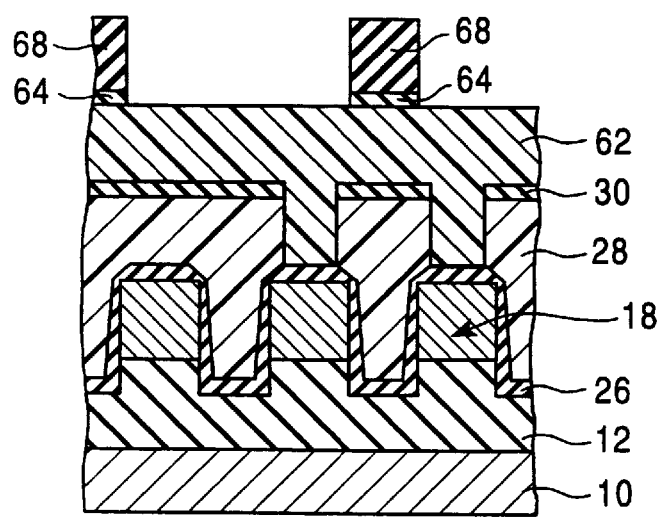

Then, as shown in FIG. 19E, a resist pattern 68 is formed which corresponds to grooves within which wires of the second wiring layer are formed, and etching of the cap film 64 is performed by an anisotropic plasma etching.

Figure 19F:
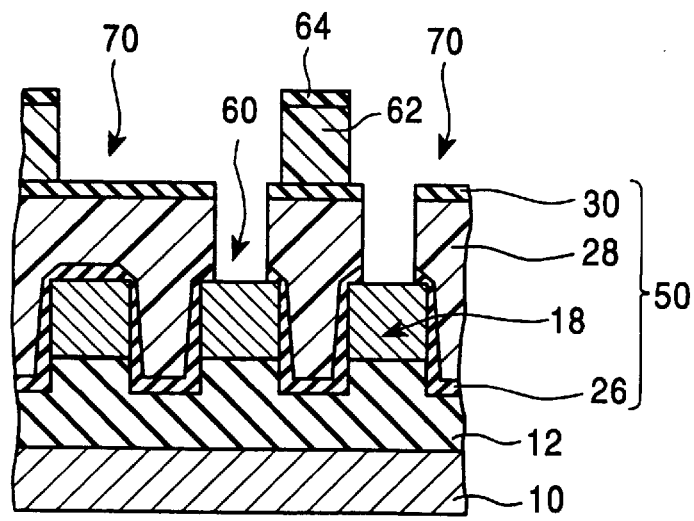

As shown in FIG. 19F, grooves 70 are formed in the low dielectric constant film 62 by anisotropic etching using an oxygen-based gas atmosphere. At this time, the over-etching time is set so that the low dielectric constant film 62, which is formed within the via holes 60, is fully removed. At this time, the cap film 30 of the first interlayer dielectric layer 50 is exposed at the bottom of the grooves 70. The fluorinated silicon oxide film which forms the cap film 30 is practically not etched by the anisotropic plasma etching process for the low dielectric constant film 62. Therefore, it is possible to accurately control the depth of the groove 70. Furthermore, since the cap film 30 functions as a mask, enlargement of the via holes during the formation of the grooves 70 is prevented. Next, anisotropic plasma etching using an fluorine-based gas atmosphere is performed and the underlying film 26 of the first interlayer dielectric layer 50, which is exposed at the bottom of the via holes 60 is removed. As a result, upper surfaces of the wires of the first wiring layer 18 are exposed at the bottom of the via holes 60. At this time, the cap film 30 of the first interlayer dielectric layer 50 and the cap film 64 of the intra-layer dielectric layer 66 are simultaneously etched. FIG. 19F shows an example in which the cap film 30 and 64 remain.

Figure 20G:
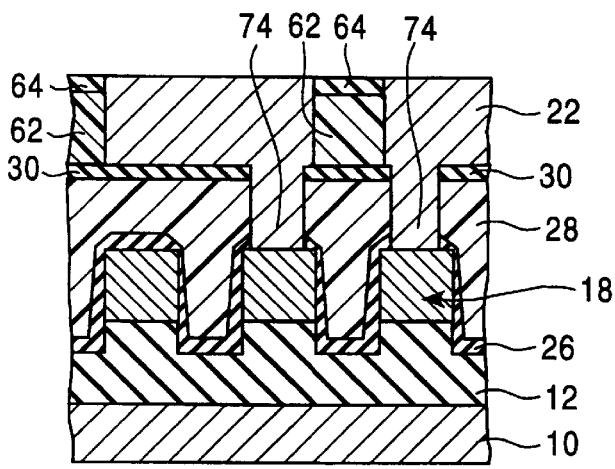

Next, as shown in FIG. 20G, plugs 74 and wires of the second wiring layer 22 are formed within the via holes 60 and the grooves 70 by the damascene method.

Figure 20H:
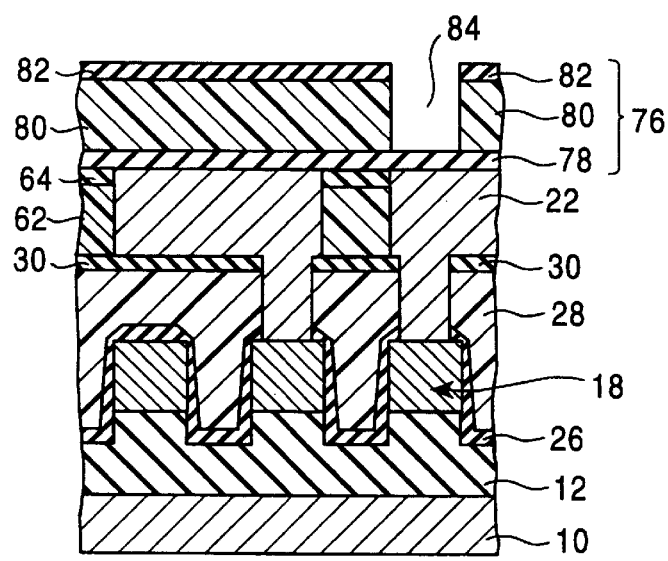
Figure 20I:
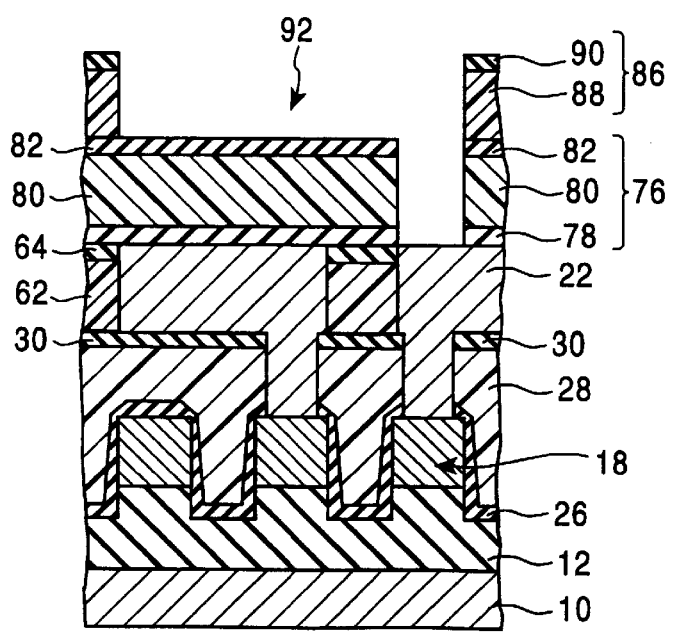
Figure 21J:
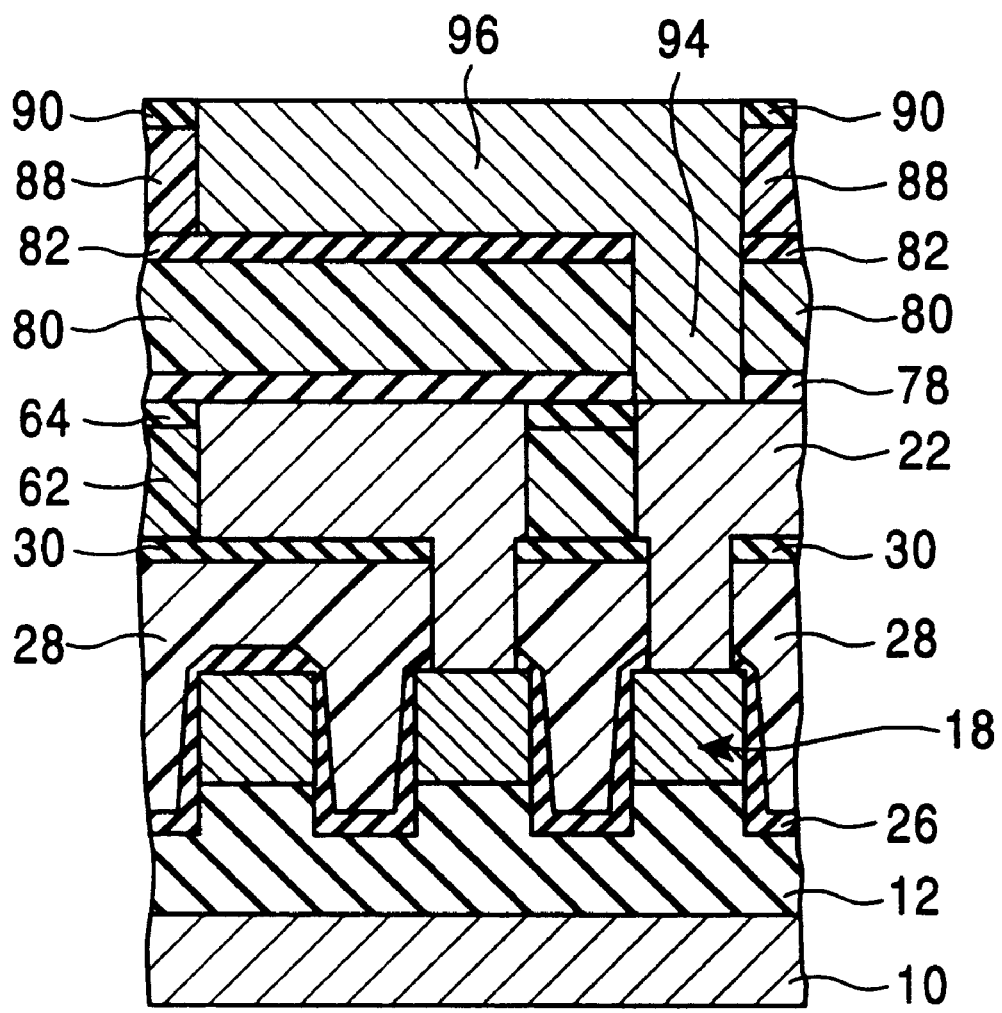

After this, a third and subsequent wiring layers are formed as needed. FIGS. 20H, and 20I and FIG. 21J are examples of formation processes for forming the third wiring layer by the damascene method.

First, as shown in FIG. 20H, in order to form the second interlayer dielectric layer 76, which insulates between the second wiring layer 22 and the third wiring layer, an underlying film 78, a low dielectric constant film 80, and a cap film 82, are formed in order. Then, by the same method as described in connection with the formation of via holes 60 for connecting the wires of the first wiring layer 18 with the wires of the second wiring layer 22, via holes 84 for connecting the wires of the second wiring layer 22 with the wires of the third wiring layer are formed.

Next, as shown in FIG. 20I, in order to form a third intra-layer dielectric layer 86 between wires of the third wiring layer, a low dielectric constant film 88 and a cap film 90 are formed in order. At this time, the low dielectric constant film 88 is also formed within the via holes 84. Then, utilizing the same method as for the formation of the grooves 70 in the second intra-layer dielectric layer, grooves 92 are formed within the third intra-layer dielectric layer. At this time, the underlying film 78 of the second interlayer dielectric layer 76, which is exposed at the bottom of the via hole 84 is removed. This Figure shows an example in which the cap film 82 of the second interlayer dielectric layer 76 at the bottom of the groove 92 and the cap film 90 of the third intra-layer dielectric layer 86 between the wires of the third wiring layer remain.

As shown in FIG. 21J, plugs 94, which connect wires of the second wiring layer 22 with wires of the third wiring layer 96 are formed within the via holes 84, and wires of the third wiring layer 96 are formed in the grooves 92 by the damascene method.

After that, the forth and subsequent wiring layers are formed as needed, a passivation layer and bonding pads are formed and the wafer manufacturing process of the semiconductor integrated circuit is completed.

In this embodiment, films of materials which have poor ashing resistance are used for the low dielectric constant films 28, 62, 80, and 88, and via holes 60 and 84 and grooves 70 and 92 are formed by anisotropic etching using an oxygen-based gas atmosphere, using cap films 30, 64, 82, and 90 as masks. However, the invention is not limited to this. It is also possible to form the low dielectric constant films 28, 62, 80, and 88 from materials resistant to the ashing, e.g. siloxane SOG and to form the via holes 60 and 84 and the grooves 70 and 92 by an anisotropic plasma etching using a fluorine-based gas atmosphere with resist masks. In this case, it is possible to omit the cap films 30, 64, 82, and 90.

In this embodiment, the via holes 60 and 84 and grooves 70 and 92 are formed using anisotropic etching using an oxygen-based gas atmosphere. In the anisotropic etching using an oxygen-based gas atmosphere, the resist is also etched. Therefore, separate resist removal procedures can be omitted by simultaneously removing the resist pattern during the etching process for the formation of the via holes 60 and 84 and the grooves 70 and 92. For this purpose, it is preferable to set film thickness of the low dielectric constant films 28, 62, 80, and 88 and the resist and the plasma etching conditions to be such that, upon the completion of the etching of the low dielectric constant films 28, 62, 80, and 88, the removal of resist is already finished. Even if the removal of the resist pattern is completed first, the dimensional accuracy of the via holes 60 and 84 and grooves 70 and 92 does not deteriorate because the cap films 30, 64, 82 and 92 exist on the low dielectric constant films 28, 62, 80, and 88 and function as masks.

In this embodiment, when via holes 60 and 84 and grooves 70 and 92 are formed, the surface of the substrate is flat. Therefore, even if the film thickness of the resist for forming resist patterns 58, 68, and the like are thin, the resist can be uniformly coated. By making the resist film thin, the process of simultaneously performing resist removal and etching of the via holes 60 and 84 and the grooves 70 and 92 becomes easier as described above. Further, it is possible to improve the resolution by decreasing the resist thickness. For example, it is easy to make the resist film thickness as thin as about 0.5 $\mu$m or less, and it is even possible to make them as thin as about 0.3 $\mu$m or less. In order for the removal of the resist to be finished upon the completion of etching of the low dielectric constant film, the film thickness of resist should be equal to or less than the film thickness of the low dielectric constant film to be etched. That is, in the case of the formation of the via holes 60 and 84, the resist film thickness should be equal to or less than the depth of the via holes, and in the case of the formation of the grooves 70 and 92 the resist film thickness should be equal to or less than the total of the depths of the grooves and via holes. Preferably, the resist film thickness should be about 70% or less; more preferably about 50% or less; most preferably about 30% or less of the depth of the via holes or the total of the depths of the grooves and via holes.

In this embodiment, the via holes 60 are formed in the low dielectric constant film with the underlying film 26 of the first interlayer dielectric layer 50 remaining. After that, when the grooves 70 are formed in the second intra-layer dielectric layer 66, the underlying film 26 at the bottom of the via holes 60 is removed. However, it is also possible to remove the underlying film 26 at the bottom of the via holes 60 by anisotropic etching using an fluorine-based gas atmosphere after the formation of the via holes 60 in the first interlayer dielectric layer.

Also, in this embodiment, the cap film 64 remains on the surface of the second intra-layer dielectric layer 66, but the invention is not limited to this structure. For example, it is possible to remove the cap film 64 when removing the underlying film 26 exposed at the bottom of the via holes 60. By removing the cap film 64 between the wires of the second wiring layer 22, the capacitance between the wires of the second wiring layer 22 is further reduced. In this case, it is required to appropriately set the CMP conditions to form the second wiring layer 22, so that the surface of the low dielectric constant film 62 is not damaged. In this embodiment, the cap film 64 of the second intra-layer dielectric layer 66 remains when the second wiring layer 22 is formed. However, it is also possible to remove the cap film 64 by changing the condition of the CMP used for forming the second wiring layer 22. At least in this case, it is possible to form the cap film 64 by a material with a low CMP speed, such as silicon nitride or the like. The cap film 64 which includes a material of this type can be used as an etching stop for the CMP. By using the etching stop film, even when the over-etching amount becomes large due to the fluctuation of the process conditions, it is possible to prevent damaging the surface of the low dielectric constant film 62. Because silicon nitride has a higher dielectric constant than silicon oxide, it is preferable to remove the silicon nitride film after it is used as the etching stop film to reduce the capacitance between the wires.

In the embodiment shown in FIGS. 18 through 21, after via holes 60 are formed in the first interlayer dielectric layer 50, the intra-layer dielectric layer 66 is formed and the groove 70 is formed in the intra-layer dielectric layer 66. However, the invention is not limited to this. For example, it is possible to form via holes 60 in the first interlayer dielectric layer 50 after grooves 70 are formed in the intra-layer dielectric layer 66.

FIGS. 22A, 22B, and 22C and FIGS. 23D and 23E are cross-sectional views showing the formation processes of the wiring structure in this latter case.

Figure 22A:
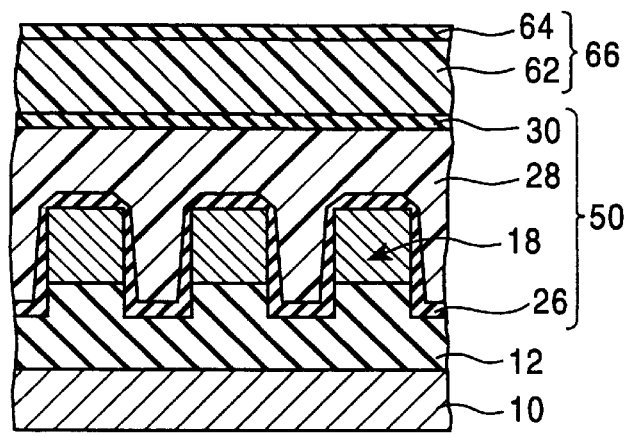
FIGS. 22A, 22B, 22C, 23D and 23E are cross-sectional views showing the formation processes of the wiring structure according to another embodiment of the invention.

First, as shown in FIG. 22A, using the same processes of the previous embodiment, a first wiring layer 18, a first interlayer dielectric layer 50 including an underlying film 26, a low dielectric constant film 28, which is formed between and on wires of the first wiring layer 18, and a cap film 30 are formed. After that, a low dielectric constant film 62 and a cap film 64, which form a second intra-layer dielectric layer 66 that insulates between wires of the second wiring layer, are formed on the first interlayer dielectric layer 50.

Figure 22B:
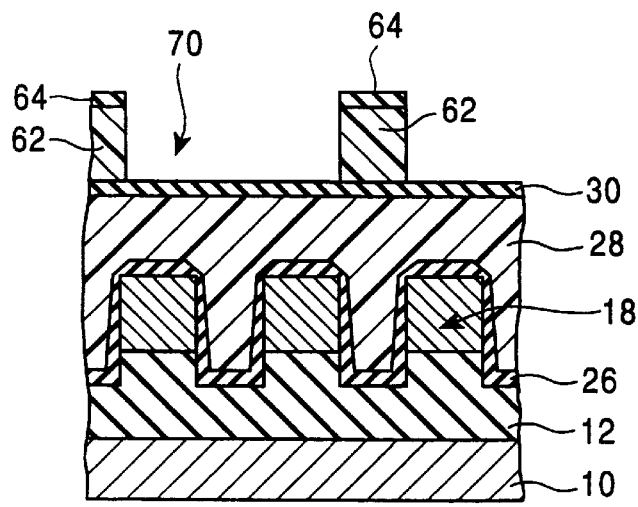

Next, as shown in FIG. 22B, a resist pattern corresponding to grooves in which wires of the second wiring layer will be formed is formed, apertures are formed in the cap film 64 by anisotropic plasma etching using a fluorine-based gas atmosphere, and grooves 70 are formed in the low dielectric constant film 62 by an anisotropic plasma etching using an oxygen-based gas atmosphere.

Figure 22C:
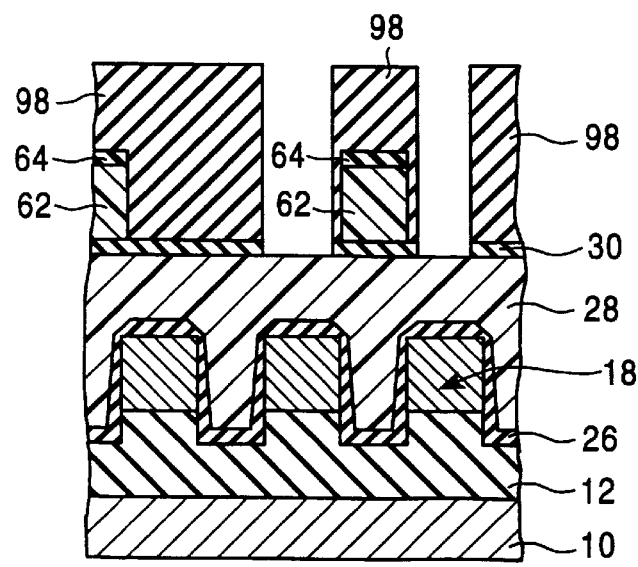

Then, as shown in FIG. 22C, a resist pattern 98 corresponding to the via holes is formed and exposed portions of the cap film 30 of the first interlayer dielectric layer 50 are removed by an anisotropic plasma etching using a fluorine-based gas atmosphere.

Figure 23D:
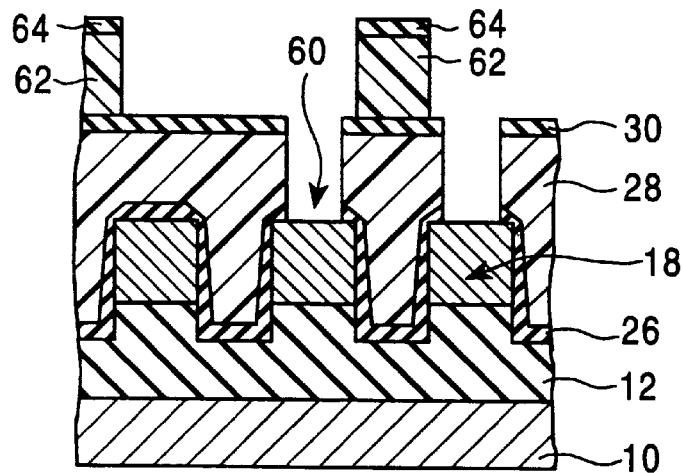

Next, as shown in FIG. 23D, the low dielectric constant film 28 is etched by anisotropic plasma etching using an oxygen-based gas atmosphere, and the via holes 60 are formed by removing the underlying film 26 by performing an anisotropic plasma etching which uses a fluorine-based gas atmosphere.

Figure 23E:
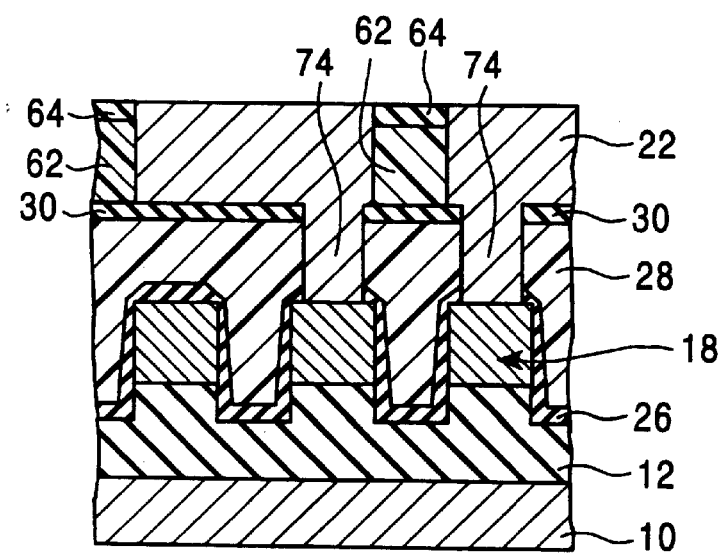

As shown in FIG. 23E, via plugs 74, for connecting the second wiring layer 22 and the first wiring layer 18, and wires of the second wiring layer 22 are formed by the damascene process.

After this, the third and subsequent wiring layers are formed as needed, the passivation layer and bonding pads are formed, and the wafer manufacturing process of the semiconductor integrated circuit is completed.

In the previously explained embodiments, the low dielectric constant film 28 of the first interlayer dielectric layer 50 is exposed on the side walls of the via holes 60 and the low dielectric constant film 62 of the second intra-layer dielectric layer 66 is exposed on the side walls of the grooves 70. The metal film for forming the second wiring layer 22 and the plugs 74 between the first and the second wiring layer is deposited in these via holes 60 and grooves 70. As a result, the plugs 74 contact the low dielectric constant film 28 exposed on the side walls of the via holes 60 and the wires of the second wiring layer 22 contact the low dielectric constant film 62 exposed on the side walls of the grooves 70. Similarly, the plugs 94 between the second and third wiring layers contact the low dielectric constant film 80 of the second interlayer dielectric film on the side walls of the via holes 84 and the wires of the third wiring layer 96 contact the low dielectric constant film 88 of the third intra-layer dielectric-layer on the side walls of the grooves 92. Depending on the materials of the low dielectric constant films and on the process conditions, however, the low dielectric constant films may have a bad influence on the plugs and wires. For example, the low dielectric constant films may include a substantial amount of water. In such cases, it is preferable to avoid the direct contact of the plugs and wires with the low dielectric constant films.

Figure 24A:
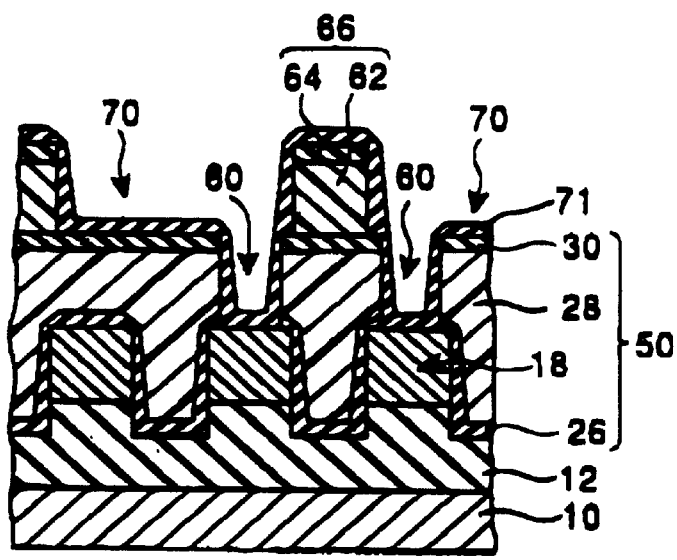
FIGS. 24A, 24B, and 24C are cross-sectional views showing the formation processes for the wiring structure according to another embodiment of the invention.
Figure 24B:
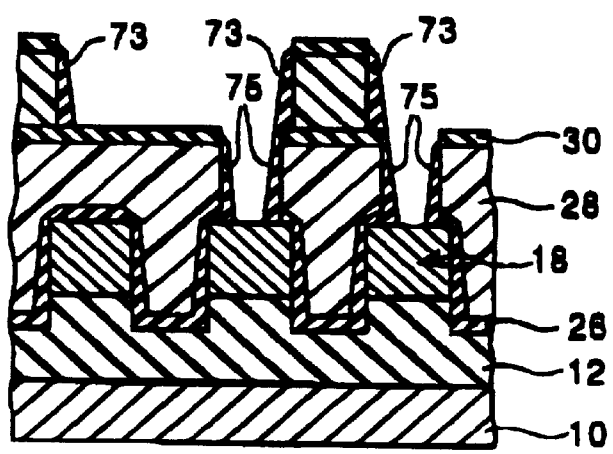

FIGS. 24A and 24B are cross-sectional views showing the formation processes of the wiring structure in which plugs and wires are not directly contact the low dielectric constant films.

First, following similar processes as described in connection with the previous embodiments, a structure, such as shown in FIGS. 19F and 23D, having a first wiring layer 18, a first interlayer dielectric layer 50 including an underlying film 26, a low dielectric constant film 28, which is formed between and on the wires of the first wiring layer 18; and a cap film 30, a second intra-layer dielectric layer 66 including a low dielectric constant film 62 and a cap film 64, via holes 60, formed in the first interlayer dielectric layer 50, and grooves 70 formed in the second intra-layer dielectric layer 66 are formed. Next, as shown in FIG. 24A a cover film 71 of, for example, fluorinated silicon oxide is deposited on the surface of the substrate including the side walls of the via holes 60 and the side walls of the grooves 70. The cover film is formed by, for example, high density plasma CVD with a substrate bias.

After that, the cover film 71 is etch-backed by using, for example, an anisotropic plasma etch using a fluorine-based gas atmosphere, such that the cover film is removed at portions on the bottoms of the via holes 60 and the grooves 70. As a result, as shown in FIG. 24B, side wall films 73 on the side wall of the grooves 70 and side wall films 75 on the side walls of the via holes 60 are formed. The side wall films 73 cover the low dielectric constant film 62 exposed on the side walls of the grooves 70, and the side wall films 75 cover the low dielectric constant film 28 exposed on the side walls of the via holes 60.

Figure 24C:
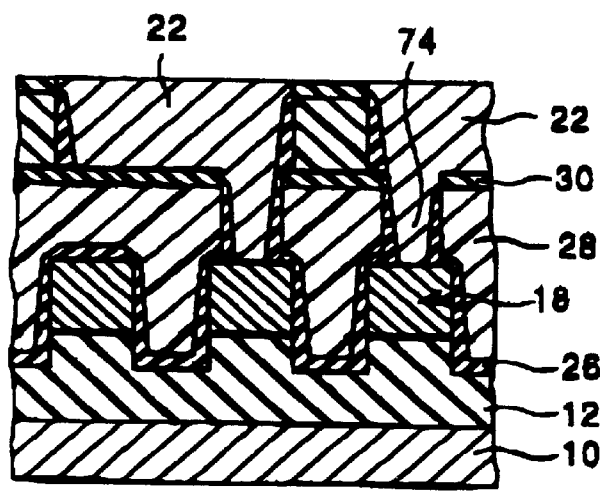

Then, as shown in FIG. 24C, plugs 74 in the via holes 60 and wires of the second wiring layer 22 in the grooves 70 are formed by the damascene method. In this structure, since the side walls of the via holes 60 and the grooves 70 are covered with the side wall films 75 and 73, the plugs and wires do not contact the low dielectric constant films 28 and 62.

The same process can be repeated to form the third and subsequent wiring layers with side wall films formed on the side walls of the via holes and grooves.

In this embodiment, the side wall films are formed by depositing a cover film using high density plasma CVD with a substrate bias followed by an anisotropic etch-back. Therefore, even when the side walls of the via holes 60 and the grooves 70 are formed substantially vertical, substantial portions of surfaces of the side wall films have uniform positive slopes, except for portions around top edges of the via holes and grooves. In other words, the thickness of the side wall film on upper portions of the side walls is thinner than that on lower portions of the side walls. The positive slope facilitates the filling of the metal films in the via holes 60 and the grooves 70 even when the dimensions of the via holes and grooves become small. The slope is preferably about 2° or more, more preferably about 4° or more, or most preferably about 6° or more with respect to the normal of the main surface of the semiconductor substrate to sufficiently improve the filling ability of the metal film. However, it is not preferable to increase the slope too large, for example, more than about 8°, so that a sufficient volume of the via hole or the groove remains to fill with the metal film.

The sloped side wall film is particularly effective to facilitate metal deposition into the via holes and grooves when particular methods are utilized to deposit the metal film. For example, a thin and uniform diffusion barrier layer of a titanium/titanium nitride bi-layer, titanium nitride, tantalum, tantalum nitride, tungsten nitride or the like can be deposited by ionized sputtering on the sloped side wall films formed by high density plasma CVD with a substrate bias. This is because both high density plasma CVD and ionized sputtering utilize ions accelerated by substrate biases. Ionized sputtering can also be preferably used to form a thin copper film on the diffusion barrier film. This copper film is used as a seed layer to deposit a thick copper film which fills the via holes and/or grooves by plating. The seed layer is also needed to form other low resistance metal films such as a gold film by plating.

Further, in this embodiment, side wall films are formed from a cover film deposited by high density plasma CVD. Silicon oxide deposited by high density plasma CVD has the ability to suppress water diffusion better than a film deposited by, for example, conventional plasma CVD. As described previously, the addition of fluorine to the film further improve the ability to suppress water diffusion, as long as the fluorine content is limited to the range that a substantial amount of Si(—F)$_2$ bonds are not included. Therefore, it is possible to decrease the thickness of the side wall film while keeping the ability to suppress the water diffusion from the low dielectric constant film. Thus, it is possible to improve the filling ability of the metal film in the via holes 60 and the grooves 70 with small dimensions. For example, the minimum thickness of the side wall film around the top level of the low dielectric constant film 28 can be reduced to about 15 nm or less. In some cases, it can be reduced to about 10 nm or less. Even other cases, it can be reduce to about 5 nm or less.

Furthermore, in this embodiment, the side wall films are formed with a fluorinated silicon oxide film which has a lower dielectric constant than silicon oxide. Therefore, the capacitance between the wires can be further reduced compare to the case that the side wall films are made with a material having a higher dielectric constant, such as silicon oxide, silicon nitride, and the like.

In this embodiment, the side wall films are simultaneously formed both on the side walls of the via holes 60 and the grooves 70. That is, the cover film is deposited after the via holes and grooves are formed and the anisotropic etch-back is performed to form the side wall films on the side walls of the via holes and grooves. However, the side walls films for the via holes and the grooves can be formed in separate processes. Further, it is not always necessary to form side wall films both on the side walls of the via holes and the grooves.

In this embodiment, a cover film 71 is formed by depositing a fluorinated silicon oxide film by high density plasma CVD with a substrate bias, and side wall films 75 and 73 are formed by an etch-back of the cover film 71. The following three advantages can be obtained:

1) Side wall films with positively sloped surfaces can be formed, thereby, improving the filling ability of the metal film in the via holes and the grooves.
2) The thickness of the side wall film can be reduced while maintaining the ability to suppress water diffusion thereby improving the filling ability of the metal film in the via holes and the grooves.
3) Side wall films with a low dielectric constant can be formed, thereby, reducing the capacitance between the wires.

However, to obtain the first two advantages, films of various other materials can be used. For example, a silicon oxide, a silicon nitride or a silicon oxynitride film can be used to form the cover film 71. These films can be preferably deposited by a high density plasma CVD with a substrate bias.

In the previously explained embodiments, for the first wiring layer 18, an aluminum-based wiring formed by an etching method is used. For the second wiring layer 22, a copper-based wiring formed by the damascene method is used. However, the invention is not limited to these methods.

In conventional semiconductor integrated circuits, aluminum-based wiring formed by an etching method is usually used. It is possible to form an aluminum-based wiring by the damascene process, but the introduction of new equipment, such as a CMP apparatus and the like, is needed so it is generally preferable to use conventional etching methods to form an aluminum-based wiring. Meanwhile, it is difficult to form copper-based wiring by etching methods, so it is preferable to form it by the damascene method. The damascene method can be also preferably used to form other low resistance material wiring such as a gold- and silver-based wiring. It can be also used to form a tungsten-based wiring.

In the wiring structure according to the invention, it is possible to provide either an aluminum-based wiring layer or a copper-based wiring layer, or plural layers of both wiring. It is also possible to provide other wiring, e.g. a tungsten-based wiring. The tungsten-based wiring can be formed in small dimensions, although the resistance is relatively high. The tungsten-based wiring can preferably be used for bit line wiring in a DRAM cell array, local wiring in a SRAM cell array, and the like (e.g. T. Ueda et al., Symposium on VLSI Technology Digest of Technical Papers (1996) p. 142, K. Furumochi et al., International Solid State Circuits Conference Digest of Technical Papers (1996) p. 156). Aluminum-based wiring is widely used in conventional semiconductor integrated circuits and can be formed at low cost. Since it has a lower resistance than tungsten-based wiring, aluminum-based wiring is generally used for signal wiring, power wiring, and the like. Copper-based wiring has lower a resistance than that of the aluminum-based wiring, so it is possible to improve the operational speed of a semiconductor integrated circuit if, for example, it is used for long distance signal wiring, for example, wiring with a length of more than about 1 mm. It is also possible to improve the operational speed by reducing discrepancies in the operation timing in the semiconductor integrated circuit chip due to the delay of a clock signal if a copper-based wiring is used for the wiring for clock signal distribution. It is also possible to improve operation stability by improving the power supplying capability if it is used for the power bus wiring. Further, because the copper-based wiring has a higher electromigration tolerance, the dimension of the wires can be reduced without degrading the reliability, if it is used for wires to carry large currents. As a result, the chip size of the integrated circuit can be reduced.

As described above, by using copper-based wiring, it is possible to improve the performance of the semiconductor integrated circuit. However, copper-based wiring technology has not yet matured into mass production. Various problems remain to be solved in terms of the influence on transistor characteristics, productivity, cost, yield, and the like. Although these problems may be solved technically, it is necessary to develop apparatuses for implementing the copper film forming process and the damascene process in order to facilitate mass production. In particular, since Cu has the possibility of degrading transistor characteristics, apparatuses for copper-based wiring processes should be carefully arranged in a clean room in order to minimize the risk of contaminating sensitive processes, for example, gate processes, by copper. Therefore, it is difficult to produce large amounts of LSI's having a copper-based wiring by renovating an existing production factory. Furthermore, in the case that a new factory is constructed, since the copper-based wiring processes have not yet fully matured, the cost for the apparatus and process development becomes high. Moreover, the material cost is also high compared to utilization of aluminum-based wiring.

Due to the reasons described above, at least at present, copper-based wiring has a disadvantage in terms of the cost compared to aluminum-based wiring. Accordingly, although there is a demand for semiconductor integrated circuits with high performance using copper-based wiring, there is an even larger demand for semiconductor integrated circuits produced at low cost which do not use copper-based wiring, i.e., using only an aluminum-based wiring, or an aluminum-based wiring combined with a tungsten-based wiring, and the like. A manufacturer of semiconductor integrated circuits is required to meet demands, such as this situation. In particular, in the ASIC (Application Specific Integrated Circuit) field of gate arrays, standard cells, embedded cell arrays, and the like, flexible production with lower costs, which meet various customers' demands is desirable. In order to meet these requirements, it is necessary to produce products which do not use copper-based wiring and to produce products which do use a copper-based wiring in a condition in which these two products mutually complement and support each other.

In theory, in a gate array type ASIC, it is possible to produce a product to meet various customers' demands by using basic cells each of which includes a predetermined number of transistors arranged in a predetermined shape. However, in reality, if the entire necessary circuit blocks are developed after receiving orders from individual customers, the development time becomes longer and the development cost becomes higher. Furthermore, if a sufficient development time is not ensured, it is difficult to develop a product with an acceptable performance. In order to solve this problem, it is necessary to develop in advance not only the basic cell but also circuit blocks to realize commonly used finctions, such as an adder, a multiplier, SRAM, CPU, DSP, and the like, and to store these function blocks as macro cells. When receiving an order from a customer, by selecting the appropriate macro cells, and combining them with a newly designed circuit blocks using the basic cells, it is possible to shorten the development time and reduce the development cost. In other words, it is necessary to prepare a macro cell library comprising many macro cells that can be used in various applications with high performances in order to attain a high competitiveness and provide products which satisfy customers' various demands at lower development cost and with shorter development time.

In gate arrays, macro cells are formed using transistors in basic cells. Meanwhile, in standard cells and embedded cell arrays, macro cells are formed using individually designed transistors. In the standard cell and the embedded cell array, the importance of a well-prepared macro cell library is even higher than the case of the gate array, because the required function is primarily realized by combining the macro cells in the library.

In order to develop a large number of macro cells for products with a copper-based wiring separately from those for products without a copper-based wiring, extra development time and costs will be incurred. Accordingly, it is preferable to use, as much as possible, the same macro cell for both products with and without a copper-based wiring. In reality, ASIC makers have been using the aluminum-based wiring as a premise, and have libraries comprising many macro cells designed and verified i.e., tested and confirmed that the cell has a sufficient performance for the intended purpose, using the aluminum-based wiring as the premise. Furthermore, in recent years, macro cells have come to be more widely used in common as IPs (Intellectual Properties) among manufactures. By sharing macro cells with high performance, which many users need, interchangeability among manufactures and the convenience of users is improved and the burden of the macro cell development upon individual manufactures is reduced. Therefore, it is desirable to use macro cells designed and verified upon the premise of the aluminum-based wiring i.e., without using a copper-based wiring in products with a copper-based wiring, while keeping the cost low, and utilizing the low resistance and high electromigration tolerance of the copper-based wiring. It is also desirable to keep compatibility of IPs among products with and without a copper-based wiring.

The following discussion describes the considerations which are made to determine whether and under what conditions in copper-based wiring is most effectively utilized.

First, for the following reasons', use of the copper-based wiring for connections within circuit blocks or macro cells is not very effective.

First, in a small-scale macro cell, even though the wiring resistance is reduced by replacing an aluminum-based wiring with a copper-based wiring, performance is barely improved. The main reason is that performance is mainly determined by the performance of the transistor and the wiring capacitance. Meanwhile, in large-scale macro cells, there are cases in which the wiring resistance influences the performance. In macro cells such as this, by replacing an aluminum-based wiring with a copper-based wiring, there is a possibility that performance can be improved. However, as long as the macro cells are designed on the premise of the aluminum-based wiring, there is a low possibility that a significant performance improvement can be realized by simply replacing the aluminum-based wiring with a copper-based wiring. In other words, various modifications and optimizations of the cell are needed to significantly improve performance by fully utilizing the advantages of copper-based wiring.

In addition, in order to implement copper-based wiring in macro cells which are designed on the premise of aluminum-based wiring, it is necessary to fabricate test devices, evaluate the characteristics of the test devices, and confirm that the necessary characteristics are obtained before using the macro cell in an actual product with a copper-based wiring. Although significant changes in the characteristics are not anticipated from the differences in the wiring resistance between the aluminum-based wiring and the copper-based wiring, changes in the production process may result in unpredictable changes in the characteristics. The reason is that significant changes beyond just the change of materials occur in the process by replacing the aluminum-based wiring that uses an etching process with a copper-based wiring that uses the damascene process.

Furthermore, it is known that copper produces a deep level in silicon. Because of this, there is a concern that copper atoms in the wiring may be diffused in a transistor and the characteristics of the transistor may deteriorate. Needless to say, to prevent this phenomena, a diffusion barrier layer comprising a titanium nitride film or the like can be used in the formation of the copper-based wiring. However, a special attention is needed when lower wiring layers close to transistors are made with the copper-based wiring. Even though there may in reality be no problem of deterioration of the transistor due to the copper diffusion, it is necessary to evaluate and confirm the influence of the copper-based wiring upon the performance and reliability of the transistor before it is actually used for a product. It normally takes several months or more to complete the evaluation.

Accordingly, unless a significant improvement in performance that compensates for the cost of carrying out this type of evaluation and confirmation procedures, replacing aluminum-based wiring in a macro cell with copper-based wiring has little value.

Needless to say, if the wiring dimensions are reduced on the premise of low resistance and high electromigration tolerance of the copper-based wiring, it is possible to reduce the macro cell area and improve the performance. However, to implement this, it is necessary to newly perform a mask design and to manufacture test devices and perform operation tests. In order to carry out these procedures, it usually takes several months or more. It is possible that only the important macro cells are re-designed and verified on the premise of the copper-based wiring in order to make a smaller library for use in products with the copper-based wiring. However, it is not realistic to re-design and verify all of the macro cells in a library in order to implement them into products with a copper-based wiring, because too much time and cost is needed.

On the other hand, significantly improved performance can be obtained by replacing aluminum-based wiring with copper-based wiring in the following applications:

1) Long-Distance Signal Wiring

For the wiring within a macro cell or other circuit blocks, the wiring distance is merely from about 100 μm to about several mm. Meanwhile, the wiring between circuit blocks or between I/O cells, which carry out signals to and/or carry in signals from the outside of the integrated circuit, and circuit blocks has a length of the order of 1 mm or, in some cases, in the order of the chip dimensions of the integrated circuit (1 cm or more). Wiring resistance and capacitance are proportional to the wiring length, so wiring for long distances, as described above, produces a large resistance and capacitance. This causes large signal delays and often limits the operational speed of the entire integrated circuit.

By reducing the wiring resistance by utilizing copper-based wiring with low resistance for long distance signal wiring, or by reducing the wiring capacitance through decreasing the dimensions by utilizing the low resistance of the copper-based wiring, it is possible to reduce signal delay and improve the operational speed of the integrated circuit. Needless to say, for this type of long distance signal wiring, use of the copper-based wiring in combination with the wiring structures of the invention, which reduces the capacitance between the wires and/or between wiring layers, further improves the operational speed.

2) Clock Wiring

Many circuit blocks within an integrated circuit operate synchronously with a common clock signal. However, the clock wiring, which distributes this clock signal throughout the integrated circuit, is generally as long as or even longer than the chip dimensions, i.e., about 1 cm or more and has large resistance and capacitance. Therefore, due to the delay of the clock signal in the clock wiring, a difference in the clock timing (so-called "skew") occurs when the clock signal is transmitted to different circuit blocks in an integrated circuit. As a result, synchronous operation may fail. When a larger margin is given in the timing in order to ensure synchronous operation, the operational speed deteriorates.

By reducing the resistance utilizing copper-based wiring and/or by reducing capacitance through the reduction of the wiring dimensions of the clock wiring, skew of the clock signal between the circuit blocks disposed in various positions of a chip can be reduced. This can result in an improvement of operational speed. Needless to say, for this clock wiring, the use of copper-based wiring in combination with the wiring structures disclosed in this application to reduce the capacitance between the wires and between the wiring layers further improves operational speed.

3) Power Bus Wiring

In order to operate an integrated circuit, it is necessary to provide electric power for all of the elements in the integrated circuit. To provide the electric power, wires are hierarchically provided, and the wires which are commonly provided in order to provide electric power for many elements in an integrated circuit is generally called power bus. For example, U.S. Pat. No. 4,511,914 discloses an example of a power bus which is provided in a grid-like manner in order to provide power for basic cells in a gate array. U.S. Pat. No. 5,040,144 discloses an example of a power bus which is provided in a grid-like manner in order to provide power for a memory cell array.

Such power bus wiring has a length of the order or more than the chip dimension, i.e., 1 cm or more. Furthermore, in order to provide electric power for many elements, a large amount of direct current, more accurately, pulsating current flows. Because of this, there is a high possibility that electromigration failure may occur. Moreover, when many elements operate simultaneously, a large voltage drop may occur due to the resistance of the bus wiring thus resulting in operation failure.

Use of copper-based wiring with low resistance and high electromigration tolerance as power bus wiring has a significant effect to solve these problems.

In conventional integrated circuits, multilevel wiring, including two or more wiring layers, is commonly used. For the connection within circuit blocks, such as macro cells, first and second aluminum-based wiring layers including wires that cross in mutually orthogonal directions, for example, are mainly used. Wires in these wiring layers are mainly used to connect between transistors within a circuit block. In some cases, one or more additional aluminum-based wiring layers are further provided on these wiring layers.

Accordingly, it is possible to use, for example, two aluminum-based wiring layers, which are used to make connections within the macro cell as they are, and add one or more layers of the copper-based wiring. The copper-based wiring can be preferably used for the long-distance signal wiring, clock wiring, power bus wiring, or the like.

When macro cells use more than two aluminum-based wiring layers, it is possible to use these wiring layers as they are, and add one or more copper-based wiring layers on top of these layers. When the upper-most aluminum-based wiring layer or layers, for example, the third wiring layer, is mainly used for limited purposes, for example, for the connection between circuit blocks within a macro cell, it is possible to replace this wiring layer with a copper-based wiring layer. If only the upper-most wiring layer or layers remote from the transistor are replaced with a copper-based wiring layer or layers, the possibility of degradation of the transistor due to the diffusion of copper is small.

Figure 26A:
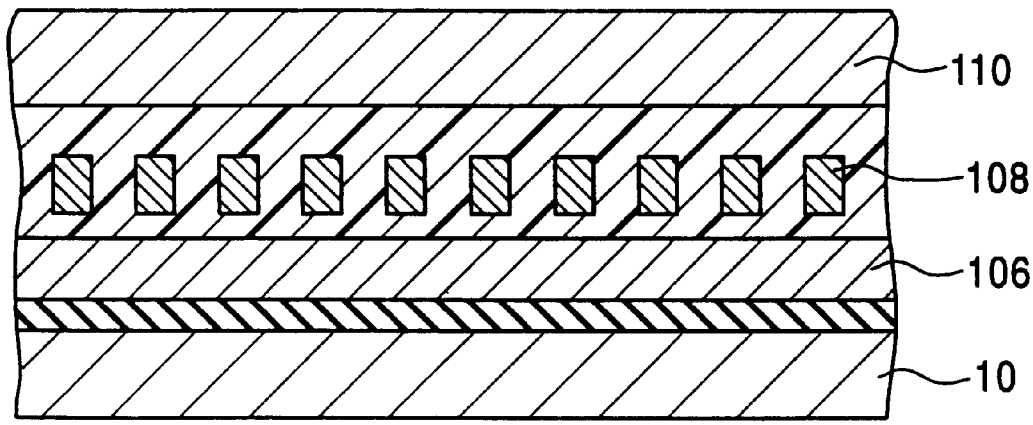
FIGS. 26A and 26B are cross-sectional views showing examples of wiring layer structures of products with and without Cu-based wiring layers.
Figure 26B:
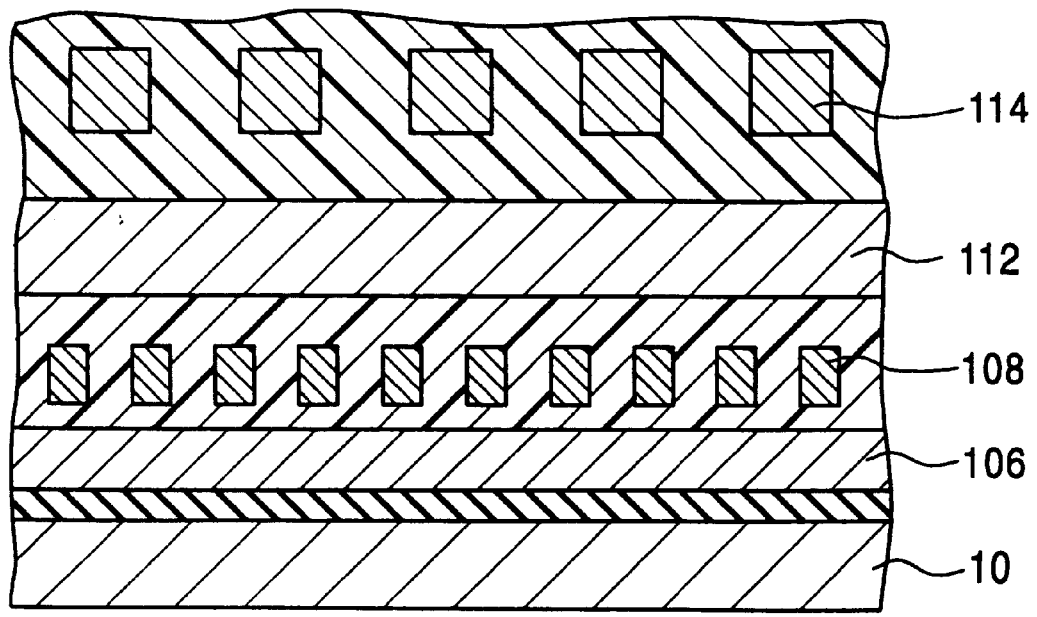

FIGS. 26A and 26B are cross-sectional views of one example of a wiring layer structure for products without and with a copper-based wiring, respectively. FIG. 26A is a wiring layer structure without a copper-based wiring. Above the surface of a silicon substrate 10, first, second, and third aluminum-based wiring layers, 106, 108, and 110 are formed in order from the bottom. Interlayer dielectric layers are formed between the silicon substrate 10 and the first wiring layer 106, and between the respective wiring layers. Under the first aluminum-based wiring layer 106, a tungsten-based wiring layer, for example, may be provided. In order to connect within respective circuit blocks, closely spaced wires formed in mutually orthogonal directions in the two aluminum-based wiring layers 106 and 108 are mainly used. The third aluminum-based wiring layer 110 is mainly used, for example, to form signal wiring with long distances between circuit blocks, power bus wiring, clock wiring, and the like. It is preferable for these types of wiring to have low wiring resistance and capacitance. Accordingly, in comparison to the wires within the respective circuit blocks which are formed on the first and second aluminum-based wiring layers, the width and space of the wires on the third wiring layer are enlarged. Furthermore, in order to reduce the wiring resistance, in comparison to the wires on the first and second wiring layers, the height of the wires, i.e., film thickness of the metal film which is used for the formation of the wiring is increased. Such wide and thick wires are often referred to as "fat wires".

Meanwhile, a product with a copper-based wiring has a wiring layer structure, for example, as shown in FIG. 26B. That is, the first and second aluminum-based wiring layers 106 and 108 are used as they are, and the third aluminum-based wiring layer is replaced with a first copper-based wiring layer 112. Further, a second copper-based wiring layer 114 is added. The wiring within respective circuit blocks is formed as in the case of the product without a copper-based wiring. That is, the same mask pattern is used as is used for the product without a copper-based wiring. Needless to say, fine corrections and improvements are made as needed. Using the first and second copper-based wiring layers 112 and 114, the long distance signal wiring between the circuit blocks, power bus wiring, clock wiring, and the like are formed.

Needless to say, the second copper-based wiring layer 114 is not necessary if merely replacing the third aluminum-based wiring layer of FIG. 26A. However, for example, in order to manufacture high performance products by making the best use of the lower resistance copper-based wiring for the long distance signal wiring, it is effective to provide two copper-based wiring layers and improve the degree of freedom of the connection in the mutually orthogonal directions. As needed, it is possible to provide three or more copper-based wiring layers. Conversely, there are cases in which it is possible to reduce the number of wiring layers by using the copper-based wiring and thereby to reduce production costs. For example, if the dimensions of the wires are decreased and the density of the wires is increased by the premise of the low resistance and high electromigration tolerance of the copper-based wiring, there are instances where two aluminum-based wiring layers, for example, the third and fourth wiring layers, can be replaced with one copper-based wiring layer.

Figure 27:
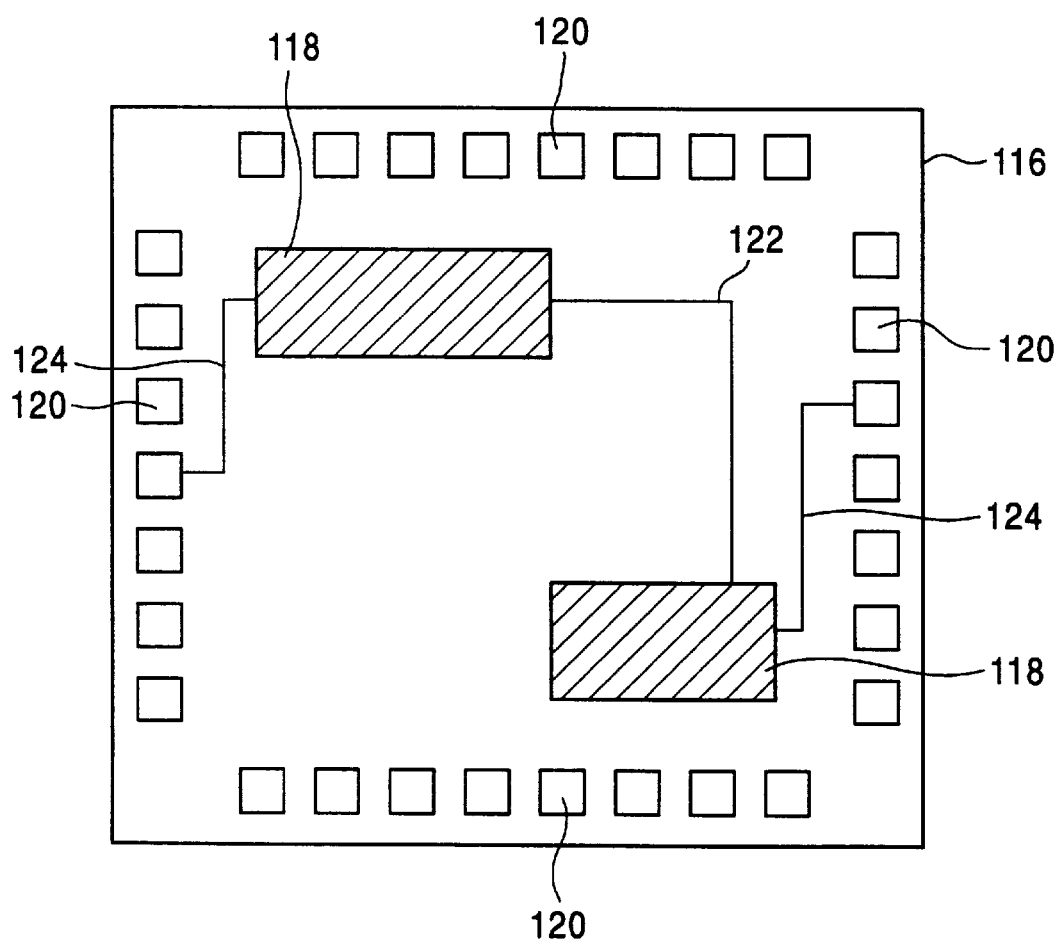
FIG. 27 shows an example of a long distance signal wiring.

FIG. 27 shows an example of signal wiring over a long distance. A plurality of circuit blocks 118 are arranged on a semiconductor integrated circuit chip 116 and a plurality of I/O cells 120 are arranged on the periphery. Moreover, to perform signal communication between the circuit blocks 118, a long distance signal wiring 122 is provided. A long distance signal wiring 124 is further provided to perform signal exchange with devices outside of the semiconductor integrated circuit to the respective circuit blocks 118. In this Figure, each wiring is denoted as one line, but, for example, to transmit a signal with 32 bits, 32 wires of the wiring are actually provided.

Figure 28:
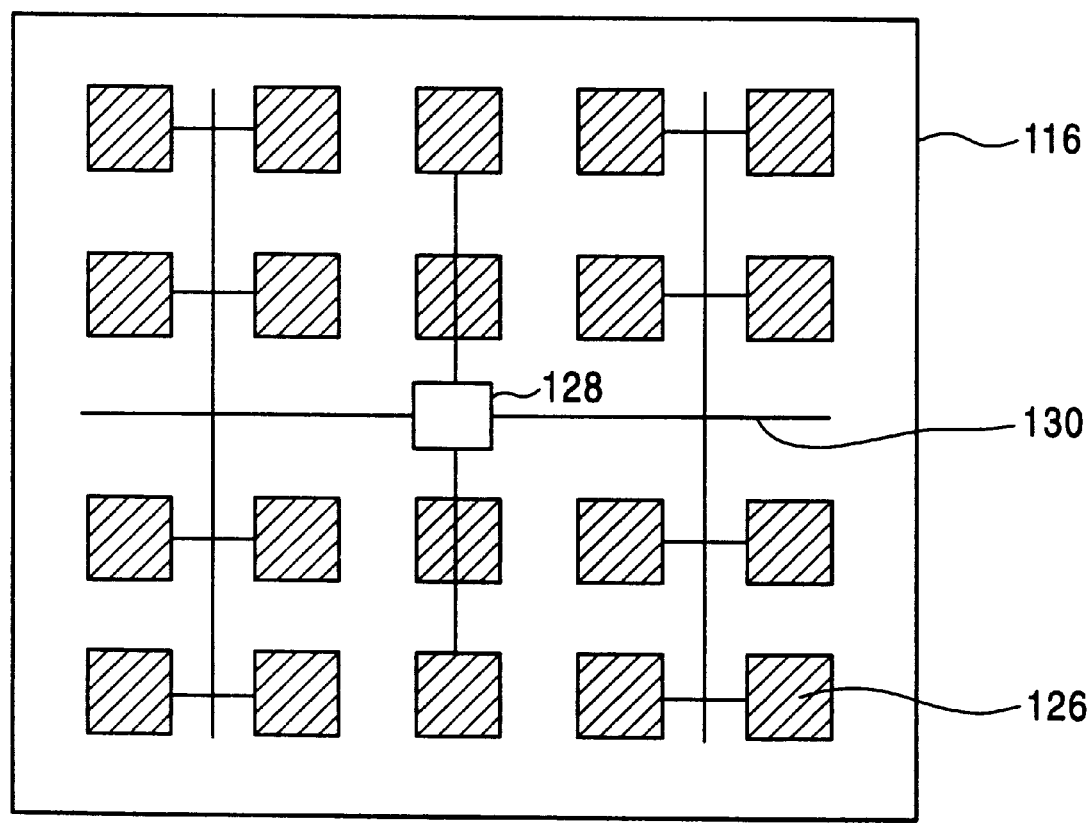
FIG. 28 shows an example of a clock wiring.

FIG. 28 shows an example of the clock wiring. A plurality of circuit blocks 126 are arranged on the semiconductor integrated circuit chip 116. Furthermore, an oscillator 128 for generating a clock signal is arranged at the center of the chip. From this oscillator 128, the clock signal is distributed to the respective circuit blocks 126 through a hierarchy provided by clock wiring 130. That is, the clock signal is first distributed through wires directly connected to the oscillator, and then distributed through branch wires to respective circuit blocks. Within the respective circuit block, a lower level wiring (not shown) is provided to further distribute the clock signal to respective gates in the circuit block. The copper-based wiring is particularly effective to form the higher level portion of the hierarchically provided clock wiring, that is, the portion provided to distribute the clock signal from an oscillator, or from a pad for receiving the clock signal, to a plurality of circuit blocks.

As described above, in the semiconductor integrated circuit according to the invention, a macro cell which was designed and verified on the premise of the aluminum-based wiring, i.e., without using the copper-based wiring, is used as it is. And high performance can be realized by taking advantage of the low resistance and high electromigration tolerance of the copper-based wiring. In addition, the possibility of degradation of transistors due to the copper diffusion from the copper-based wiring is low because the lower wiring layers arranged adjacent to the transistors are aluminum-based wiring layers, just as in the conventional integrated circuits.

As a result, it is possible to maintain the compatibility of IPs. That is, for example, IPs designed on the premise of aluminum-based wiring can be used both in products with and without a copper-based wiring without requiring substantial modifications.

Furthermore, in comparison with cases where copper-based wiring layers are used as the lower wiring layers, it is possible to reduce the thickness of the diffusion barrier layer that is arranged in order to prevent copper diffusion, or to simplify the process of forming the diffusion barrier layer. Furthermore, it is possible to simplify the test procedures to evaluate the influence of the copper-based wiring. That is, it is sufficient to perform a test only concerning the influence of the copper diffusion on the transistor characteristics, using limited types of test devices with a copper-based wiring provided in the third layer, for example. The wires in the internal part of the macro cell are still made on aluminum-based wiring layers, so a test regarding the characteristic changes of the individual macro cells due to the use of copper-based wiring can be omitted. Furthermore, by providing a plurality of copper-based wiring layers and using each of them mainly for specific purposes, it is possible to further improve the degree of freedom of the wiring and improve the performance of the integrated circuit. Specifically, in order to form long distance signal wiring, it is preferable to provide a pair of copper-based wiring layers, or to provide two or more pairs of copper-based wiring layers, in order to form wires in mutually orthogonal directions with a high degree of freedom.

Among the power bus wiring, in many cases, portions that are low (deep) in the hierarchy are formed in lower wiring layers which are also used for the connections between transistors within macro cells. It is possible to use these lower wiring layers as they are and to add one or more copper-based wiring layers on top of these aluminum-base wiring layers. Wires disposed generally parallel to and electrically connected in parallel to the wires in the power bus wiring can be formed on these copper-based wiring layers. By so doing, it is possible to improve the current conduction capability of the power bus wiring by utilizing the low resistance and high electromigration tolerance of the copper-based wiring. As a result, stability of the operation can be improved because of the reduction of the voltage drop in the bus wiring, and electromigration reliability can be improved. In other words, it is possible to use copper-based wiring for the purpose of reinforcing the aluminum-based wiring. It is possible to provide a wire on a copper-based wiring layer for each of the corresponding wires on an aluminum-based wiring layer. It also possible to provide a common wire in a copper-based wiring layer for two or more corresponding wires in an aluminum-based wiring layer. Meanwhile, portions that are high (shallow) in the hierarchy of the power bus wiring, for example, the portion surrounding the periphery of a semiconductor chip for providing the electric power for substantial portion of the integrated circuit, has a long length. In addition, these portions of the power bus wiring should have a capability to flow a large amount of current. These portions of the power bus wiring are particularly suited to be formed on one or more copper-based wiring layers. Furthermore, it is effective to provide separate copper-based wiring layers for the power potential (VVD) and ground potential (VSS) power bus wiring, respectively.

Figure 29:
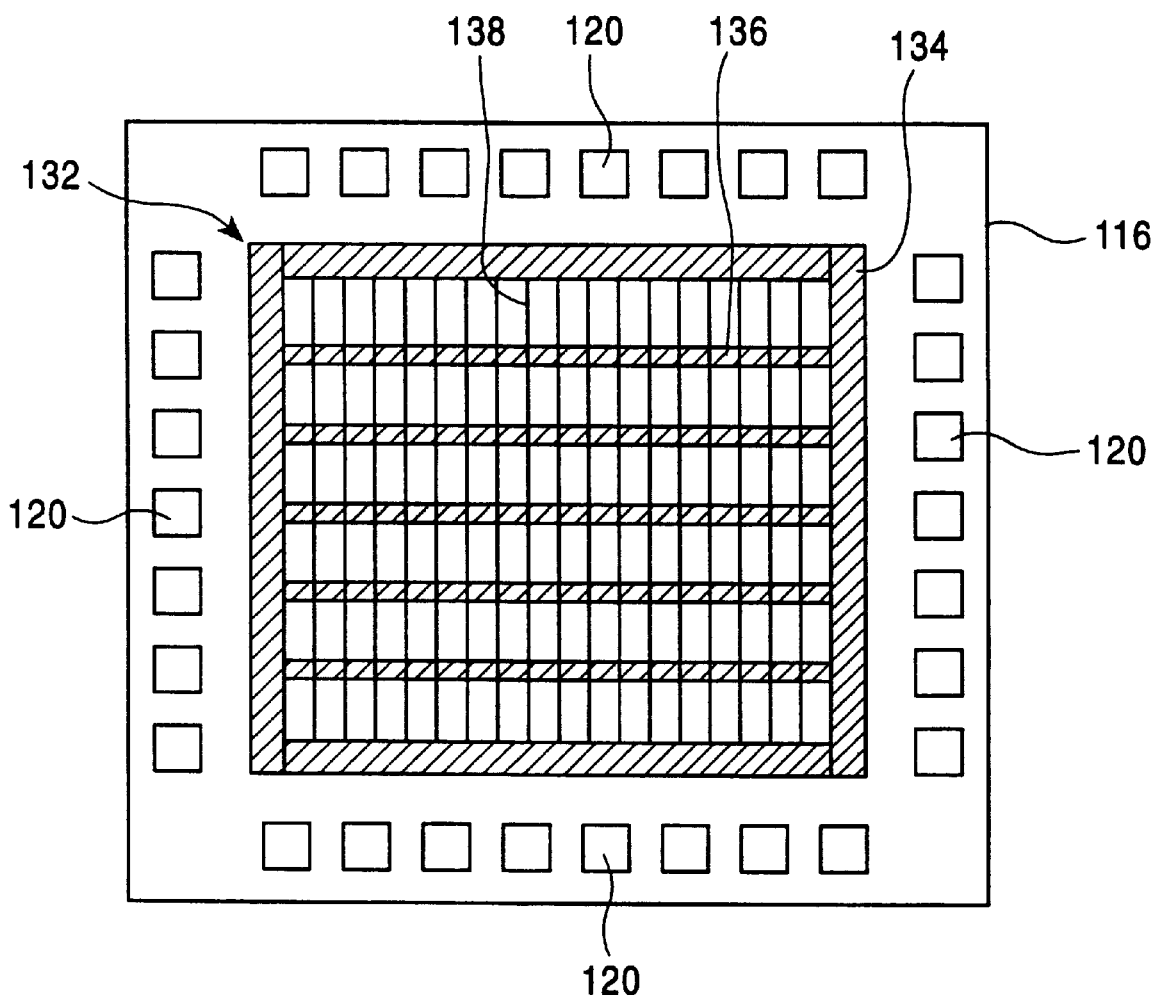
FIG. 29 shows an example of a power bus wiring.

FIG. 29 shows an example of the power bus wiring. The Figure shows a power bus with a three level hierarchy which is provided in a gate array type semiconductor integrated circuit. At the periphery of the integrated circuit chip 116 are arranged I/O cells 120, and in the internal region a cell array 132 is arranged in which many basic cells having a specific width and height are arranged in columns and rows. The Figure also shows the power bus wiring providing electric power for the basic cells. The primary power bus 134 is arranged so as to surround the entire cell array. The primary power bus supplies electric power to a substantial portion of the integrated circuit, that is, all of the basic cells. For other portions of the integrated circuit, such as I/O cells, a separate power bus wiring may be provided. The third level power buses 138 are arranged on respective rows of the basic cells in order to supply electric power for the transistors in the basic cells of the row. The second level power buses 136 are arranged so as to link between the opposite arms of the primary power bus, and are respectively connected to the third level power buses. The second level power buses decrease the impedance between the primary and third level power buses, and decreases the voltage drop which occurs when the transistors in many basic cells operate simultaneously.

In a product with a copper-based wiring, higher level portions of the power bus, for example, the primary power bus 134 and secondary power buses 136, are formed on one or more copper-based wiring layers. Meanwhile, lower level portions, for example, the third power buses 138, are formed on the aluminum-based wiring layers. Needless to say, wiring to reinforce the third level power buses 136 can be also provided in the copper-based wiring layers.

In the Figure, only one wire or one group of wires is shown for each of the levels. In reality, however, two or more groups of wires are usually provided each for supplying, for example, VDD and VSS electric potential.

Furthermore, in addition to forming the necessary numbers of copper-based wiring layers, it is possible to add another aluminum-based wiring layers. For example, for the top-most wiring layer, it is preferable to use an aluminum-based wiring layer because it has a proven history in connection to the package by the bonding. As for the top-most wiring layer, it is also preferable to use gold-based wiring because it has superior corrosion resistance and decreases the risk of degradation of the integrated circuit due to the exposure to the operation environment.

As described above, the following advantages can be obtained in products with a copper-based wiring by using macro cells selected from the same library which is prepared for the products without a copper-based wiring, using aluminum-based wiring layers used in the connections within the macro cell as they are, and adding one or more copper-based wiring layers on top of the aluminum-based wiring layers.

Higher performance can be realized by using copper-based wiring for wires of a selected type for wiring whereby the lower resistance and high electromigration tolerance of the copper-based wiring can be taken advantage of. The selected type of wiring includes long distance signal wiring, clock wiring, power bus wiring and the like.

By using the same macro cell library, it is possible to take advantages of the investment of the macro cell library developed on the premise of the aluminum-based wiring, and to reduce the development time and cost.

It is possible to maintain the compatibility of IPs shared with other manufactures and to improve the performance of integrated circuit products as a whole.

Due to the above advantages, it is possible to provide products with high performance with a short development time and at low development cost.

In reality, providing a product as described above with copper-based wiring as a high performance grade product meets the demands of customers for whom performance is the primary concern. Meanwhile, providing a product without a copper-based wiring as a standard grade product meets the demands of the customers for whom cost is the primary concern. The macro cell library is commonly used for high performance grade products and standard grade products. Furthermore, both grade products are to be commonly manufactured as much as possible, with the exception of the copper-based wiring processes, including the groove forming process and the like for the damascene method, whereby manufacturing cost reduction is achieved. For example, the process for forming basic cells is used in common, and the same manufacturing line can be used for the common process steps.

In designing a product of the standard grade, necessary macro cells are selected from the library and placed on a semiconductor integrated circuit chip. The macro cell includes wires necessary to make connections within the macro cell. Further, connections outside of the macro cells are also made using aluminum-based wiring layers.

Similarly, in designing a product of the high performance grade, necessary macro cells are selected from the library and placed on a chip. Portions of wires within the macro cell formed on lower wiring layers are used as they are. That is, these portions of the wires are formed on one or more aluminum-based wiring layers. Only portions of wires formed on higher wiring layers are replaced by wires on one or more copper-based wiring layers. As a result, connections within the macro cells are mainly made by wires on aluminum-base wiring layers. Further, connections outside of the macro cells are made mainly using wires on one or more copper-based wiring layers. The wires for the connections outside of the macro cells include wires of selected types of wiring that can take advantages of the copper-based wiring with low resistance and high electromigration tolerance. For example, long distance signal wiring between the macro cells and between the macro cells and the I/O cells, a power bus wiring, especially, high level portions of the hierarchically provide power bus, and a clock wiring, especially, portions of the clock wiring provided for delivering the clock signal to a plurality of circuit blocks, and the like are made on the copper-based wiring layer. As a result, higher performance can be realized by making the use of the copper-based wiring, even though the macro cells are selected from the common library of uses. Modifications to the macro cells can be made as needed. However, a substantial modification or re-design should be avoided to minimize development costs.

These designing procedures are made on a CAD (computer aided design) system. The CAD system produces a mask data that is used to make masks. And semiconductor integrated circuits are produced using the masks.

By using the aluminum-based wiring layers at the lower side in combination with the copper-based wiring layers at the upper side, the following advantages, for example, can be obtained, even in a product which was not originally developed using copper-based wiring as a premise:

1) Developed on the premise of aluminum-based wiring, copper-based wiring layers can be used as countermeasures in a case that, for example, the number of wires, such as the power bus wires, is too large to be accommodated within a predetermined maximum chip size. In this case, if a copper-based wiring is not usable, it is necessary to re-design from the beginning to reduce the number of wires or to adapt a larger and more expensive package. The larger package may necessitate the re-design of the circuit board. Even in this case, if copper-based wiring is usable, it is possible to accommodate the necessary number of wires within the predetermined chip size by replacing one or more upper aluminum-based wiring layers with one or more copper-based wiring layers. By utilizing the low resistance and high electromigration tolerance of the copper-based wiring, the dimensions of the wiring can be reduced and the necessary number of wires can be accommodated within the predetermined chip size. Although the manufacturing cost of the copper-based wiring itself is higher than that of the aluminum-based wiring, it is possible to reduce the overall cost, including the development cost, as compared to the instance where redesigning from the beginning or adaptation of a larger package is necessary.

2) After developing a semiconductor integrated circuit with certain functions without using copper-based wiring because of the cost consideration, it is possible to promptly respond to a request from a customer to improve the performance of the integrated circuit. That is, it is possible to easily improve the performance without making significant changes to the circuit or layout of the originally developed product by adding copper-based wiring layers on top of the aluminum-based wiring layers, or by replacing the higher aluminum-based wiring layers with copper-based wiring layers. The copper-based wiring layers are mainly used to form wires which have large impacts on the performance of the integrated circuit, such as long distance signal wiring and the like. If all of the aluminum-based wiring layers are replaced with copper-based wiring layers and integrated circuits are re-designed on the premise of copper-based wiring, even more significant performance improvements can be expected. However, in order to carry this out, a longer development time is necessary, and development costs may also increase.

The above description used the example of ASIC products, such as gate arrays, standard cells, embedded cell arrays, and the like, and described the effects of manufacturing semiconductor integrated circuits using aluminum-based wiring layers at the lower side in combination with copper-based wiring layers at the upper side. However, in many semiconductor integrated circuits, not limited to the ASIC products, there is a strong demand for the high performance, short development time, and low development cost. Therefore, jointly using aluminum-based wiring layers at the lower side and copper-based wiring layers at the upper layer side in this manner is advantageous for various kinds of semiconductor integrated circuits.

For example, in the FPGA (field programmable gate array) product, which is one kind of the ASIC products, the same type of joint use of the aluminum-based wiring and copper-based wiring is advantageous. In this case, the programmable logic blocks and programmable wiring between the programmable logic blocks and between the programmable logic blocks and the I/O cells of the FPGA corresponds to the circuit blocks and the long distance wiring described above, respectively. That is, internal connections within the respective programmable logic blocks would be formed mainly using aluminum-based wiring layers of the lower side, and the programmable wiring between the programmable logic blocks and between the programmable logic blocks and I/O cells would be formed using copper-based wiring layers of the upper side. Thus, the operational speed of FPGA, which is mainly determined by the long distance wiring, can be improved. Similar effects can be obtained by using copper-based wiring for the clock wiring and the power bus wiring.

Figure 30:
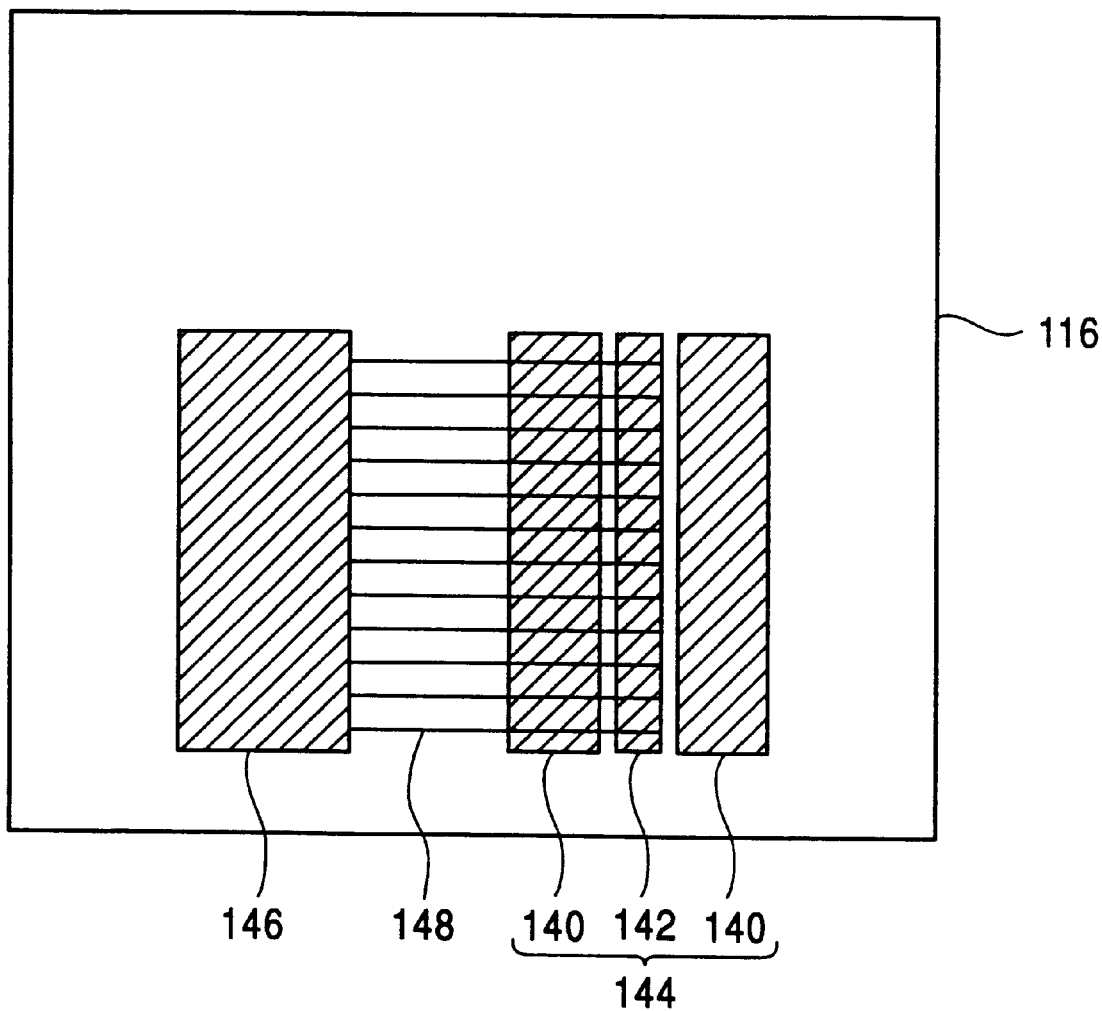
FIG. 30 shows an example of a signal wiring in a semiconductor integrated circuit that has a DRAM and a logic circuit combined on the same chip.

FIG. 30 shows an example of using the copper-based wiring for the semiconductor integrated circuit that combines a DRAM (Dynamic Random Access Memory) and a logic circuit on the same chip. DRAM 144 includes memory cell arrays 140 and a sense amplifier array 142, and logic circuit block 146, for example, for performing image processing, are arranged on a semiconductor integrated circuit chip 116. To transmit a signal between the DRAM 144 and the logic block 146, data wiring 148, including a predetermined number of (for example, 256, 512 or 1024) data wires are arranged.

To perform image processing, a large capacity memory is needed to temporarily store a large volume of data. Furthermore, for example, to perform realtime moving image processing, it is necessary to transmit a large volume of image data between the image processing circuit and the memory in a short period of time. It is effective to use copper-based wiring with lower resistance for this purpose.

In order to reduce cost, it is preferable to manufacture the memory cell arrays 140 using the same manufacturing process as is used for memory cell arrays of a conventional or stand-alone DRAM product. For the wiring of the memory cell array of the stand-alone DRAM, only two wiring layers are usually used. Therefore, by forming the wiring of this part with conventional aluminum-based wiring and providing a copper-based wiring layer on top of this and forming the data wiring 148 in this wiring layer, it is possible to improve the compatibility of the manufacturing process with processes associated with conventional DRAM products. Furthermore, since the lower wiring layers, which are close to the memory cells, are aluminum wiring layers, it is possible to prevent degradation of the memory cells, which are extremely sensitive to the contamination, due to the copper diffusion.

It is also effective to use the copper-based wiring for similar data wiring for transmitting data at high speed between a CPU (Central Processing Unit) and cache memory, for example, in a microprocessor.

As described above, the product without a copper-based wiring is provided for customers who need lower cost, and a product with a copper-based wiring is provided for customers who need higher performance. In addition, if the copper-based wiring is used only for the higher wiring layers, and if the copper-based wiring is used only in higher-grade products, the necessary production capacity for the copper-based wiring formation processes is small relative to the capability for the processes commonly used both for the products with and without a copper-based wiring. Therefore, it is possible to use the copper-based wiring formation facilities in common with a plurality of production lines for other processes, including transistor formation and aluminum-based wiring formation. Furthermore, when a new factory with copper-based wiring formation facilities is built, the facilities of the new factory can be used in common with a plurality of existent factories without copper-based wiring formation facilities. In this way, total investment costs can be reduced.

Figure 25A:
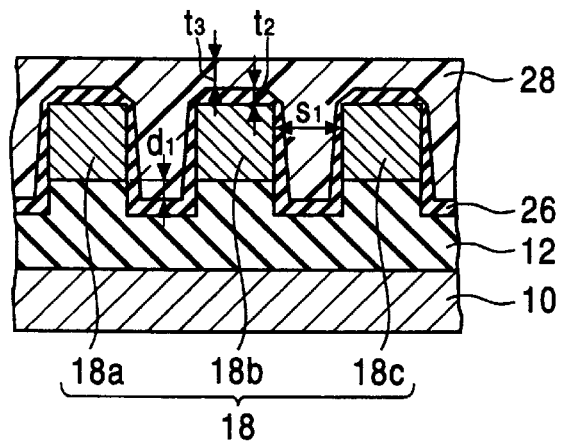
FIGS. 25A, 25B and 25C are cross-sectional views showing the formation processes for the wiring structure according to the eighth embodiment of the invention.
Figure 25B:
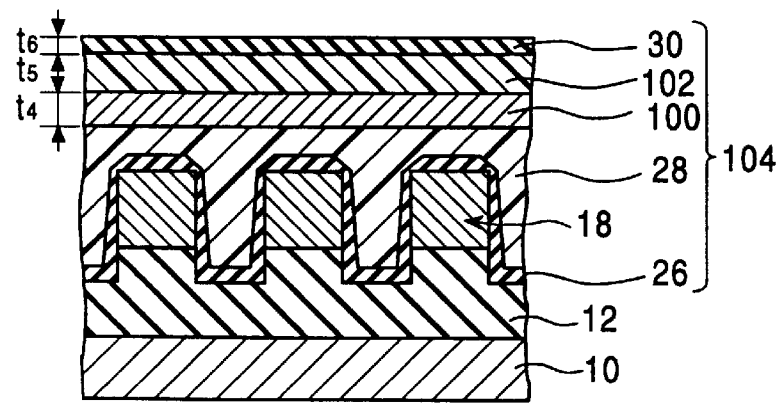
Figure 25C:
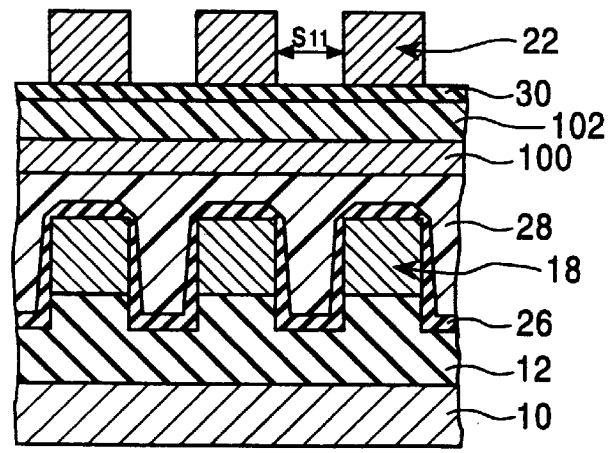

FIGS. 25A, 25B, and 25C are cross-sectional views showing the forming processes for a wiring structure according to an eighth embodiment of the invention.

As shown in FIG. 25A, and in the same manner as described in connection with the fourth embodiment, a first wiring layer including wires 18a, 18b, and 18c is formed on an underlying dielectric layer 12 on a semiconductor substrate 10. Surface portions of the underlying dielectric layer 12 between the wires of the first wiring layer 18 are removed to a depth of d1. After this, an underlying film 26 is formed and a precursor of, for example, fluorinated polyimide is applied, and a fluorinated polyimide film is formed by heat curing. Furthermore, the surface of the fluorinated polyimide film is planarized by, for example, CMP. Thus, a low dielectric constant film 28 made of the fluorinated polyimide is formed between and on the wires of the first wiring layer 18. The thickness of the low dielectric constant film 28 on the top of the wires is t3. The thermal conductivity of the low dielectric constant film 28 made of fluorinated polyimide is about 0.24 W/mK at room temperature, which is about ⅙ of that of silicon oxide (about 1.4 W/mK at room temperature). The film thickness of the low dielectric constant film 28 on the wires of the first wiring layer 18 is thin in comparison to the fourth embodiment. The space between the wires of the first wiring layer 18 is s1, and the film thickness of the underlying film 26 on the top surface of the wires is t2.

Next, as shown in FIG. 25B, a silicon nitride film is deposited, for example, by plasma CVD, and a heat conductive insulating film 100 is formed. The thickness of the heat conductive insulating film is t4. The thermal conductivity of silicon nitride is about 19 W/mK at room temperature, which is about 14 times higher than that of silicon oxide. A film including insulating material of a higher thermal conductivity, as described, than silicon oxide is referred to hereafter as a "heat conductive insulating film." After this, a second low dielectric constant film 102 is formed, and, for example, by depositing a fluorinated silicon oxide film, a cap film 30 is formed. The thickness of the second low dielectric constant film 102 and the cap film 30 is t5 and t6, respectively. By the process described above, an interlayer dielectric layer 104, including the underlying film 26, the low dielectric constant film 28, the heat conductive insulating film 100, the second low dielectric constant film 102, and the cap film 30, is formed.

After the process described above, via holes are formed in the interlayer dielectric layer 104, and plugs (not shown) are formed. Furthermore, the same process is repeated as needed, and the second and subsequent wiring layers and interlayer dielectric layers are formed. FIG. 25C shows a cross-sectional view of a structure in which the second wiring layer 22 is formed.

After that, a passivation layer and bonding pads are formed, and the wafer manufacturing process for the semiconductor integrated circuit is completed.

In the wiring structure of the fourth embodiment, the interlayer dielectric layer is mainly formed with a film of a low dielectric constant material which has low thermal conductivity. In this type of structure, during an electromigration test, the problem of wire temperature rising during the test due to Joule heat in the wire and an electromigration failure occurs rapidly (for example, see K. Banerjee et al., International Electron Devices Meeting, Digest of Technical Papers (1996) p. 65). In contrast, in the wiring structure according to this embodiment, part of the interlayer dielectric layer is formed with a heat conductive insulating film comprising silicon nitride. Since heat dissipates through the heat conductive insulating film, local temperature rise of the wires due to Joule heat is suppressed, thus improving the reliability of the wiring.

In order to increase the effect of suppressing local temperature rise, it is preferable to position the heat conductive insulating film 100 close to the wires of the first wiring layer 18. On the other hand, to reduce capacitance between wires of the first wiring layer 18, it is preferable to separate the heat conductive insulating film 100 from the wires. This is because the dielectric constant of silicon nitride is high (about 7.5). In most cases, the length of the wire which generates Joule heat is in the order of 100 μm or more, while the distance between the wire and the heat conductive insulating film 100 (that is, the distance from the top surface of the wires of the first wiring layer 18 to the bottom surface of the heat conductive insulating film 100 measured in the perpendicular direction with respect to the main surface of the semiconductor substrate 10, or in other words, t2+t3) is only in the order of 1 μm. Because of this, in practice, the effects of suppressing local temperature rise do not significantly depend on the distance between the heat conductive insulating film 100 and the wires of the first wiring layer 18. Therefore, the distance between the heat conductive insulating film 100 and the wires of the first wiring layer 18 should be determined so that the capacitance between the wires is reduced. Specifically, it is recommended for (t2+t3) to be selected to be about 20% or more, and preferably to be about 50% or more of s1. It is recommended that (t5+t6) be selected to be about 20% or more, and preferably be about 50% or more of s11.

Furthermore, in order to reduce the capacitance between wiring layers, it is preferable to have a large (t3+t5) value. Specifically, if (t3+t5) is made about the same or more, and preferably about twice or more as the larger one of s1 and s11, the influence of the capacitance between the wiring layers becomes small compared to the influence of the capacitance between wires within the same wiring layer.

Furthermore, in order to improve the effect of suppressing local temperature rise, it is preferable to increase the thickness of the heat conductive insulating film 100. However, if it is too thick, the aspect ratio of the via holes, i.e., the ratio between the depth and opening dimensions, which connect between the wiring layers, increases. The via connection yield also decreases. In practice, a thickness of about the same or more, and preferably, about twice or more as the value of (t2+t3) is recommended.

In this embodiment, a silicon nitride film is used as the heat conductive insulating film 100, but the invention is not limited to this. For example, it is also possible to use an aluminium oxide (alumina) film. Alumina has a thermal conductivity of 21 W/mK at room temperature, which is about 15 times of that of silicon oxide. It is also possible to use any film comprising a material having a thermal conductivity higher than that of silicon oxide; preferably about three times or more, and more preferably about five times or more of that of silicon oxide. Furthermore, a significant effect can be obtained when the heat conductive insulating film 100 is formed by using a material having a thermal conductivity that is about ten times or more than that of the silicon oxide.

This embodiment shows an example of forming the low dielectric constant film 28 with fluorinated polyimide, but the invention is not limited to this method. It is possible to use various kinds of low dielectric constant materials. The thermal conductivity of these materials varies, depending upon the material, but in many cases, it is significantly lower than that of silicon oxide. The effects of the invention are significant when the low dielectric constant films 28 and 102 are formed using a material having a thermal conductivity of about ⅓ or less than that of the silicon oxide. Furthermore, particularly significant effects can be obtained when a material having a thermal conductivity of about ⅕ or less of that of the silicon oxide is used.

The wiring structure, the method of forming the wiring structure, and a semiconductor integrated circuit which applies the wiring structure according to the invention is explained in detail above, but the present invention is not limited to the embodiments described above. Needless to say, various improvements and alternatives may be made without departing from the scope of the invention.

As described above in detail, various wiring structures and methods of forming the wiring structure are provided to effectively reduce the wiring capacitance and to improve the operational speed of semiconductor integrated circuits.

Specifically, according to one aspect of the present invention, a low dielectric constant film having a dielectric constant lower than that of silicon oxide is formed between wires in a wiring layer. The low dielectric constant film contacts side surfaces of the wires and a lower level of the low dielectric constant film between the wires is lower than a bottom level of the wires. As a result, the electric field between the wires is effectively confined within the low dielectric constant film and the capacitance between the wires is effectively reduced. Specific materials and deposition methods are preferably used to form the low dielectric constant film to allow contact of the low dielectric constant film to the side surfaces of the wires.

According to another aspect of the invention, an interlayer dielectric layer includes an underlying film having a dielectric constant lower than that of silicon oxide and a low dielectric constant film having a dielectric constant lower than that of the underlying film formed between the wires. The underlying film allows the use of a material having a very low dielectric constant to form the low dielectric constant film. Further the wiring capacitance is effectively reduced since the dielectric constant of the underlying film is lower than that of ordinary silicon oxide. A specific material and deposition method are preferably used to form the underlying film to improve, for example, the ability to suppress water diffusion from the low dielectric constant film to the wires.

According to another aspect of the invention, an interlayer dielectric layer includes an underlying film and a low dielectric constant film having a dielectric constant lower than that of silicon oxide, where surfaces of the underlying film on side surfaces of the wires are positively sloped. The positive slope facilitates the filling of narrow spaces between the wires with the low dielectric constant film. A specific material and deposition method are preferably used to form the positively sloped underlying film. A specific method to form the low dielectric constant film can be preferably combined to enhance the filling.

According to another aspect of the invention, an interlayer dielectric layer includes an underlying film and a low dielectric constant film having a dielectric constant lower than that of silicon oxide, and a thickness of the underlying film on upper portions is smaller than that on lower portions. The smaller thickness on the upper portions facilitates the filling of narrow spaces between the wires with the low dielectric constant film. A specific material and a deposition method are preferably used to form the underlying film. A specific method of forming the low dielectric constant film can be preferably combined to enhance the filling.

While the above mentioned wiring structures can preferably be used with wiring formed by an etching method, the following structures can preferably be used with the wiring formed by the damascene method.

According to another aspect of the invention, an intralayer dielectric layer includes a low dielectric constant film having a groove in which a wire will be formed, and side wall films having a dielectric constant lower than that of silicon oxide are formed on side walls of the groove. The side wall film allows use of materials having a very low dielectric constant to form the low dielectric constant film. Because of the low dielectric constants of the side wall films and the low dielectric constant film, the capacitance between the wires is effectively reduced. A specific material and deposition method are preferably used to form the underlying film to improve, for example, the ability to suppress water diffusion from the low dielectric constant film to the wires.

According to another aspect of the invention, an intralayer dielectric layer includes a low dielectric constant film having a groove in which a wire will be formed, and side wall films having positively sloped surfaces are formed on side walls of the groove. The positively sloped surfaces of the side wall films facilitate the filling of narrow grooves with a metal film to form the wiring. A specific material and deposition method are preferably used to form the positively sloped side wall films. A specific method for forming the metal film can be preferably combined to enhance the filling.

According to another aspect of the invention, an intralayer dielectric layer includes a low dielectric constant film having a groove in which a wire will be formed, and side wall films having a smaller thickness on upper portions than that on lower portions. The smaller thickness of the side wall films on the upper portions facilitates the filling of narrow grooves with a metal film to form the wiring. A specific material and a deposition method are preferably used to form the side wall films having a smaller thickness on the upper portions. A specific method for forming the metal film can be preferably combined to enhance the filling.

On the other hand, the semiconductor integrated circuit according to the invention utilizes the advantages of a low resistance wiring, such as a copper-based wiring, while the difficulties of the low resistance wiring are effectively overcome.

Specifically, according to one aspect of the present invention, a semiconductor integrated circuit includes at least one aluminum-based wiring, at least one low resistance wiring layer disposed over the at least one aluminum-based wiring, and at least one circuit block including transistors connected with each other by wires in the at least one aluminum-based wiring layer. Wires of a selected type of wiring are formed on the at least one low resistance wiring layer. The advantages of the low resistance wiring are fully utilized because wires having lower resistance and high electromigration tolerance of the low resistance wiring can be integrated and formed on the low resistance wiring layer. In addition, since aluminum-based wiring is formed on the lower sides, negative effects caused by the diffusion of low resistance metal can be effectively avoided.

According to another aspect of the present invention, a semiconductor integrated circuit includes at least one aluminum-based wiring layer, at least one low resistance wiring layer disposed over the at least one aluminum-based wiring layer, and at least one macro cell which has been designed and verified without using a low resistance wiring. Since macro cells designed and verified on the premise of aluminum-based wiring are used as they are in products with a low resistance wiring layer, the development costs of a product with a low resistance wiring layer is minimized. Further, compatibility of IPs is maintained.

According to another aspect of the invention, an application specific semiconductor integrated circuit of one of a first and a second grade includes at least one macro cell selected from a macro cell library commonly provided for the first and the second grade, and at least one aluminum-based wiring layer. The semiconductor integrated circuit further includes at least one low resistance wiring layer only when the grade is a preselected one. By providing a product with a low resistance wiring as a high performance grade product and a product without a low resistance wiring as a standard grade products, various customers' demands are met. Further, by providing a common macro cell library for the products of the both grades, development costs can be minimized.

What is claimed is:

1. A semiconductor integrated circuit, comprising:

a semiconductor substrate;

at least one low resistance wiring layer disposed over the semiconductor substrate, a plurality of fat wires being formed in the at least one low resistance wiring layer; and an aluminum-based wiring layer disposed over the at least one low resistance wiring layer, the at least one low resistance wiring layer formed of a different material from, and having a lower resistance than, the aluminum-based wiring layer, wherein the semiconductor integrated circuit includes a number of the at least one low resistance wiring layer that is sufficient to provide a necessary degree of freedom of connection in mutually orthogonal directions.

2. The semiconductor integrated circuit according to claim 1, wherein the integrated circuit has a package and the aluminum-based wiring layer is used in connection to the package.

3. The semiconductor integrated circuit according to claim 1, wherein the at least one low resistance wiring layer is a copper-based wiring layer.

4. The semiconductor integrated circuit according to claim 1, further comprising at least one—intra-layer dielectric layer including a low dielectric constant film having a dielectric constant lower than that of silicon oxide over the semiconductor substrate, the intra-layer dielectric layer having a plurality of grooves formed in the low dielectric constant film, wherein the plurality of fat wires are embedded within respective grooves in the intra-layer dielectric layer.

5. The semiconductor integrated circuit according to claim 1, wherein the at least one low resistance wiring layer is formed by a damascene method and the aluminum-based wiring layer is formed by an etching method.

6. A semiconductor integrated circuit, comprising:

a semiconductor substrate;

at least one low resistance wiring layer disposed over the semiconductor substrate, a plurality of low resistance wires being formed in the at least one low resistance wiring layer; and an aluminum-based wiring layer disposed over the at least one low resistance wiring layer, the at least one low resistance wiring layer formed of a different material from, and having a lower resistance than, the aluminum-based wiring layer, wherein the semiconductor integrated circuit includes a number of the at least one low resistance wiring layer that is sufficient to provide a necessary degree of freedom of connection in mutually orthogonal directions, and the plurality of low resistance wires are used in a selected type of wiring including at least one of:

1) a long distance signal wiring to connect a circuit block to an I/O cell or to a second circuit block;

2) a high level portion of a hierarchically provided power bus wiring; and 3) a portion of a clock wiring provided for delivering a clock signal to a plurality of circuit blocks.

7. The semiconductor integrated circuit according to claim 6, wherein the integrated circuit has a package and the aluminum-based wiring layer is used in connection to the package.

8. The semiconductor integrated circuit according to claim 6, further comprising at least one intra-layer dielectric layer including a low dielectric constant film having a dielectric constant lower than that of silicon oxide over the semiconductor substrate, the intra-layer dielectric layer having a plurality of grooves formed in the low dielectric constant film, wherein the plurality of low resistance wires are embedded within respective grooves in the intra-layer dielectric layer.

9. The semiconductor integrated circuit according to claim 6, wherein the at least one low resistance wiring layer is formed by a damascene method and the aluminum-based wiring layer is formed by an etching method.

10. A method of forming a semiconductor integrated circuit having a package, comprising the steps of:

forming fat wires in at least one low resistance wiring layer disposed over a semiconductor substrate, a number of the at least one low resistance wiring layer is sufficient to provide a necessary degree of freedom of connection in mutually orthogonal directions; and adding an aluminum-based wiring layer over the at least one low resistance wiring layer to use in connection to a package, the at least one low resistance wiring layer formed of a different material from, and having a lower resistance than, the aluminum-based wiring layer.

11. The method according to claim 10, further comprising forming at least one intra-layer dielectric layer including a low dielectric constant film having a dielectric constant lower than that of silicon oxide over the semiconductor substrate, the intra-layer dielectric layer having a plurality of grooves formed in the low dielectric constant film, wherein the fat wires are formed to be embedded within respective grooves in the intra-layer dielectric layer.

12. The method according to claim 10, wherein the at least one low resistance wiring layer is formed by a damascene method and the aluminum-based wiring layer is formed by an etching method.

* * * * *